(12) United States Patent
Seo et al.

(10) Patent No.: US 12,727,466 B2
(45) Date of Patent: Sep. 1, 2026

(54) INTEGRATED CIRCUIT DEVICE INCLUDING A VIA POWER RAIL EXTENDING THROUGH DEVICE ISOLATION FILM

(71) Applicant: Samsung Electronics Co., Ltd., Suwon-si (KR)

(72) Inventors: Jeongyeon Seo, Suwon-si (KR); Sungwoo Kang, Suwon-si (KR); Hyonwook Ra, Suwon-si (KR); Hongsik Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 361 days.

(21) Appl. No.: 18/453,546

(22) Filed: Aug. 22, 2023

(65) Prior Publication Data

US 2024/0243064 A1 Jul. 18, 2024

(30) Foreign Application Priority Data

Jan. 12, 2023 (KR) ........................ 10-2023-0004930

(51) Int. Cl.

| | |
|---|---|
| ***H10W 20/41*** | (2026.01) |
| ***H10D 30/67*** | (2025.01) |
| ***H10D 62/10*** | (2025.01) |
| ***H10D 84/83*** | (2025.01) |
| ***H10W 20/42*** | (2026.01) |

(52) U.S. Cl.

CPC ...... *H10W 20/427* (2026.01); *H10D 30/6735* (2025.01); *H10D 62/121* (2025.01); *H10D 84/83* (2025.01); *H10W 20/42* (2026.01)

(58) Field of Classification Search

CPC .. H10D 30/6735; H10D 84/83; H10D 62/121; H01L 23/5226; H01L 23/5286; H10W 20/427; H10W 20/42

See application file for complete search history.

(56) References Cited

U.S. PATENT DOCUMENTS

| | | | |
|---|---|---|---|
| 11,257,764 | B2 | 2/2022 | Hiblot et al. |
| 2018/0294267 | A1 | 10/2018 | Licausi et al. |
| 2021/0305130 | A1 | 9/2021 | Cho et al. |

(Continued)

FOREIGN PATENT DOCUMENTS

| | | |
|---|---|---|
| KR | 20220104617 A | 7/2022 |

OTHER PUBLICATIONS

Search Report Orbit.*

*Primary Examiner* — Changhyun Yi
(74) *Attorney, Agent, or Firm* — Wolf, Greenfield & Sacks, P.C.

(57) ABSTRACT

An integrated circuit device includes a fin-type active region that extends from a substrate and in a first lateral direction, a device isolation film on a trench region on the substrate, an insulating liner structure that extends through the substrate in a vertical direction and contacts the device isolation film at a first vertical level, a via power rail that extends through the device isolation film in the vertical direction and including a first bottom surface at a second vertical level, and a backside power rail including a main rail and a protrusion rail, where the main rail extends through the substrate and the insulating liner structure in the vertical direction, and where the protrusion rail extends from the main rail toward the via power rail.

20 Claims, 40 Drawing Sheets

(56) References Cited

U.S. PATENT DOCUMENTS

| | | | | |
|---|---|---|---|---|
| 2021/0375722 | A1* | 12/2021 | Kim | H10D 84/038 |
| 2022/0037236 | A1 | 2/2022 | Seo et al. | |
| 2022/0077062 | A1 | 3/2022 | Van Dal et al. | |
| 2022/0157722 | A1 | 5/2022 | Bouche et al. | |
| 2022/0157723 | A1 | 5/2022 | Park et al. | |
| 2022/0230947 | A1 | 7/2022 | Park et al. | |
| 2022/0384602 | A1* | 12/2022 | Su | H10D 30/6729 |

* cited by examiner

INTEGRATED CIRCUIT DEVICE INCLUDING A VIA POWER RAIL EXTENDING THROUGH DEVICE ISOLATION FILM

CROSS-REFERENCE TO RELATED APPLICATION

This application is based on and claims priority under 35 U.S.C. § 119 to Korean Patent Application No. 10-2023-0004930, filed on Jan. 12, 2023, in the Korean Intellectual Property Office, the disclosure of which is incorporated by reference herein in its entirety.

TECHNICAL FIELD

The present disclosure relates to an integrated circuit (IC) device, and more particularly, to an IC device including a power rail.

BACKGROUND

As electronic products may be miniaturized, multifunctional, highly efficient, larger capacity, and highly integrated IC devices may be desirable. Accordingly, it may be desirable to efficiently design wiring structures to achieve high integration while ensuring functions and operating speeds implemented by IC devices.

SUMMARY

The present disclosure provides an integrated circuit (IC) device having improved integration density and electrical reliability.

According to an aspect of the present disclosure, an IC device comprises a substrate, a fin-type active region that extends from the substrate to define a portion of a trench region, wherein the fin-type active region extends in a first lateral direction, a device isolation film on the trench region, an insulating liner structure that extends through the substrate in a vertical direction, wherein the insulating liner structure contacts the device isolation film at a first vertical level, a via power rail that extends through the device isolation film in the vertical direction, wherein the via power rail comprises a first bottom surface at a second vertical level, wherein a distance of the second vertical level from a surface of the substrate being greater than a distance of the first vertical level from the surface of the substrate, and a backside power rail comprising a main rail and a protrusion rail, wherein the main rail extends through the substrate and the insulating liner structure in the vertical direction, and wherein the protrusion rail is connected to the main rail, extends from the main rail toward the via power rail, and is between the device isolation film in a second lateral direction that intersects with the first lateral direction.

According to another aspect of the present disclosure, IC device includes a substrate, a pair of fin-type active regions that extend from the substrate to define a plurality of trench regions on the substrate in a first lateral direction, a pair of source/drain regions arranged one-by-one on the pair of fin-type active regions, respectively, a device isolation film on the trench region, an insulating liner that extends through the substrate in a vertical direction, wherein the insulating liner contacts the device isolation film at a first vertical level, a via power rail between the pair of fin-type active regions and between the pair of source/drain regions, wherein the via power rail extends through the device isolation film in the vertical direction, wherein the via power rail comprises a first bottom surface at a second vertical level, wherein a distance of the second vertical level from a surface of the substrate is greater than a distance of the first vertical level from the surface of the substrate, a backside power rail, and a via insulating spacer that extends through the device isolation film in the vertical direction, wherein the via insulating spacer at least partially surrounds a sidewall of the backside power rail, the backside power rail comprises a main rail and a protrusion rail, wherein the main rail extends through the substrate and the insulating liner structure in the vertical direction, and wherein the protrusion rail is connected to the main rail, extends from the main rail toward the via power rail and the via insulating spacer, and is between the device isolation film in a second lateral direction that intersects with the first lateral direction.

According to another aspect of the present disclosure, an IC device comprises a substrate, a fin-type active region that extends from the substrate to define a trench region on the substrate, at least one nanosheet on the fin-type active region, wherein the at least one nanosheet is spaced apart from a fin top surface of the fin-type active region, a gate line that at least partially surrounds the at least one nanosheet, wherein the gate line extends in a lateral direction, a source/drain region adjacent to the gate line, wherein the source/drain region contacts the at least one nanosheet, a device isolation film on a sidewall of the fin-type active region and on the trench region, an insulating liner structure that extends through the substrate in a vertical direction, wherein the insulating liner comprises a first insulating liner and a second insulating liner, wherein the first insulating liner contacts the device isolation film at a first vertical level, and wherein the first insulating liner is between the second insulating liner being and the device isolation film, a via power rail spaced apart from each of the fin-type active region, the source/drain region, and the gate line in the lateral direction, wherein the via power rail extends through the device isolation film in the vertical direction, and the via power rail comprises a first bottom surface at a second vertical level, wherein a distance of the second vertical level from a surface of the substrate is farther from the backside surface of the substrate greater than a distance of the first vertical level from the surface of the substrate, a backside power rail, and a via insulating spacer that extends through the device isolation film in the vertical direction, wherein the via insulating spacer at least partially surrounds a sidewall of the backside power rail, wherein the backside power rail comprises a main rail and a protrusion rail, wherein the main rail extends through the substrate and the insulating liner structure in the vertical direction, and wherein the protrusion rail is connected to the main rail, the protrusion rail extends from the main rail toward the via power rail and the via insulating spacer, and the protrusion rail is between the device isolation film in the lateral direction.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Figure 1:
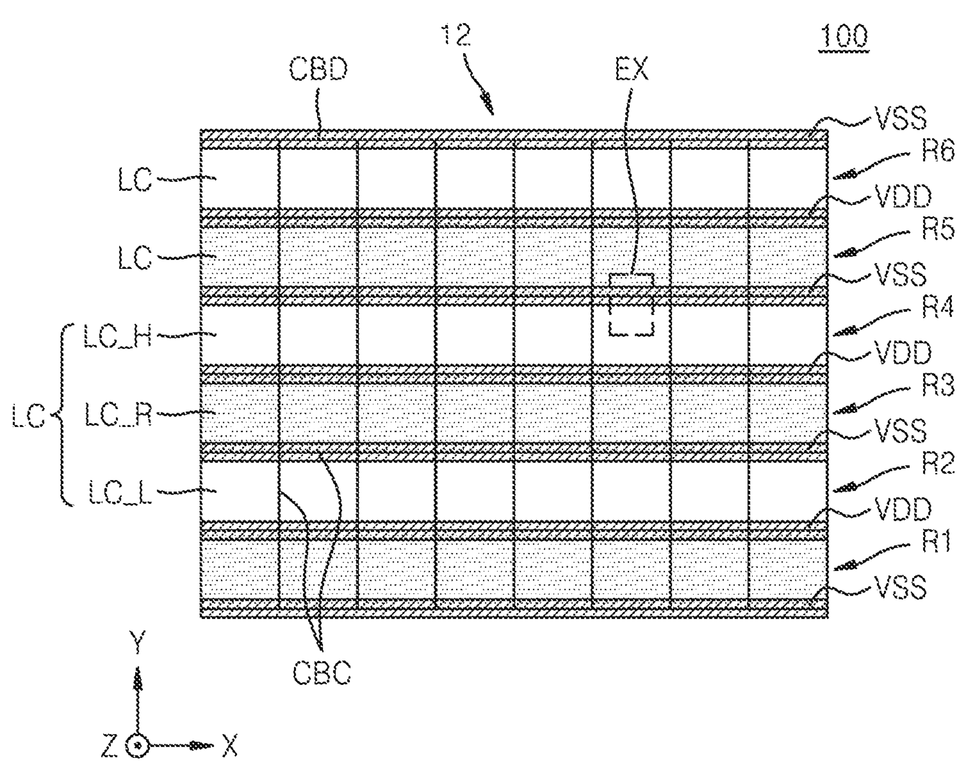
FIG. 1 is a plan layout diagram of a cell block of an integrated circuit (IC) device according to embodiments of the present disclosure.

To clarify the present disclosure, parts that are not connected with the description will be omitted, and the same elements or equivalents are referred to by the same reference numerals throughout the specification. Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements. As used herein, the phrase "at least one of A, B, and C" refers to a logical (A OR B OR C) using a non-exclusive logical OR, and should not be construed to mean "at least one of A, at least one of B and at least one of C." As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items.

Hereinafter, embodiments will be described in detail with reference to the accompanying drawings. The same reference numerals are used to denote the same elements in the drawings, and repeated descriptions thereof are omitted.

FIG. 1 is a plan layout diagram of a cell block 12 of an integrated circuit (IC) device 100 according to embodiments of the present disclosure.

Referring to FIG. 1, the cell block 12 of the IC device 100 may include a plurality of logic cells LC, which include circuit patterns configured that constitute various circuits. The plurality of logic cells LC may be arranged in a matrix form in a first lateral direction (X direction) and a second lateral direction (Y direction) in the cell block 12.

Each of the plurality of logic cells LC may include a circuit pattern having a layout designed according to a place-and-route (PnR) technique to perform at least one logic function. The plurality of logic cells LC may perform various logic functions. In some embodiments, the plurality of logic cells LC may include a plurality of standard cells. In some embodiments, at least some of the plurality of logic cells LC may perform the same logic function. In other embodiments, at least some of the plurality of logic cells LC may perform different logic functions.

The plurality of logic cells LC may include various kinds of logic cells including a plurality of circuit elements. For example, each of the plurality of logic cells LC may include an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, a latch, or a combination thereof, without being limited thereto.

In the cell block 12, at least some of the plurality of logic cells LC that forms one row R1, R2, R3, R4, R5, or R6 in the first lateral direction (X direction) may have the same width as each other. Also, at least some of the plurality of logic cells LC that form one row R1, R2, R3, R4, R5, or R6 may have the same height as each other. However, the present disclosure is not limited to the cell heights/widths illustrated in FIG. 1, and at least some of the plurality of logic cells LC that form one row R1, R2, R3, R4, R5, or R6 may have different widths and heights from each other.

An area of each of the plurality of logic cells LC included in the cell block 12 of the IC device 100 may be defined by a cell boundary CBD. A cell boundary contact portion CBC where respective cell boundaries CBD of two logic cells LC that are adjacent to each other in the first lateral direction (X direction) or the second lateral direction (Y direction) meet each other may be between the two adjacent logic cells LC.

In some embodiments, from among the plurality of logic cells LC that form one row R1, R2, R3, R4, R5, or R6, two logic cells LC that are adjacent to each other in the first lateral direction (X direction) may contact each other at the cell boundary contact portion CBC without a distance therebetween. In other embodiments, from among the plurality of logic cells LC that form one row R1, R2, R3, R4, R5, or R6, two logic cells LC that are adjacent to each other in the first lateral direction (X direction) may be a predetermined distance apart from each other.

In some embodiments, from among the plurality of logic cells LC that form one row R1, R2, R3, R4, R5, or R6, two adjacent logic cells LC may perform the same function as each other. In this case, the two adjacent logic cells LC may have the same structure as each other. In other embodiments, from among the plurality of logic cells LC that form one row R1, R2, R3, R4, R5, or R6, two adjacent logic cells may perform different functions.

In some embodiments, one logic cell LC, which is selected from the plurality of logic cells LC included in the cell block 12 of the IC device 100, may have a symmetrical structure to another logic cell LC, which is adjacent to the selected logic cell LC in the second lateral direction (Y direction), about the cell boundary contact portion CBC therebetween. For example, a reference logic cell LC_R in a third row R3 may have a symmetrical structure to a lower logic cell LC_L in a second row R2 about the cell boundary contact portion CBC therebetween. Also, the reference logic cell LC_R in the third row R3 may have a symmetrical structure to an upper logic cell LC_H in a fourth row R2 about the cell boundary contact portion CBC therebetween.

Although FIG. 1 illustrates an example in which the cell block 12 including six rows R1, R2, . . . , and R6, the present disclosure is not limited thereto. The cell block 12 may include various numbers of rows, and one row may include various numbers of logic cells.

A selected one of a plurality of ground lines VSS and a plurality of power lines VDD may be between a plurality of rows (e.g., R1, R2, R3, R4, R5, and R6), each of which includes a plurality of logic cells LC arranged in a line in the first lateral direction (X direction). The plurality of ground lines VSS and the plurality of power lines VDD may each extend in the first lateral direction (X direction) and may be alternately arranged apart from each other in the second lateral direction (Y direction). Accordingly, the plurality of ground lines VSS and the plurality of power lines VDD may each overlap the cell boundary CBD of the logic cell LC in the second lateral direction (Y direction).

Figure 2:
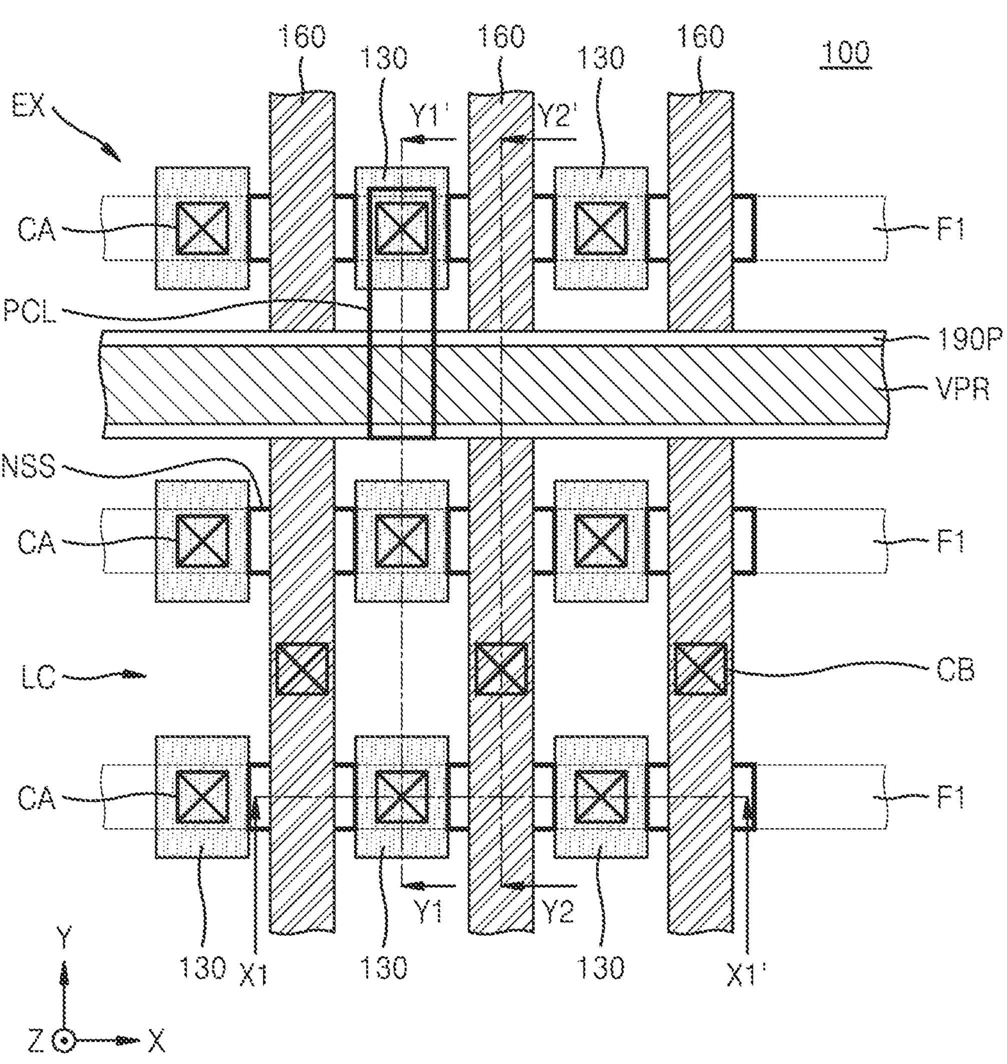
FIG. 2 is a plan layout diagram of an IC device according to embodiments of the present disclosure.
Figure 3A:
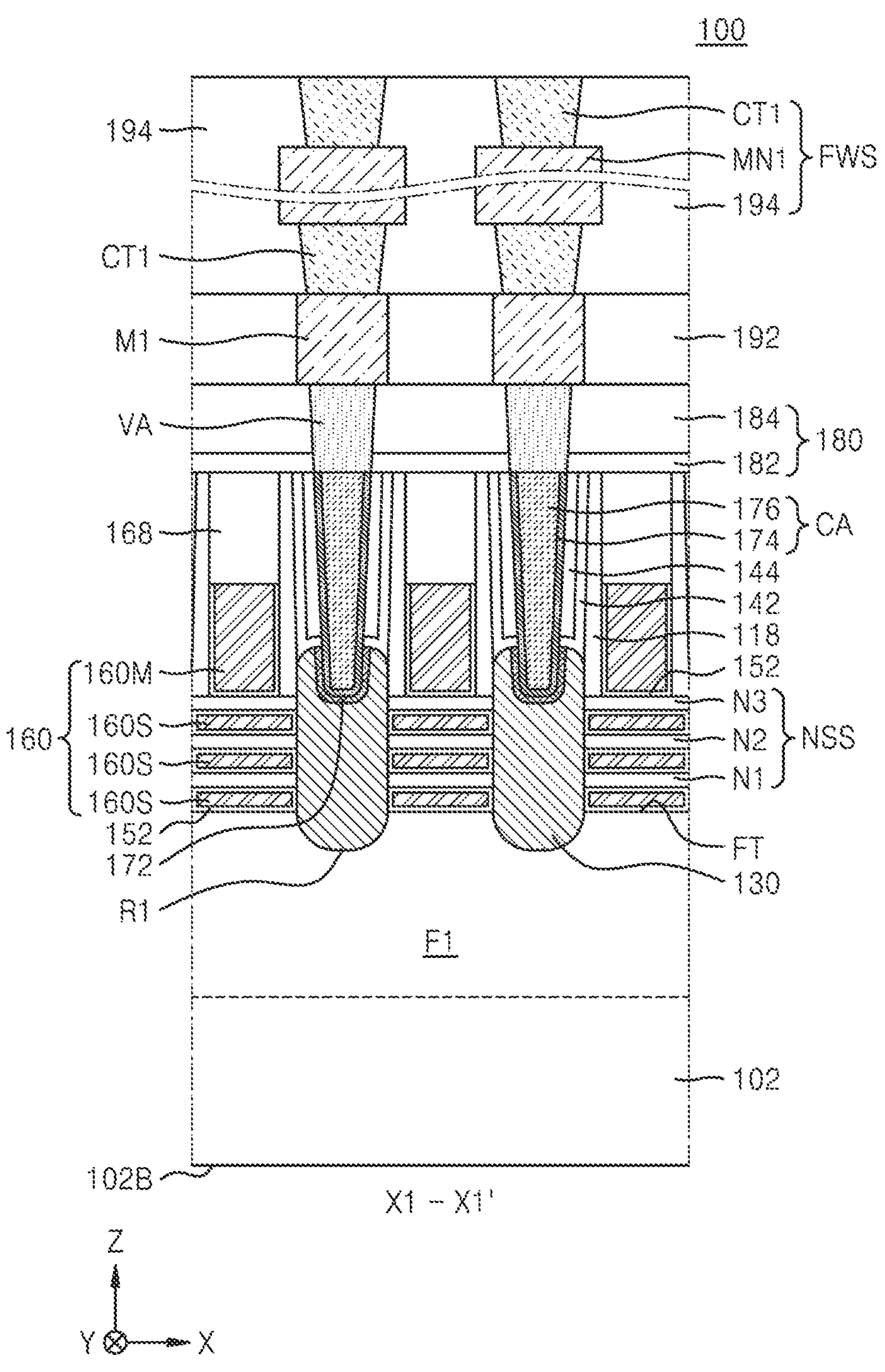
FIG. 3A is a cross-sectional view taken along line X1-X1' of FIG. 2.
Figure 3B:
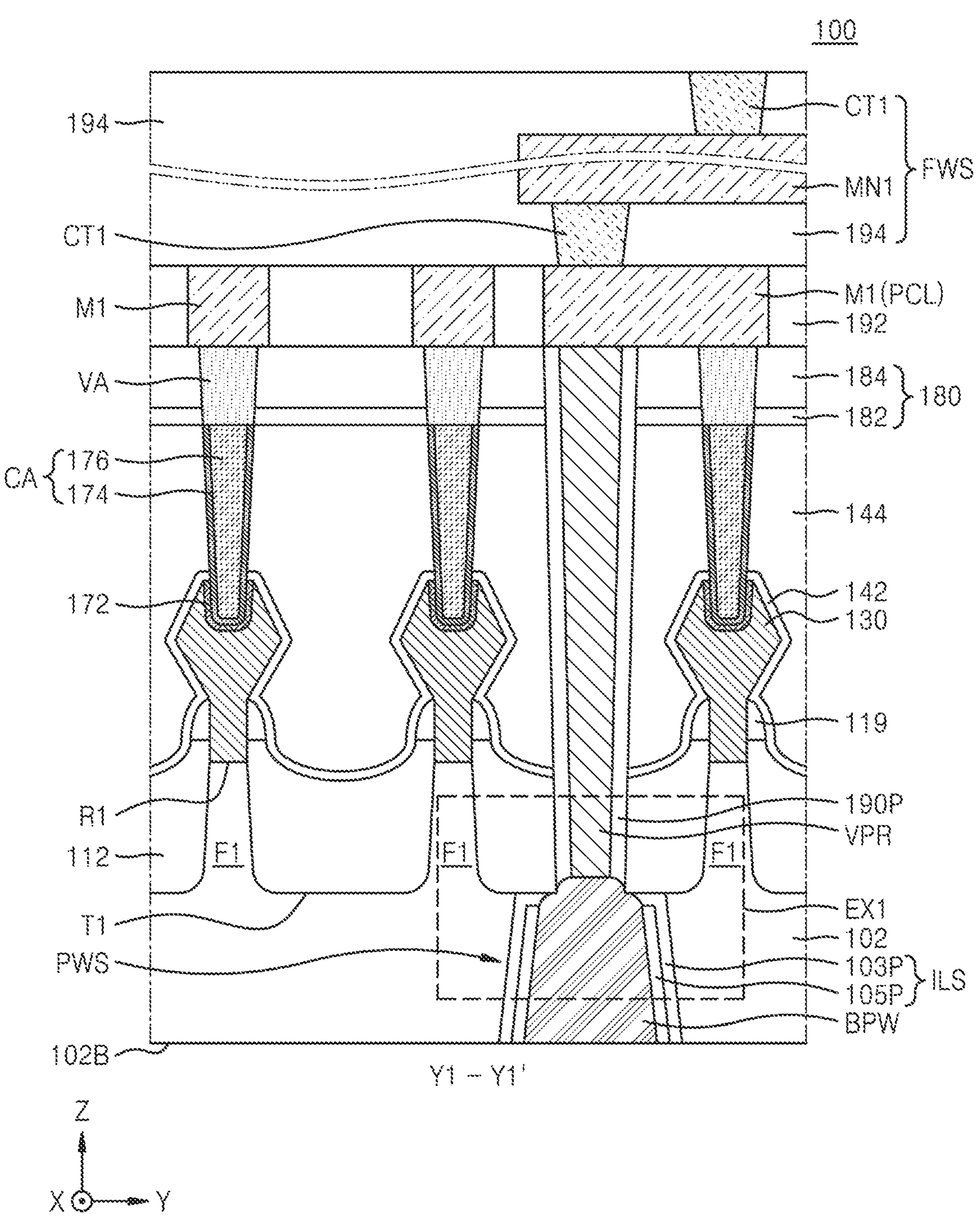
FIG. 3B is a cross-sectional view taken along line Y1-Y1' of FIG. 2.
Figure 3C:
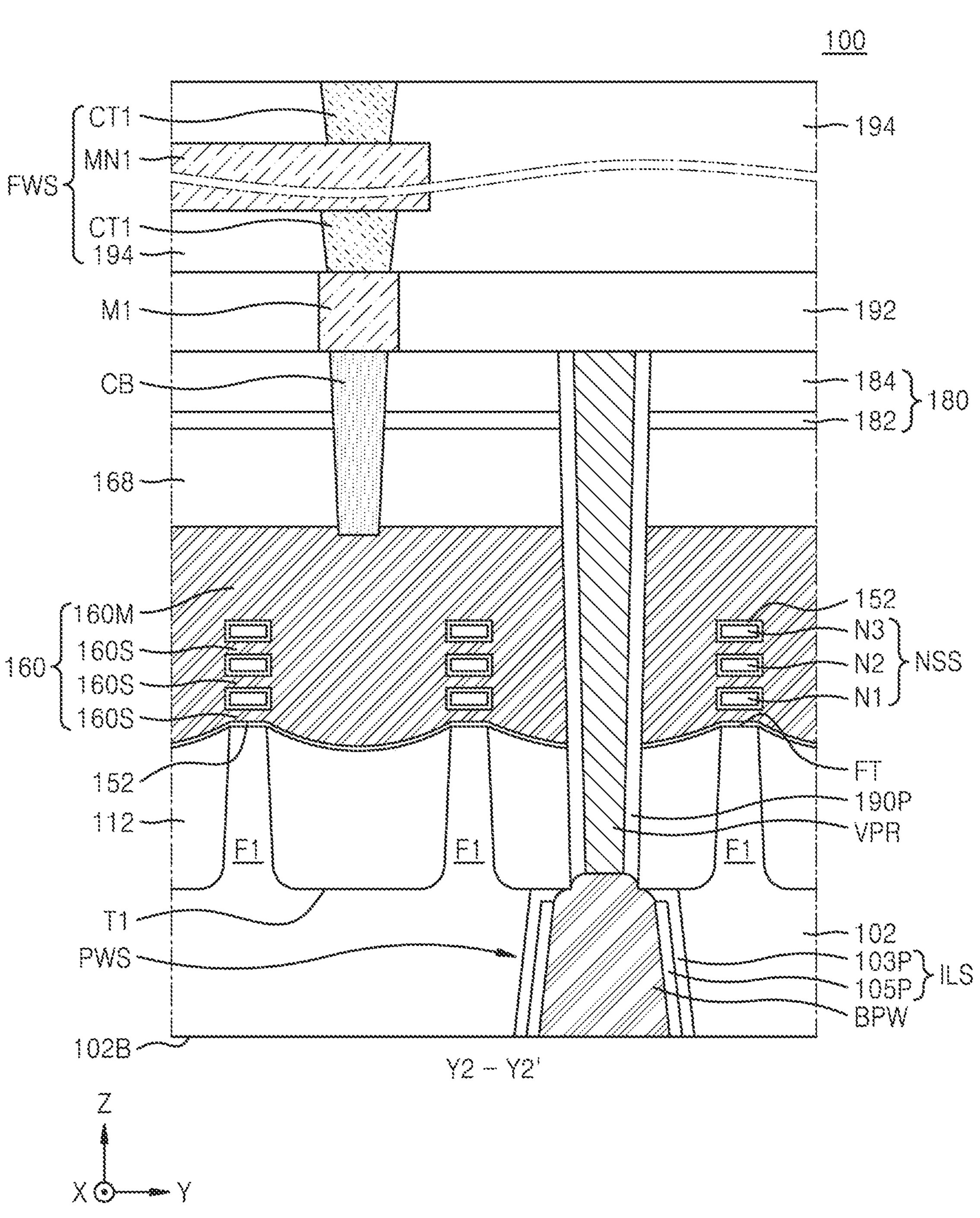
FIG. 3C is a cross-sectional view taken along line Y2-Y2' of FIG. 2.
Figure 3D:
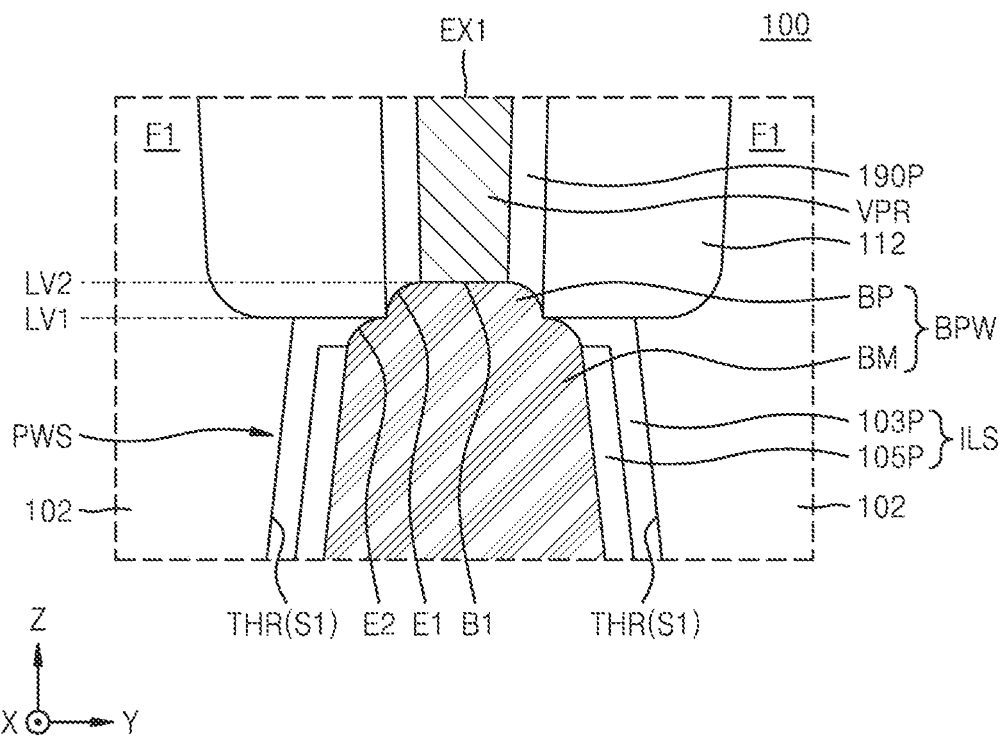
FIG. 3D is an enlarged cross-sectional view of portion "EX1" of FIG. 3B.

FIG. 2 is a plan layout diagram of an IC device 100 according to embodiments of the present disclosure. FIG. 2 illustrates a plan layout of some components of portion "EX" of FIG. 1. FIG. 3A is a cross-sectional view taken along line X1-X1' of FIG. 2. FIG. 3B is a cross-sectional view taken along line Y1-Y1' of FIG. 2. FIG. 3C is a cross-sectional view taken along line Y2-Y2' of FIG. 2. FIG. 3D is an enlarged cross-sectional view of portion "EX1" of FIG. 3B. The IC device 100 including a field-effect transistor (FET) having a gate-all-around structure including an active region of a nanowire or nanosheet type and a gate surrounding the active region is described with reference to FIGS. 2 and 3A to 3D.

As shown in FIGS. 2 and 3A to 3D, the IC device 100 may include two logic cells LC, which are adjacent to each other with a via power rail VPR therebetween in the second lateral direction (Y direction). In embodiments, the via power rail VPR may constitute the ground line VSS shown in FIG. 1.

The IC device 100 may include a substrate 102 having a backside surface 102B and a plurality of fin-type active regions F1 that protrude from (i.e., extend from) the substrate 102 to define a plurality of trench regions T1 on the substrate 102 on an opposite side to the backside surface 102B. The plurality of fin-type active regions F1 may extend parallel to each other in a first lateral direction (X direction) on the substrate 102.

The substrate 102 may include a semiconductor element, such as silicon (Si) or germanium (Ge), or a semiconductor compound, such as silicon germanium (SiGe), silicon carbide (SiC), gallium arsenide (GaAs), indium arsenide (InAs), indium gallium arsenide (InGaAs), or indium phosphide (InP). As used herein, each of the terms "SiGe," "SiC," "GaAs," "InAs," "InGaAs," and "InP" refers to a material including elements included therein, without referring to a chemical formula representing a stoichiometric relationship. The substrate 102 may include a conductive region, for example, a doped well or a doped structure.

A device isolation film 112 may be in the trench region T1. The device isolation film 112 may cover respective sidewalls of the plurality of fin-type active regions F1 in the plurality of trench regions T1. The device isolation film 112 may include a silicon oxide film, without being limited thereto.

As shown in FIG. 3B, the via power rail VPR may extend in a vertical direction (Z direction) between a pair of fin-type active regions F1, which are selected from the plurality of fin-type active regions F1 and adjacent to each other, and between a pair of source/drain regions 130 on the pair of fin-type active regions F1. The via power rail VPR may extend through the device isolation film 112 in the vertical direction (Z direction).

A sidewall of the via power rail VPR may be surrounded by a via insulating spacer 190P. In some embodiments, the via power rail VPR may include a metal wiring layer and a conductive barrier layer surrounding the metal wiring layer. The metal wiring layer may include ruthenium (Ru), cobalt (Co), tungsten (W), or a combination thereof. The conductive barrier layer may include titanium (Ti), titanium nitride (TiN), tantalum (Ta), tantalum nitride (TaN), or a combination thereof. The via insulating spacer 190P may include a material selected from group including silicon nitride (SiN), silicon oxycarbide (SiOC), silicon oxynitride (SiON), and silicon oxycarbonitride (SiOCN). As used herein, each of the terms "SiN," "SiOC," and "SiON" refers to a material including elements included therein, without referring to a chemical formula representing a stoichiometric relationship. In some embodiments, silicon nitride (SiN) may include $Si_3N_4$.

As shown in FIGS. 3B, 3C, and 3D, the substrate 102 may include a backside power structure PWS, which extends through the substrate 102 in the vertical direction (Z direction) at a position overlapping the via power rail VPR in the vertical direction (Z direction). The substrate 102 may have a through region THR configured to accommodate the backside power structure PWS.

The backside power structure PWS may include a backside power rail BPW and an insulating liner structure ILS covering both sidewalls of the backside power rail BPW. The insulating liner structure ILS may extend through the substrate 102 in the vertical direction (Z direction) and be in contact with a device isolation film 112 at a first vertical level LV1. As used herein, the term “vertical level” refers to a distance from the backside surface 102B of the substrate 102 in a vertical direction (Z direction or −Z direction).

As illustrated in FIG. 3D, the via power rail VPR may have a bottom surface B1 at a second vertical level LV2, which is farther from the backside surface 102B of the substrate 102 than the first vertical level LV1 (i.e., a distance of the second vertical level LV2 from the backside surface 102B of the substrate 102 is greater than a distance of the first vertical level LV1 from the backside surface 102B of the substrate 102). As used herein, the bottom surface B1 of the via power rail VPR may be referred to as a “first bottom surface.”

The backside power rail BPW may have a surface in contact with the bottom surface B1 of the via power rail VPR, a surface in contact with the insulating liner structure ILS, a surface in contact with the via insulating spacer 190P, and a surface in contact with the device isolation film 112. The backside power rail BPW may include a main rail BM and a protrusion rail BP. The main rail BM may extend through the substrate 102 and the insulating liner structure ILS in the vertical direction (Z direction). The protrusion rail BP may be integrally connected to the main rail BM and protrude from the main rail BM toward the via power rail VPR. The protrusion rail BP may be in a space defined by the device isolation film 112 in the second lateral direction (Y direction) and be in contact with the bottom surface B1 of the via power rail VPR.

The via insulating spacer 190P may extend through the device isolation film 112 in the vertical direction (Z direction) and be in contact with a sidewall of the via power rail VPR. The via insulating spacer 190P may have a bottom surface μl facing the backside power rail BPW. As used herein, the bottom surface μl of the via insulating spacer 190P may be referred to as a “second bottom surface.” The bottom surface μl of the via insulating spacer 190P may include a curved surface, which is in contact with the backside power rail BPW and is concave toward the backside power rail BPW.

As shown in FIGS. 3B, 3C, and 3D, a lowermost surface of the via insulating spacer 190P may be closer to the insulating liner structure ILS than a lowermost surface of the via power rail VPR. As shown in FIGS. 3B and 3C, a length of the via insulating spacer 190P may be greater than a length of the via power rail VPR in the vertical direction (Z direction).

The protrusion rail BP of the backside power rail BPW may be in contact with the bottom surface B1 of the via power rail VPR and the bottom surface μl of the via insulating spacer 190P. The protrusion rail BP of the backside power rail BPW may include a curved surface, which is convex toward the bottom surface μl of the via insulating spacer 190P to correspond to a shape of the bottom surface μl of the via insulating spacer 190P.

The insulating liner structure ILS may include a first insulating liner 103P and a second insulating liner 105P. The first insulating liner 103P may be in contact with the device isolation film 112 at the first vertical level LV1. The second insulating liner 105P may be apart from the device isolation film 112 with the first insulating liner 103P therebetween.

In some embodiments, the first insulating liner 103P and the second insulating liner 105P may include different materials from each other, and the via insulating spacer 190P and the first insulating liner 103P may include the same material as each other. In some embodiments, the via insulating spacer 190P and the first insulating liner 103P may include the same material selected from a group including silicon nitride (SiN), silicon oxycarbide (SiOC), silicon oxynitride (SiON), and silicon oxycarbonitride (SiOCN). In some embodiments, the second insulating liner 105P may be selected from a group including silicon oxide (SiO), silicon oxynitride (SiON), and silicon oxycarbonitride (SiOCN), and the second insulating liner 105P may include a different material from a constituent material of each of the via insulating spacer 190P and the first insulating liner 103P. As used herein, each of the terms “SiN,” “SiOC,” “SiON,” “SiOCN,” and “SiO” refers to a material including elements included therein, without referring to a chemical formula representing a stoichiometric relationship. In some embodiments, the silicon nitride (SiN) may include $Si_3N_4$. The silicon oxide (SiO) may include $SiO_2$.

In some embodiments, the via insulating spacer 190P and the first insulating liner 103P may include silicon nitride (SiN), and the second insulating liner 105P may include silicon oxide (SiO). In other embodiments, the via insulating spacer 190P and the first insulating liner 103P may include silicon oxycarbide (SiOC), and the second insulating liner 105P may include silicon oxynitride (SiON), silicon oxycarbonitride (SiOCN), or a combination thereof. In additional embodiments, the via insulating spacer 190P and the first insulating liner 103P may include silicon oxynitride (SiON), and the second insulating liner 105P may include silicon oxide (SiO). In other embodiments, the via insulating spacer 190P and the first insulating liner 103P may include silicon oxycarbonitride (SiOCN), and the second insulating liner 105P may include silicon oxide (SiO). However, the present disclosure is not limited thereto, and a constituent material of each of the via insulating spacer 190P, the first insulating liner 103P, and the second insulating liner 105P may vary.

In some embodiments, a thickness of each of the first insulating liner 103P and the second insulating liner 105P may be equal or similar to a thickness of the via insulating spacer 190P. For example, a thickness of each of the first insulating liner 103P, the second insulating liner 105P, and the via insulating spacer 190P may be in a range of about 2 nm to about 10 nm, including endpoints, or a range of about 3 nm to about 8 nm, including endpoints, without being limited thereto.

The through region THR of the substrate 102 may have a pair of inner sidewalls S1 in contact with the first insulating liner 103P of the insulating liner structure ILS. A distance between the pair of inner sidewalls S1 in the second lateral direction (Y direction) may gradually increase toward the backside surface 102B of the substrate 102. That is, a width of the through region THR in the second lateral direction (Y direction) may gradually increase toward the backside surface 120B of the substrate 102.

In some embodiments, the backside power rail BPW may include a metal wiring layer and a conductive barrier layer surrounding the metal wiring layer. The metal wiring layer and the conductive barrier layer of the backside power rail BPW may substantially be the same as the above-described details of the metal wiring layer and the conductive barrier layer of the via power rail VPR.

As shown in FIG. 3B, the backside power structure PWS may be apart from a pair of source/drain regions 130, which are on both sides of the via power rail VPR, with the device isolation film 112 therebetween. Furthermore, the backside power structure PWS may be apart from a pair of fin-type active regions F1, which are on both sides of the via power rail VPR, with the substrate 102 therebetween. Accordingly, the backside power rail BPW may be apart from the pair of source/drain regions 130, which are on both sides of the via power rail VPR, with the device isolation film 112 therebetween, and the backside power rail BPW may be apart from the pair of fin-type active regions F1, which are on both sides of the via power rail VPR, with the substrate 102 therebetween. In the second lateral direction (Y direction), the insulating liner structure ILS may cover both sidewalls of the backside power rail BPW. The backside power rail BPW may be apart from the pair of fin-type active regions F1, which are on both sides of the via power rail VPR, with the insulating liner structure ILS and the substrate 102 therebetween.

As shown in FIGS. 2, 3A, and 3C, a plurality of gate lines 160 may be on the plurality of fin-type active regions F1. Each of the plurality of gate lines 160 may extend in the second lateral direction (Y direction), which intersects with the first lateral direction (X direction). A plurality of nanosheet stacks NSS may be respectively on fin top surfaces FT of the plurality of fin-type active regions F1 at intersections between the plurality of fin-type active regions F1 and the plurality of gate lines 160. Each of the plurality of nanosheet stacks NSS may include at least one nanosheet, which is apart from the fin top surface FT of the fin-type active region F1 in the vertical direction (Z direction) and faces the fin top surface FT of the fin-type active region F1. As used herein, the term "nanosheet" refers to a conductive structure having a cross-section that is substantially perpendicular to a direction in which current flows. The nanosheet may include a nanowire.

As shown in FIGS. 3A and 3C, each of the plurality of nanosheet stacks NSS may include a first nanosheet N1, a second nanosheet N2, and a third nanosheet N3, which overlap each other in the vertical direction (Z direction) on the fin-type active region F1. The first nanosheet N1, the second nanosheet N2, and the third nanosheet N3 may be at different vertical distances (Z-directional distances) from the fin top surface FT of the fin-type active region F1. Each of the plurality of gate lines 160 may surround the first nanosheet N1, the second nanosheet N2, and the third nanosheet N3 of the nanosheet NSS, which overlap each other in the vertical direction (Z direction).

Although FIG. 2 illustrates an embodiment in which the nanosheet stack NSS has a substantially rectangular planar shape, the present disclosure is not limited thereto. The nanosheet stack NSS may have various planar shapes according to a planar shape of each of the fin-type active region F1 and the gate line 160. The present embodiment pertains to a configuration in which the plurality of nanosheet stacks NSS and the plurality of gate lines 160 are formed on one fin-type active region F1, and the plurality of nanosheet stacks NSS are arranged in a line in the first lateral direction (X direction) on one fin-type active region F1. However, the number of nanosheet stacks NSS and the number of gate lines 160 on one fin-type active region F1 are not specifically limited.

Each of the first to third nanosheets N1, N2, and N3 included in the nanosheet stack NSS may be configured to function as a channel region. In some embodiments, each of the first nanosheet N1, the second nanosheet N2, and the third nanosheet N3 may have a thickness selected in a range of about 4 nm to about 6 nm, including endpoints, without being limited thereto. Here, the thickness of each of the first to third nanosheets N1, N2, and N3 refers to a size of each of the first to third nanosheets N1, N2, and N3 in the vertical direction (Z direction). In some embodiments, the first to third nanosheets N1, N2, and N3 may have substantially the same thickness in the vertical direction (Z direction). In other embodiments, at least some of the first to third nanosheets N1, N2, and N3 may have different thicknesses in the vertical direction (Z direction). In some embodiments, each of the first nanosheet N1, the second nanosheet N2, and the third nanosheet N3 included in the nanosheet stack NSS may include a Si layer, a SiGe layer, or a combination thereof.

As shown in FIG. 3A, the first to third nanosheets N1, N2, and N3 included in one nanosheet stack NSS may have the same size or similar sizes in the first lateral direction (X direction). In other embodiments, at least some of the first to third nanosheets N1, N2, and N3 included in one nanosheet stack NSS may have different sizes in the first lateral direction (X direction). The present embodiment pertains to an example in which each of the plurality of nanosheet stacks NSS includes three nanosheets, but the present disclosure is not limited thereto. For example, the nanosheet stack NSS may include at least one nanosheet, and the number of nanosheets in the nanosheet stack NSS is not specifically limited.

As shown in FIGS. 3A and 3C, each of the plurality of gate lines 160 may include a main gate portion 160M and a plurality of sub-gate portions 160S. The main gate portion 160M may cover a top surface of the nanosheet stack NSS and extend in the second lateral direction (Y direction). The plurality of sub-gate portions 160S may be integrally connected to the main gate portion 160M and respectively arranged one-by-one between the first to third nanosheets N1, N2, and N3 and between the first nanosheet N1 and the fin-type active region F1. In the vertical direction (Z direction), a thickness of each of the plurality of sub-gate portions 160S may be less than a thickness of the main gate portion 160M.

As shown in FIGS. 3A and 3B, a plurality of recesses R1 may be formed in the fin-type active region F1. A lowermost surface of each of the plurality of recesses R1 may be at a lower vertical level than the fin top surface FT of the fin-type active region F1.

As shown in FIGS. 3A and 3B, a plurality of source/drain regions 130 may be inside the plurality of recesses R1. Each of the plurality of source/drain regions 130 may be adjacent to at least one gate line 160 selected from the plurality of gate lines 160. Each of the plurality of source/drain regions 130 may have surfaces facing the first to third nanosheets N1, N2, and N3 included in the nanosheet stack NSS adjacent thereto. Each of the plurality of source/drain regions 130 may be in contact with the first to third nanosheets N1, N2, and N3 included in the nanosheet stack NSS adjacent thereto.

Each of the plurality of gate lines 160 may include a metal, a metal nitride, a metal carbide, or a combination thereof. The metal may be selected from a group including titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from a group including titanium nitride (TiN) and tantalum nitride (TaN). The metal carbide may include titanium aluminum carbide (TiAlC). However, a material included in the plurality of gate lines 160 is not limited to the examples described above.

A gate dielectric film 152 may be between the nanosheet stack NSS and the gate line 160. In some embodiments, the gate dielectric film 152 may have a stack structure of an interface dielectric film and a high-k dielectric film. The interface dielectric film may include a low-k dielectric material film (e.g., a silicon oxide film, a silicon oxynitride film, or a combination thereof), which has a dielectric constant of about 9 or less. In some embodiments, the interface dielectric film may be omitted. The high-k dielectric film may include a material having a higher dielectric constant than a silicon oxide film. For example, the high-k dielectric film may have a dielectric constant of about 10 to 25. The high-k dielectric film may include hafnium oxide, without being limited thereto.

As shown in FIGS. 3A and 3C, a top surface of each of the gate dielectric film 152 and the gate line 160 may be covered by a capping insulating pattern 168. The capping insulating pattern 168 may include a silicon nitride film. Both sidewalls of each of the gate line 160 and the capping insulating pattern 168 may be covered by outer insulating spacers 118. The outer insulating spacers 118 may cover both sidewalls of the main gate portion 160M on top surfaces of the plurality of nanosheet stacks NSS. The outer insulating spacers 118 may be apart from the gate line 160 with the gate dielectric film 152 therebetween.

As shown in FIG. 3B, a plurality of recess-side insulating spacers 119 may cover sidewalls of the source/drain region 130 on a top surface of the isolation film 112. In embodiments, the recess-side insulating spacers 119 may be respectively and integrally connected to the outer insulating spacer 118 adjacent thereto.

The plurality of outer insulating spacers 118 and the plurality of recess-side insulating spacers 119 may each include silicon nitride, silicon oxide, silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms “SiCN,” “SiBN,” “SiON,” “SiOCN,” “SiBCN,” and “SiOC” refers to a material including elements included therein, without referring to a chemical formula representing a stoichiometric relationship.

A metal silicide film 172 may be formed on a top surface of each of the plurality of source/drain regions 130. The metal silicide film 172 may include a metal, which includes titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), or palladium (Pd). For example, the metal silicide film 172 may include titanium silicide, without being limited thereto.

On the substrate 102, the plurality of source/drain regions 130, a plurality of metal silicide films 172, and the plurality of outer insulating spacers 118 may be covered by an insulating liner 142. In embodiments, the insulating liner 142 may be omitted. An inter-gate dielectric film 144 may be on the insulating liner 142. When the insulating liner 142 is omitted, the inter-gate dielectric film 144 may be in contact with the plurality of source/drain regions 130. In some embodiments, the insulating liner 142 may include silicon nitride, SiCN, SiBN, SION, SiOCN, SiBCN, or a combination thereof, without being limited thereto. The inter-gate dielectric film 144 may include a silicon oxide film, without being limited thereto.

Both sidewalls of each of the plurality of sub-gate portions 160S included in the plurality of gate lines 160 may be apart from the source/drain region 130 with the gate dielectric film 152 therebetween. The gate dielectric film 152 may be between the sub-gate portion 160S included in the gate line 160 and each of the first to third nanosheets N1, N2, and N3 and between the sub-gate portion 160S included in the gate line 160 and the source/drain region 130.

The plurality of nanosheet stacks NSS may be respectively on the fin top surfaces FT of the plurality of fin-type active regions F1 in regions where the plurality of fin-type active regions F1 intersect with the plurality of gate lines 160. Each of the plurality of nanosheet stacks NSS may be apart from the fin-type active region F1 and face the fin top surface FT of the fin-type active region F1. On the substrate 102, a plurality of nanosheet transistors may be formed at intersections between the plurality of fin-type active regions F1 and the plurality of gate lines 160.

As shown in FIGS. 3A and 3B, a plurality of source/drain contacts CA may be on the plurality of source/drain regions 130. Each of the plurality of source/drain contacts CA may extend through the inter-gate dielectric film 144 and the insulating liner 142 in the vertical direction (Z direction) and be in contact with the metal silicide film 172. Each of the plurality of source/drain contacts CA may be electrically connected to the source/drain region 130 through the metal silicide film 172. Each of the plurality of source/drain contacts CA may be apart from the main gate portion 160M with the outer insulating spacer 118 therebetween in the first lateral direction (X direction).

Each of the plurality of source/drain contacts CA may include a conductive barrier pattern 174 and a contact plug 176, which are sequentially stacked on the source/drain region 130. The conductive barrier pattern 174 may surround and contact a bottom surface and a sidewall of the contact plug 176. Each of the plurality of source/drain contacts CA may extend through the inter-gate dielectric film 144 and the insulating liner 142 and extend in the vertical direction (Z direction). The conductive barrier pattern 174 may be between the metal silicide film 172 and the contact plug 176. The conductive barrier pattern 174 may have a surface in contact with the metal silicide film 172 and a surface in contact with the contact plug 176. In some embodiments, the conductive barrier pattern 174 may include a metal or a metal nitride. For example, the conductive barrier pattern 174 may include titanium (Ti), tantalum (Ta), tungsten (W), titanium nitride (TiN), tantalum (TaN), tungsten nitride (WN), tungsten carbon nitride (WCN), titanium silicon nitride (TiSiN), tantalum silicon nitride (TaSiN), tungsten silicon nitride (WSiN), or a combination thereof, without being limited thereto. The contact plug 176 may include molybdenum (Mo), copper (Cu), tungsten (W), cobalt (Co), ruthenium (Ru), manganese (Mn), titanium (Ti), tantalum (Ta), aluminum (Al), or a combination thereof, without being limited thereto.

As shown in FIG. 3B, from among the plurality of source/drain contacts CA, the source/drain contact CA adjacent to the via power rail VPR may be apart from the via power rail VPR in the second lateral direction (Y direction).

As shown in FIGS. 3A to 3C, a top surface of each of the plurality of source/drain contacts CA, the plurality of capping insulating patterns 168, and the inter-gate dielectric film 144 may be covered with an upper insulating structure 180. The upper insulating structure 180 may include an etch stop film 182 and an interlayer insulating film 184, which are sequentially stacked on each of the plurality of source/drain contacts CA, the plurality of capping insulating patterns 168, and the inter-gate dielectric film 144. The etch stop film 182 may include silicon carbide (SiC), silicon nitride (SiN), nitrogen-doped silicon carbide (SiC:N), silicon oxycarbide (SiOC), aluminum nitride (AlN), aluminum oxynitride (AlON), aluminum oxide (AlO), aluminum oxycarbide (AlOC), or a combination thereof. The interlayer insulating film 184 may include an oxide film, a nitride film, an ultralow-k (ULK) film having a dielectric constant K of about 2.2 to about 2.4, including endpoints, or a combination thereof. For example, the interlayer insulating film 184 may include a tetraethylorthosilicate (TEOS) film, a high-density plasma (HDP) film, a boro-phospho-silicate glass (BPSG) film, a flowable chemical vapor deposition (FCVD) oxide film, a silicon oxynitride (SiON) film, a silicon nitride (SiN) film, a silicon oxycarbide (SiOC) film, a SiCOH film, or a combination thereof, without being limited thereto.

As shown in FIGS. 3A and 3B, a plurality of source/drain via contacts VA may be on the plurality of source/drain contacts CA. Each of the plurality of source/drain via contacts VA may extend through the upper insulating structure 180 and be in contact with the source/drain contact CA. Each of the plurality of source/drain regions 130 may be electrically connected to the source/drain via contact VA through the metal silicide film 172 and the source/drain contact CA. A bottom surface of each of the plurality of source/drain via contacts VA may be in contact with the top surface of the source/drain contact CA.

As shown in FIGS. 2 and 3C, a gate contact CB may be on the gate line 160. The gate contact CB may be connected to the gate line 160 by extending through the upper insulating structure 180 and the capping insulating pattern 168 in the vertical direction (Z direction). A bottom surface of the gate contact CB may be in contact with a top surface of the gate line 160.

The plurality of source/drain via contacts VA and the gate contact CB may each include a contact plug, which includes molybdenum (Mo), copper (Cu), tungsten (W), cobalt (Co), ruthenium (Ru), manganese (Mn), titanium (Ti), tantalum (Ta), aluminum (Al), or a combination thereof, but a constituent material of the contact plug is not limited thereto. In some embodiments, each of the plurality of source/drain via contacts VA and the gate contact CB may further include a conductive barrier pattern surrounding a portion of the contact plug. The conductive barrier pattern included in each of the plurality of source/drain via contacts VA and the gate contact CB may include a metal or a metal nitride. For example, the conductive barrier pattern may include Ti, Ta, W, TiN, TaN, WN, WCN, TiSiN, TaSiN, WSiN, or a combination thereof, without being limited thereto.

The via power rail VPR and the via insulating spacer 190P may extend through the upper insulating structure 180, the capping insulating pattern 168, the gate line 160, the inter-gate dielectric film 144, the insulating liner 142, and the device isolation film 112 in the vertical direction (Z direction). A portion of the gate line 160, which is penetrated by the via power rail VPR and the via insulating spacer 190P in the vertical direction (Z direction), may be a region between a pair of adjacent ones of the plurality of nanosheet stacks NSS. The via power rail VPR may be apart from the gate line 160 with the via insulating spacer 190P therebetween in a lateral direction (e.g., the second lateral direction (Y direction)). The via power rail VPR and the via insulating spacer 190P may be apart from the plurality of source/drain regions 130 in the lateral direction (e.g., the second lateral direction (Y direction)).

As shown in FIG. 3C, the backside power structure PWS including the backside power rail BPW and the insulating liner structure ILS may overlap the gate line 160 in the vertical direction (Z direction). The backside power structure PWS may be apart from the plurality of nanosheet stacks NSS with the device isolation film 112 therebetween.

As shown in FIGS. 3A, 3B, and 3C, the top surface of the upper insulating structure 180, the top surface of each of the plurality of source/drain via contacts VA, and the top surface of the gate contact CB may be covered by an upper insulating film 192. A constituent material of the upper insulating film 192 may be substantially the same as that of the interlayer insulating film 184.

A plurality of upper wiring layers M1 may extend through the upper insulating film 192. Each of the plurality of upper wiring layers M1 may be connected to a selected one of the plurality of source/drain via contacts VA located thereunder or a selected one of a plurality of gate contacts (refer to CB in FIGS. 2 and 3C). The plurality of upper wiring layers M1 may include molybdenum (Mo), copper (Cu), tungsten (W), cobalt (Co), ruthenium (Ru), manganese (Mn), titanium (Ti), tantalum (Ta), aluminum (Al), or a combination thereof, without being limited thereto.

As shown in FIG. 3B, the plurality of upper wiring layers M1 may include a power connection conductive layer PCL connected to the via power rail VPR on the via power rail VPR. A selected one of the plurality of source/drain via contacts VA may be apart from the via power rail VPR in the second lateral direction (Y direction) and connected between the source/drain contact CA and the power connection conductive layer PCL. From among the plurality of source/drain regions 130, the source/drain region connected to the via power rail VPR may be electrically connected to the via power rail VPR through the source/drain contact CA, the source/drain via contact VA, and the power connection conductive layer PCL.

A front-side wiring structure FWS may be on the plurality of upper wiring layers M1 and the upper insulating film 192. The front-side wiring structure FWS may include a plurality of wiring layers MN1, a plurality of via contacts CT1, and an interlayer insulating film 194 covering the plurality of wiring layers MN1 and the plurality of via contacts CT1. The via power rail VPR may be connected to a selected one of the plurality of wiring layers MN1 through the upper wiring layer M1 and the via contact CT1. A constituent material of the plurality of wiring layers MN1 and the plurality of via contacts CT1 may substantially be the same as that of the plurality of upper wiring layers M1, as described above. A constituent material of the interlayer insulating film 194 may substantially be the same as that of the interlayer insulating film 184, as described above.

Each of the backside surface 102B of the substrate 102 and the backside power rail BPW may be covered by a backside wiring structure (not shown). The backside wiring structure may substantially have the same configuration as the front-side wiring structure FWS. However, the backside wiring structure may include a wiring layer connected to the backside power rail BPW.

As described above with reference to FIGS. 2 and 3A to 3D, the IC device 100 may include a backside power structure PWS configured to extend through the substrate 102, and the backside power structure PWS may include the backside power rail BPW connected to the via power rail VPR and the insulating liner structure ILS covering both sidewalls of the backside power rail BPW. The via power rail VPR may have the bottom surface B1 that is at the second vertical level LV2, which is further from the backside surface 102B of the substrate 102 than the first vertical level LV1 at which the insulating liner structure ILS is in contact with the device isolation film 112. Accordingly, when an etching process to form the backside power rail BPW is being performed during the process of manufacturing the IC device 100, structural damage or degradation of the via power rail VPR may be prevented due to an etching process atmosphere. In addition, a degree of freedom by which a shape of the backside power rail BPW may be controlled may improve, and thus, a contact area between the backside power rail BPW and the via power rail VPR may increase, and the contact resistance between the backside power rail BPW and the via power rail VPR may be reduced. Furthermore, leakage current between the substrate 102 and the backside power rail BPW may be inhibited due to the insulating liner structure ILS including a plurality of insulating liners having different materials from each other. Accordingly, the reliability of the IC device 100 may be improved.

Figure 4:
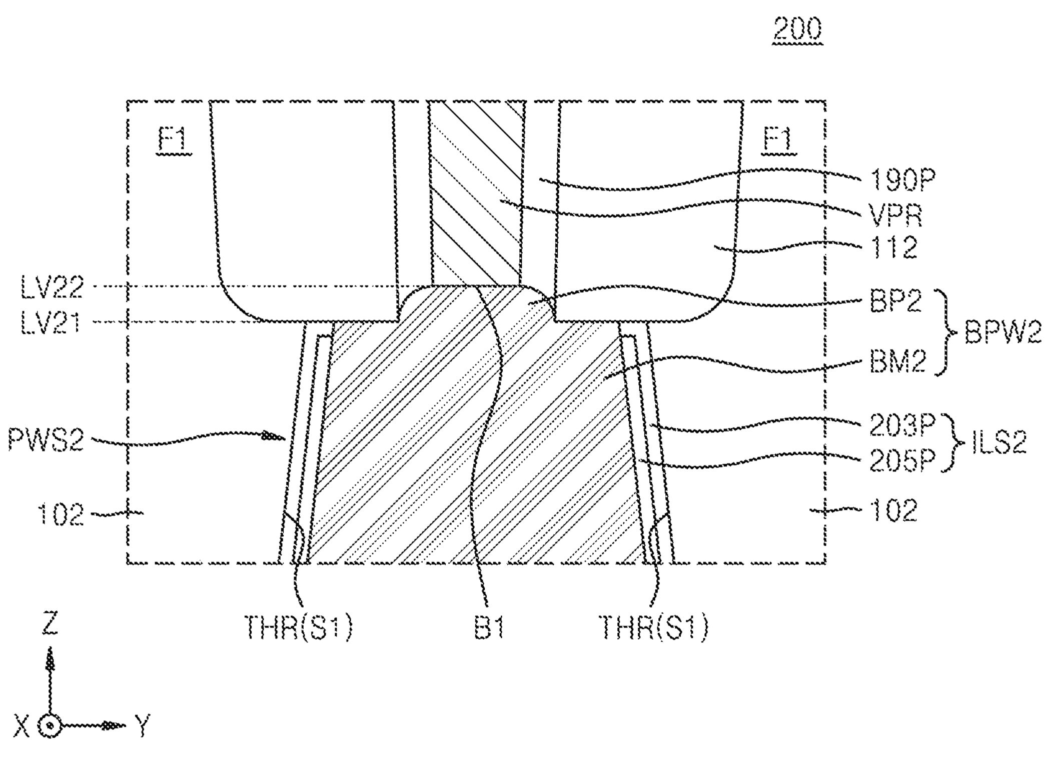
FIG. 4 is a cross-sectional view of an IC device according to embodiments of the present disclosure.

FIG. 4 is a cross-sectional view of an IC device 200 according to embodiments. FIG. 4 illustrates an enlarged cross-sectional configuration of a portion corresponding to portion "EX1" of FIG. 3B in the IC device 200. In FIG. 4, the same reference numerals are used to denote the same elements as in FIGS. 2 and 3A to 3D, and repeated descriptions thereof are omitted.

Referring to FIG. 4, the IC device 200 may substantially have the same configuration as the IC device 100 described with reference to FIGS. 2 and 3A to 3D. However, the IC device 200 may include a backside power structure PWS2.

The backside power structure PWS2 may substantially have the same configuration as the backside power structure PWS described with reference to FIGS. 3B to 3D. However, the backside power structure PWS2 may include a backside power rail BPW2 and an insulating liner structure ILS2 covering both sidewalls of the backside power rail BPW2.

The backside power rail BPW2 may have a surface in contact with a bottom surface B1 of a via power rail VPR, a surface in contact with the insulating liner structure ILS2, a surface in contact with the via insulating spacer 190P, and a surface in contact with a device isolation film 112. The backside power rail BPW2 may include a main rail BM2 and a protrusion rail BP2. The main rail BM2 may extend through a substrate 102 and the insulating liner structure ILS2 in a vertical direction (Z direction). The protrusion rail BP2 may be integrally connected to the main rail BM2 and protrude from the main rail BM2 toward the via power rail VPR. The protrusion rail BP2 may be in a space defined by the device isolation film 112 in a second lateral direction (Y direction) and be in contact with the bottom surface B1 of the via power rail VPR. The backside power rail BPW2 may substantially be the same the backside power rail BPW, as described above with reference to FIGS. 3B to 3D.

The insulating liner structure ILS2 may extend through the substrate 102 in the vertical direction (Z direction) and be in contact with the device isolation film 112 at a first vertical level LV21. The insulating liner structure ILS2 may include a first insulating liner 203P and a second insulating liner 205P. The insulating liner structure ILS2 may be in contact with the device isolation film 112 at the first vertical level LV21. The second insulating liner 205P may be apart from the device isolation film 112 with the first insulating liner 203P therebetween. The via power rail VPR may have a bottom surface B1 at a second vertical level LV22, which is farther from the substrate 102 than the first vertical level LV21.

In some embodiments, a thickness of each of the first insulating liner 203P and the second insulating liner 205P may be half or less than half of a thickness of the via insulating spacer 190P. A sum of the thickness of the first insulating liner 203P and the thickness of the second insulating liner 205P may be equal to or less than the thickness of the via insulating spacer 190P. For example, a thickness of each of the first insulating liner 203P and the second insulating liner 205P may be in a range of about 1 nm to about 5 nm, including endpoints, or a range of about 1 nm to about 4 nm, including endpoints, without being limited thereto. The first insulating liner 203P and the second insulating liner 205P may substantially be the same of the first insulating liner 103P and the second insulating liner 105P, respectively, as described above with reference to FIGS. 3B to 3D.

Similar to the IC device 100 described with reference to FIGS. 2 and 3A to 3D, in the IC device 200 shown in FIG. 4, the via power rail VPR may have the bottom surface B1 at the second vertical level LV22, which is farther from the substrate 102 than the first vertical level LV21 at which the insulating liner structure ILS2 is in contact with the device isolation film 112. Accordingly, when an etching process to form the backside power rail BPW2 is being performed during the process of manufacturing the IC device 200, structural damage or degradation of the via power rail VPR may be prevented due to an etching process atmosphere. Furthermore, leakage current between the substrate 102 and the backside power rail BPW may be inhibited due to the insulating liner structure ILS including a plurality of insulating liners having different materials from each other. Accordingly, the reliability of the IC device 200 may be improved.

Figure 5:
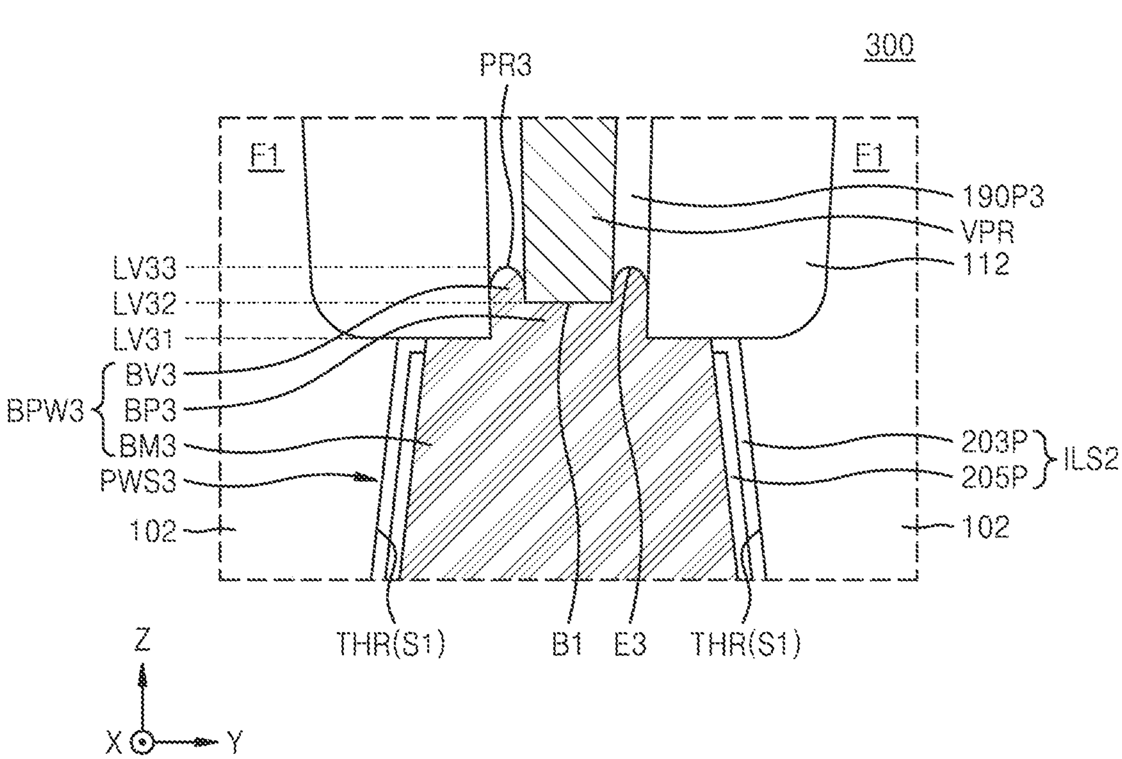
FIG. 5 is a cross-sectional view of an IC device according to embodiments of the present disclosure.

FIG. 5 is a cross-sectional view of an IC device 300 according to embodiments. FIG. 5 illustrates an enlarged cross-sectional configuration of a portion corresponding to portion "EX1" of FIG. 3B in the IC device 300. In FIG. 5, the same reference numerals are used to denote the same elements as in FIGS. 2 to 4, and repeated descriptions thereof are omitted here.

Referring to FIG. 5, the IC device 300 may substantially have the same configuration as the IC device 200 described with reference to FIG. 4. However, the IC device 300 may include a backside power structure PWS3.

The backside power structure PWS3 may substantially have the same configuration as the backside power structure PWS2 described with reference to FIG. 4. However, the backside power structure PWS3 may include a backside power rail BPW3 and an insulating liner structure ILS2 covering both sidewalls of the backside power rail BPW3.

A sidewall of a via power rail VPR may be surrounded by a via insulating spacer 190P3. The via insulating spacer 190P3 may substantially have the same configuration as the via insulating spacer 190P described with reference to FIGS. 3B to 3D. However, in a vertical direction (Z direction), a length of the via insulating spacer 190P3 may be less than a length of the via power rail VPR.

The backside power rail BPW3 may have a surface in contact with a bottom surface B1 of the via power rail VPR, a surface in contact with the insulating liner structure ILS2, a surface in contact with the via insulating spacer 190P3, and a surface in contact with a device isolation film 112. The backside power rail BPW3 may include a main rail BM3, a protrusion rail BP3, and a vertical extension BV3. The main rail BM3 may extend through a substrate 102 and the insulating liner structure ILS2 in the vertical direction (Z direction). The protrusion rail BP3 may be integrally connected to the main rail BM3 and protrude from the main rail BM3 toward the via power rail VPR. The vertical extension BV3 may extend from the protrusion rail BP3 toward the via insulating spacer 190P3 in the vertical direction (Z direction). The protrusion rail BP3 of the backside power rail BPW3 may be in a space defined by the device isolation film 112 in a second lateral direction (Y direction) and be in contact with the bottom surface B1 of the via power rail VPR. In the backside power rail BPW3, the vertical extension BV3 may be integrally connected to the protrusion rail BP3. The vertical extension BV3 of the backside power rail BPW3 may be between the sidewall of the via power rail VPR and at least a portion of the device isolation film 112. The backside power rail BPW3 may substantially be the same the backside power rail BPW, as described above with reference to FIGS. 3B to 3D.

The insulating liner structure ILS2 may be in contact with a device isolation film 112 at a first vertical level LV31. The insulating liner structure ILS2 may include a first insulating liner 203P and a second insulating liner 205P. The first insulating liner 203P may be in contact with the device isolation film 112 at the first vertical level LV31. The second insulating liner 205P may be apart from the device isolation film 112 with the first insulating liner 203P therebetween. The insulating liner structure ILS2 may be the same as described above with reference to FIG. 4.

The via power rail VPR may have the bottom surface B1 at a second vertical level LV32, which is farther from the substrate 102 than the first vertical level LV31. The via insulating spacer 190P3 may have a bottom surface E3 at a third vertical level LV33, which is farther from the substrate 102 than the second vertical level LV32 (i.e., a distance of the third vertical level LV33 from the backside surface 102B of the substrate 102 is greater than a distance of the second vertical level LV32 from the backside surface 102B of the substrate 102). As used herein, the bottom surface E3 of the via insulating spacer 190P3 may be referred to as a "second bottom surface." The vertical extension BV3 of the backside power rail BPW3 may be in contact with the bottom surface E3 of the via insulating spacer 190P3.

The bottom surface E3 of the via insulating spacer 190P3 may include a curved surface, which is in contact with the vertical extension BV3 of the backside power rail BPW3 and is concave toward the vertical extension BV3. The vertical extension BV3 of the backside power rail BPW3 may include a curved surface PR3, which is convex toward the bottom surface E3 of the via insulating spacer 190P3 to correspond to a shape of the bottom surface E3 of the via insulating spacer 190P3.

Because the backside power rail BPW3 includes the vertical extension BV3, the backside power rail BPW3 may be configured to contact each of the bottom surface B1 of the via power rail VPR and the sidewall of the via power rail VPR. By controlling a length of the vertical extension BV3 in the vertical direction (Z direction) as desired during the process of manufacturing the IC device 300, a degree of freedom by which a shape of the backside power rail BPW3 may be controlled may improve. Accordingly, a contact area between the backside power rail BPW3 and the via power rail VPR may increase, and a contact resistance between the backside power rail BPW3 and the via power rail VPR may be reduced.

Figure 6:
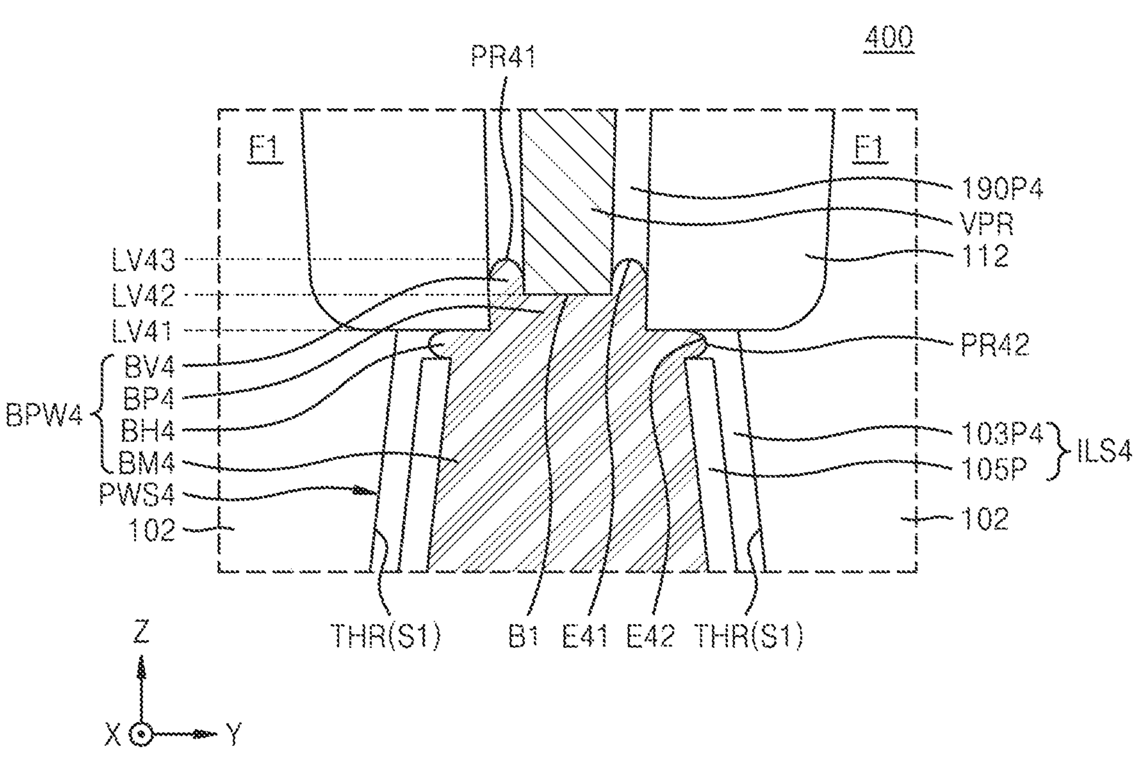
FIG. 6 is a cross-sectional view of an IC device according to embodiments of the present disclosure.

FIG. 6 is a cross-sectional view of an IC device 400 according to embodiments of the present disclosure. FIG. 6 illustrates an enlarged cross-sectional configuration of a portion corresponding to portion "EX1" of FIG. 3B in the IC device 400. In FIG. 6, the same reference numerals are used to denote the same elements as in FIGS. 2 to 5, and repeated descriptions thereof are omitted.

Referring to FIG. 6, the IC device 400 may substantially have the same configuration as the IC device 100 described with reference to FIGS. 2 and 3A to 3D. However, the IC device 400 may include a backside power structure PWS4.

The backside power structure PWS4 may substantially have the same configuration as the backside power structure PWS described with reference to FIGS. 3B to 3D. However, the backside power structure PWS4 may include a backside power rail BPW4 and an insulating liner structure ILS4 covering both sidewalls of the backside power rail BPW4.

A sidewall of a via power rail VPR may be surrounded by a via insulating spacer 190P4. The via insulating spacer 190P4 may substantially have the same configuration as the via insulating spacer 190P described with reference to FIGS. 3B to 3D. However, in a vertical direction (Z direction), a length of the via insulating spacer 190P4 may be less than a length of the via power rail VPR.

The insulating liner structure ILS4 may be in contact with a device isolation film 112 at a first vertical level LV41. The insulating liner structure ILS4 may include a first insulating liner 103P4 and a second insulating liner 105P. The first insulating liner 103P4 may be in contact with the device isolation film 112 at the first vertical level LV41. The second insulating liner 105P may be apart from the device isolation film 112 with the first insulating liner 103P4 therebetween. The insulating liner structure ILS4 may substantially be the same as the insulating liner structure ILS, as described above with reference to FIGS. 3B to 3D.

The backside power rail BPW4 may have a surface in contact with a bottom surface B1 of the via power rail VPR, a surface in contact with the insulating liner structure ILS4, a surface in contact with the via insulating spacer 190P4, and a surface in contact with the device isolation film 112. The backside power rail BPW4 may include a main rail BM4, a protrusion rail BP4, a vertical extension BV4, and a horizontal extension BH4. The main rail BM4 may extend through a substrate 102 and the insulating liner structure ILS4 in the vertical direction (Z direction). The protrusion rail BP4 may be integrally connected to the main rail BM4 and protrude from the main rail BM4 toward the via power rail VPR. The vertical extension BV4 may extend from the protrusion rail BP4 toward the via insulating spacer 190P4 in the vertical direction (Z direction). The horizontal extension BH4 may extend from the main rail BM4 in a second lateral direction (Y direction). The protrusion rail BP4 of the backside power rail BPW4 may be in a space defined by the device isolation film 112 in the second lateral direction (Y direction) and be in contact with the bottom surface B1 of the via power rail VPR. In the backside power rail BPW4, the vertical extension BV4 may be integrally connected to the protrusion rail BP4. The vertical extension BV4 of the backside power rail BPW4 may be between the sidewall of the via power rail VPR and at least a portion of the device isolation film 112. In the backside power rail BPW4, the horizontal extension BH4 may be integrally connected to the main rail BM4. The horizontal extension BH4 of the backside power rail BPW4 of may be between at least a portion of the device isolation film 112 and the second insulating liner 105P. The backside power rail BPW4 may substantially be the same as the backside power rail BPW, as described above with reference to FIGS. 3B to 3D.

The bottom surface B1 of the via power rail VPR may be at a second vertical level LV42, which is farther from the substrate 102 than the first vertical level LV41. The via insulating spacer 190P4 may have a bottom surface E41 at a third vertical level LV43, which is farther from the substrate 102 than the second vertical level LV42. As used herein, the bottom surface E41 of the via insulating spacer 190P4 may be referred to as a "second bottom surface." The vertical extension BV4 of the backside power rail BPW4 may be in contact with the bottom surface E41 of the via insulating spacer 190P4.

The bottom surface E41 of the via insulating spacer 190P4 may include a curved surface, which is in contact with the vertical extension BV4 of the backside power rail BPW4 and is concave toward the vertical extension BV4. The vertical extension BV4 of the backside power rail BPW4 may include a curved surface PR41, which is convex toward the bottom surface E41 of the via insulating spacer 190P4, correspond to a shape of the bottom surface E41 of the via insulating spacer 190P4.

The horizontal extension BH4 of the backside power rail BPW4 may include a curved surface PR42, which is convex toward the first insulating liner 103P4 included in the insulating liner structure ILS4. The first insulating liner 103P4 may have the bottom surface E41, which is concave toward the curved surface PR42, correspond to a shape of the curved surface PR42 of the horizontal extension BH4. The curved surface PR42 of the horizontal extension BH4 may be in contact with the bottom surface E41 of the first insulating liner 103P4.

Because the backside power rail BPW4 includes the vertical extension BV4, the backside power rail BPW4 may contact each of the bottom surface B1 of the via power rail VPR and the sidewall of the via power rail VPR. By controlling a length of the vertical extension BV4 in the vertical direction (Z direction) as desired during the process of manufacturing the IC device 300, a degree of freedom by which a shape of the backside power rail BPW3 may be controlled may improve. Accordingly, a contact area between the backside power rail BPW4 and the via power rail VPR may increase, and contact resistance between the backside power rail BPW4 and the via power rail VPR may be reduced. In addition, the backside power rail BPW4 may include the horizontal extension BH4, and the horizontal extension BH4 may be between at least a portion of the device isolation film 112 and the second insulating liner 105P. Thus, during the process of manufacturing the IC device 400, physical deformation, such as separation of the backside power rail BPW4 from the through region THR of the substrate 102 and separation of the backside power rail BPW4 from contact surfaces of the via power rail VPR, may be prevented. Accordingly, a contact state between the backside power rail BPW4 and the via power rail VPR may be physically reinforced. Therefore, the reliability of the IC device 400 may be improved.

Figure 7:
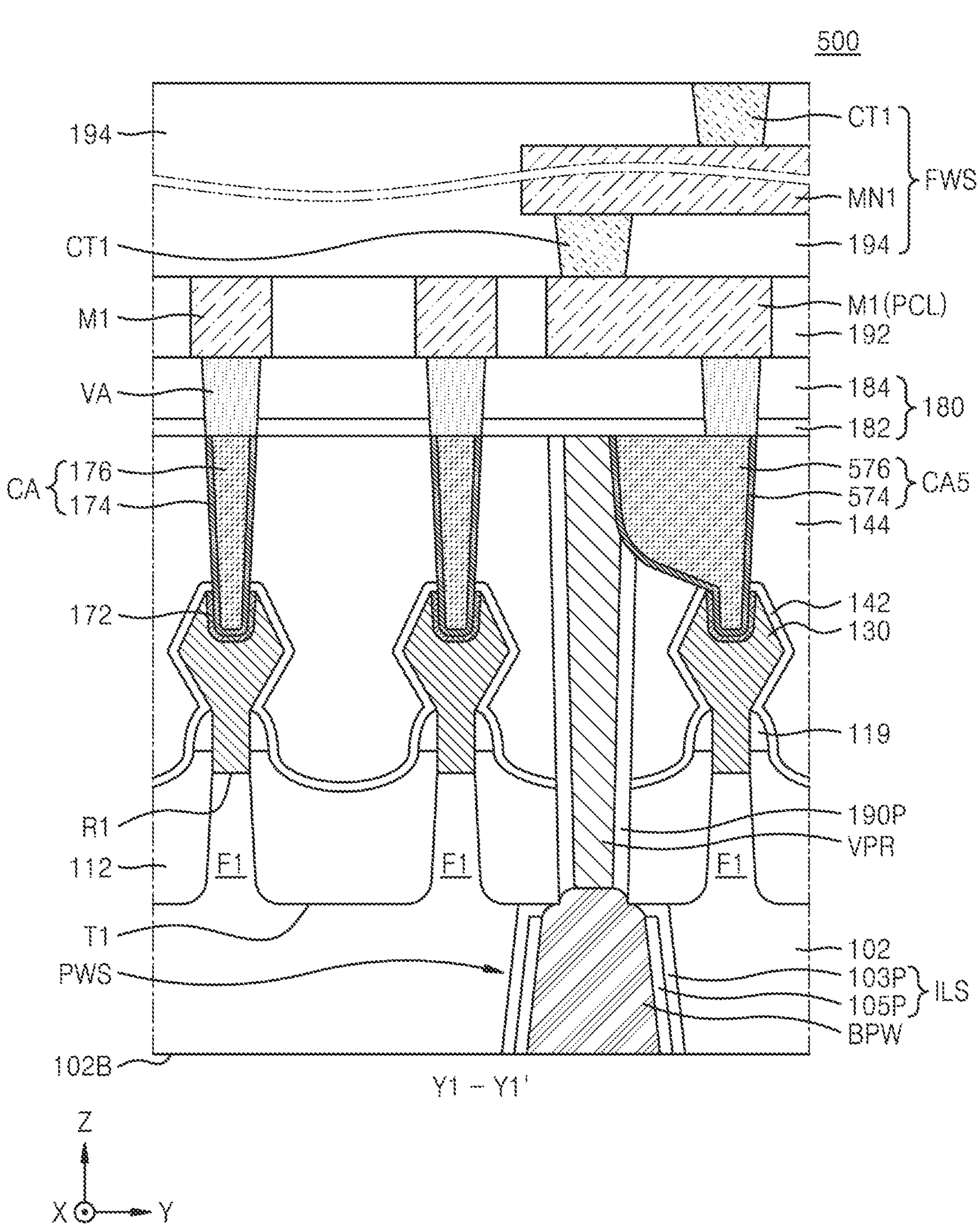
FIG. 7 is a cross-sectional view of an IC device according to embodiments of the present disclosure.

FIG. 7 is a cross-sectional view of an IC device 500 according to embodiments of the present disclosure. FIG. 7 illustrates a cross-sectional configuration of a portion corresponding to a cross-section taken along line Y1-Y1' of FIG. 2, in the IC device 500. In FIG. 7, the same reference numerals are used to denote the same elements as in FIGS. 2 and 3A to 3D, and repeated descriptions thereof are omitted here.

Referring to FIG. 7, the IC device 500 may substantially have the same configuration as the IC device 100 described with reference to FIGS. 2 and 3A to 3D. However, in the IC device 500, a source/drain contact CA5 may be on a source/drain region 130 connected to a via power rail VPR, from among a plurality of source/drain regions 130. The source/drain contact CA5 may be connected between the source/drain region 130 and the via power rail VPR, and thus, the source/drain region 130 and the via power rail VPR may be electrically connected to each other. The source/drain contact CA5 may have a greater width in a second lateral direction (Y direction) than the source/drain contact CA on another source/drain region 130 that is not connected to the via power rail VPR.

The source/drain contact CA5 may include a conductive barrier pattern 574 and a contact plug 576, which are sequentially stacked on the source/drain region 130. The conductive barrier pattern 574 may include a portion in contact with a metal silicide film 172 and a portion in contact with the via power rail VPR. Details of the conductive barrier pattern 574 and the contact plug 576 may substantially be the same as those of the conductive barrier pattern 174 and the contact plug 176, respectively, which have been described with reference to FIGS. 3A and 3B.

One of the plurality of source/drain via contacts VA may be connected between the source/drain contact CA5 and a power connection conductive layer PCL, and thus, the source/drain contact CA5 may be electrically connected to a front-side wiring structure FWS located over a plurality of upper wiring layers M1.

Figure 8:
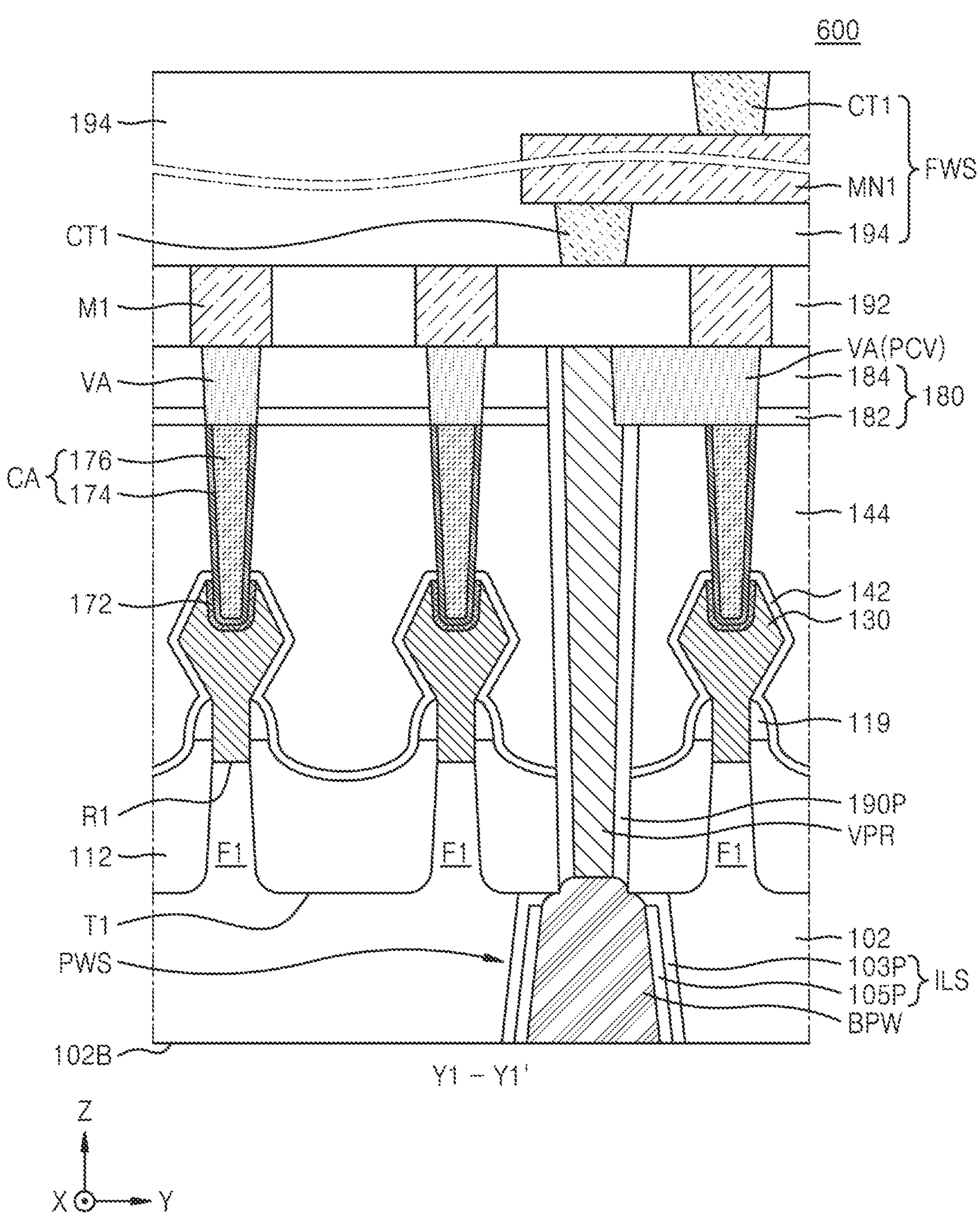
FIG. 8 is a cross-sectional view of an IC device according to embodiments of the present disclosure.

FIG. 8 is a cross-sectional view of an IC device 600 according to embodiments of the present disclosure. FIG. 8 illustrates a cross-sectional configuration of a portion corresponding to a cross-section taken along line Y1-Y1' of FIG. 2, in the IC device 600. In FIG. 8, the same reference numerals are used to denote the same elements as in FIGS. 2 and 3A to 3D, and repeated descriptions thereof are omitted here.

Referring to FIG. 8, the IC device 600 may substantially have the same configuration as the IC device 100 described with reference to FIGS. 2 and 3A to 3D. However, in the IC device 600, a plurality of source/drain via contacts VA may include a power connection via PCV connected to a via power rail VPR.

A source/drain contact CA and the power connection via PCV may be sequentially stacked on a source/drain region 130 connected to the via power rail VPR. The source/drain contact CA on the source/drain region 130 connected to the via power rail VPR may substantially have the same configuration as the source/drain contact CA on the source/drain region 130 that is not connected to the via power rail VPR. The power connection via PCV may have a greater width in a second lateral direction (Y direction) than another source/drain via contact VA, which is not connected to the via power rail VPR. The power connection via PCV may be at the same vertical level as the other source/drain via contact VA, which is not connected to the via power rail VPR, and include the same material as the other source/drain via contact VA.

The power connection via PCV may be connected between the source/drain contact CA on the source/drain region 130 connected to the via power rail VPR and the via power rail VPR, and thus, the source/drain region 130 may be electrically connected to the via power rail VPR through the source/drain contact CA and the power connection via PCV.

The power connection via PCV may be connected to a selected one of a plurality of upper wiring layers M1 and be electrically connected to a front-side wiring structure FWS, which is on the plurality of upper wiring layers M1, through the upper wiring layer M1.

Similar to the IC device 100 described with reference to FIGS. 2 and 3A to 3D, in the IC devices 500 and 600 described with reference to FIGS. 7 and 8, while an etching process that is employed to form the backside power rail BPW is being performed during the processes of manufacturing the IC devices 500 and 600, structural damage or degradation to the via power rail VPR may be prevented due to an etching process atmosphere. In addition, a degree of freedom by which a shape of the backside power rail BPW may be controlled may be improved, and thus, a contact area between the backside power rail BPW and the via power rail VPR may increase, and contact resistance between the backside power rail BPW and the via power rail VPR may be reduced. Furthermore, leakage current between a substrate 102 and the backside power rail BPW may be inhibited due to an insulating liner structure ILS including a plurality of insulating liners including different materials from each other. Accordingly, the reliability of the IC devices 500 and 600 may be improved.

Next, example methods of manufacturing an IC device, according to embodiments, are described.

FIGS. 9 to 25 are cross-sectional views of a process sequence of a method of manufacturing an IC device, according to embodiments. FIGS. 9 to 11, 12B, 13, 14B, 18B to 20B, and 21 to 25 are cross-sectional views of example cross-sectional structures of a portion corresponding to a cross-section taken along line Y1-Y1' of FIG. 2, according to a process sequence. FIGS. 12A, 14A, 15 to 17, and 18A to 20A are cross-sectional views of example cross-sectional structures of a portion corresponding to a cross-section taken along line X1-X1' of FIG. 2, according to a process sequence. FIGS. 12C, 14C, and 18C to 20C are cross-sectional views of example cross-sectional structures of a portion corresponding to a cross-section taken along line Y2-Y2' of FIG. 2, according to a process sequence. An example of a method of manufacturing the IC device 100 shown in FIGS. 2 and 3A to 3D will be described with reference to FIGS. 9 to 25. In FIGS. 9 to 25, the same reference numerals are used to denote the same elements as in FIGS. 2 and 3A to 3D, and repeated descriptions thereof are omitted here.

Figure 9:
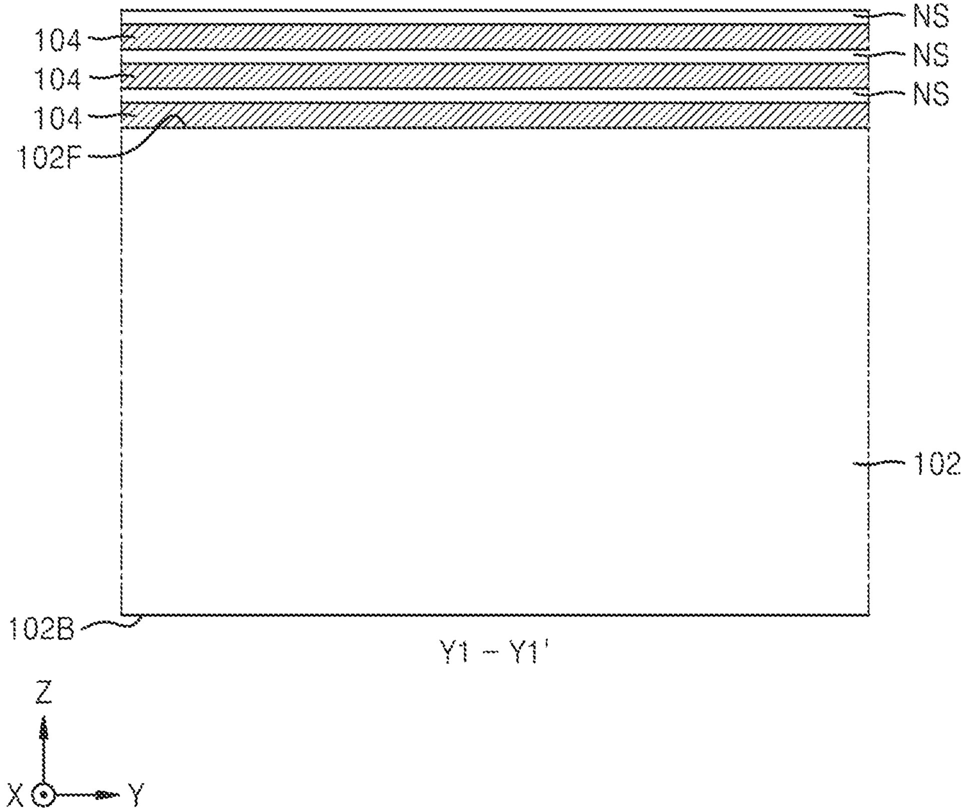
FIGS. 9, 10, 11, 12B, 13, 14B, 18B, 19B, 20B, 21, 22, 23, 24, and 25 are cross-sectional views of example cross-sectional structures of a portion corresponding to a cross-section taken along line Y1-Y1' of FIG. 2 according to a process sequence of a method of manufacturing an IC device according to embodiments of the present disclosure.

Referring to FIG. 9, a substrate 102 may be prepared, and a plurality of sacrificial semiconductor layers 104 and a plurality of nanosheet semiconductor layers NS may be alternately stacked one-by-one on a front-side surface 102F of the substrate 102.

The plurality of sacrificial semiconductor layers 104 and the plurality of nanosheet semiconductor layers NS may include semiconductor materials having different etch selectivities from each other. In embodiments, the plurality of nanosheet semiconductor layers NS may include a Si layer, and the plurality of sacrificial semiconductor layers 104 may include a SiGe layer. In embodiments, the plurality of sacrificial semiconductor layers 104 may have a constant Ge content. The SiGe layer included in the plurality of sacrificial semiconductor layers 104 may have a constant Ge content, which is selected in a range of about 5 at % to about 60 at %, including endpoints, and as a more specific example, about 10 at % to about 40 at %, including endpoints. The Ge concentration of the SiGe layer included in the plurality of sacrificial semiconductor layers 104 may vary in other embodiments.

Figure 10:
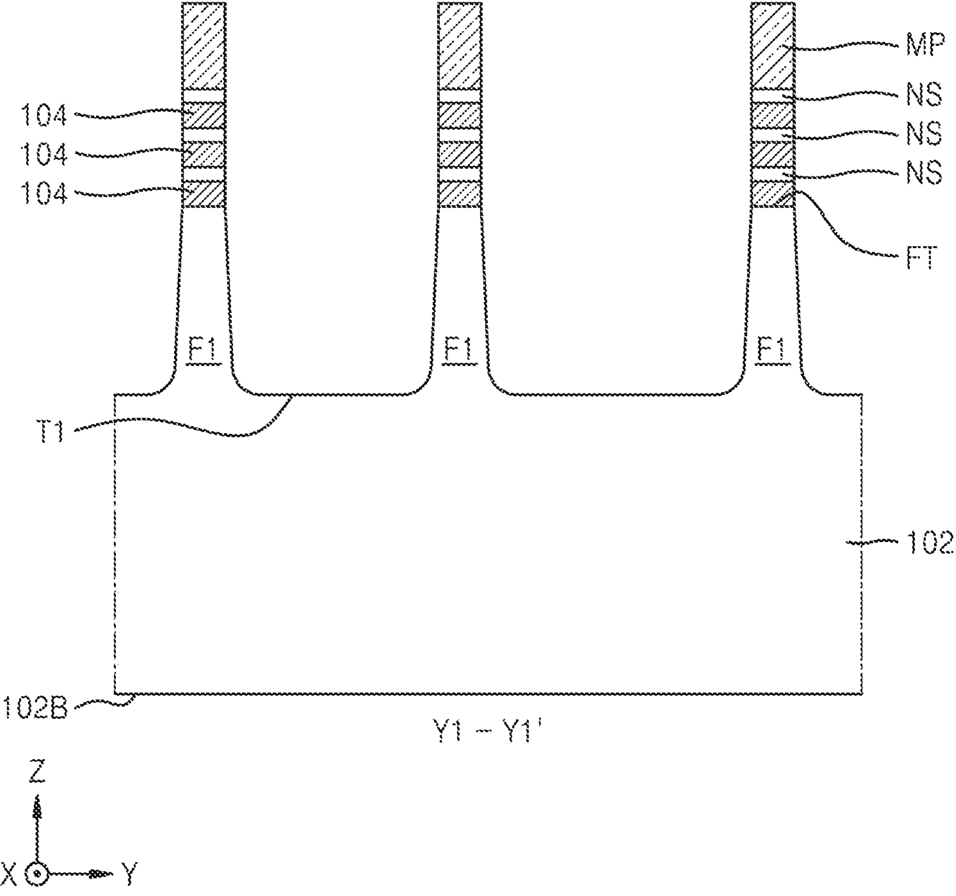

Referring to FIG. 10, a mask pattern MP may be formed on the resultant structure of FIG. 9. Thereafter, the plurality of sacrificial semiconductor layers 104, the plurality of nanosheet semiconductor layers NS, and the substrate 102 may be partially etched by using the mask pattern MP as an etch mask, and thus, a plurality of fin-type active regions F1 may be formed on the substrate 102. A plurality of trench regions T1 may be defined by the plurality of fin-type active regions F1 on the substrate 102. In embodiments, the mask pattern MP may have a stack structure of a silicon oxide film pattern and a silicon nitride film pattern. The mask pattern MP may extend parallel to each other in a first lateral direction (X direction) on the substrate 102. A stack structure of the plurality of sacrificial semiconductor layers 104 and the plurality of nanosheet semiconductor layers NS may remain on a fin top surface FT of each of the plurality of fin-type active regions F1.

Figure 11:
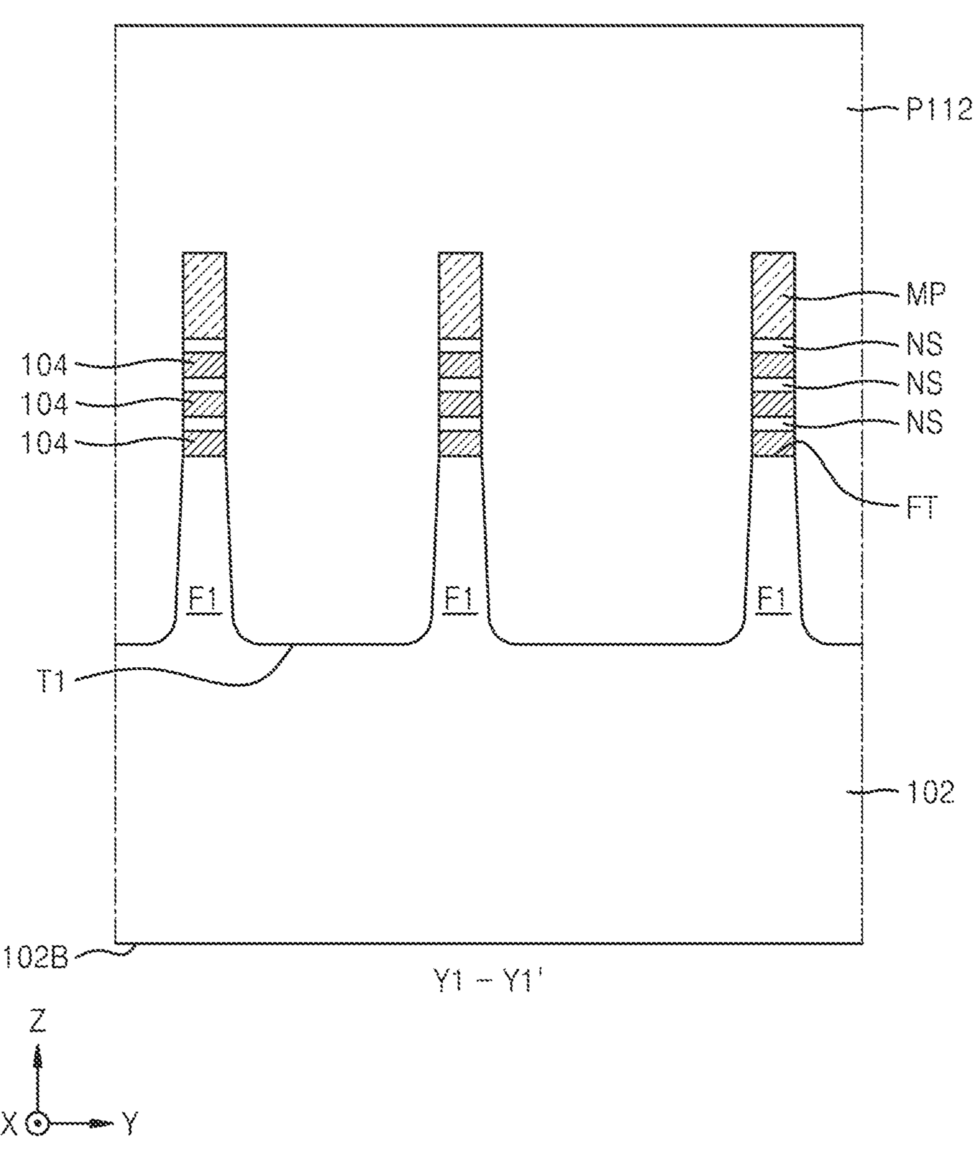

Referring to FIG. 11, a device isolation insulating film P112 may be formed on the resultant structure of FIG. 10. The device isolation insulating film P112 may be formed to have a sufficient thickness to fill the plurality of trench regions T1. In embodiments, the device isolation insulating film P112 may include a silicon oxide film, without being limited thereto.

The device isolation insulating film P112 may be formed by using a plasma-enhanced chemical vapor deposition (PECVD) process, a high density plasma (HDP) CVD process, an inductively coupled plasma (ICP) CVD process, a capacitor coupled plasma (CCP) CVD process, a flowable CVD (FCVD) process, or a spin coating process.

Figure 12A:
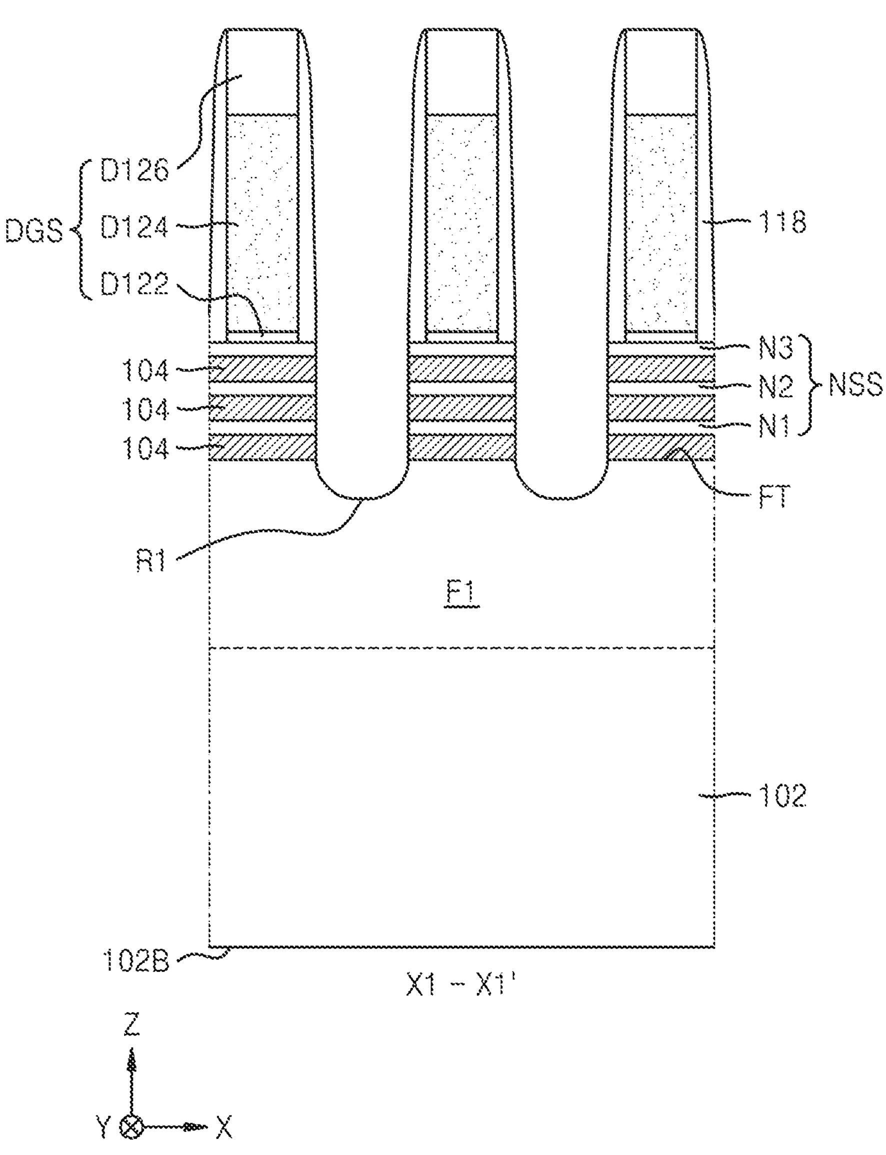
FIGS. 12A, 14A, 15, 16, 17, 18A, 19A, and 20A are cross-sectional views of example cross-sectional structures of a portion corresponding to a cross-section taken along line X1-X1' of FIG. 2 according to a process sequence of a method of manufacturing an IC device according to embodiments of the present disclosure.
Figure 12B:
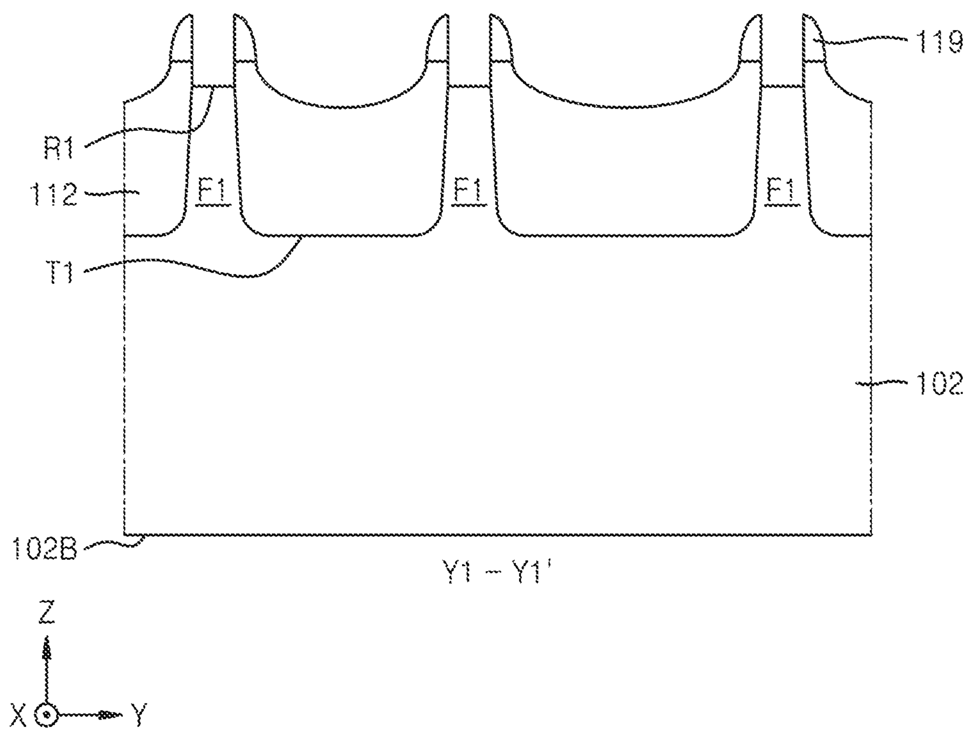
Figure 12C:
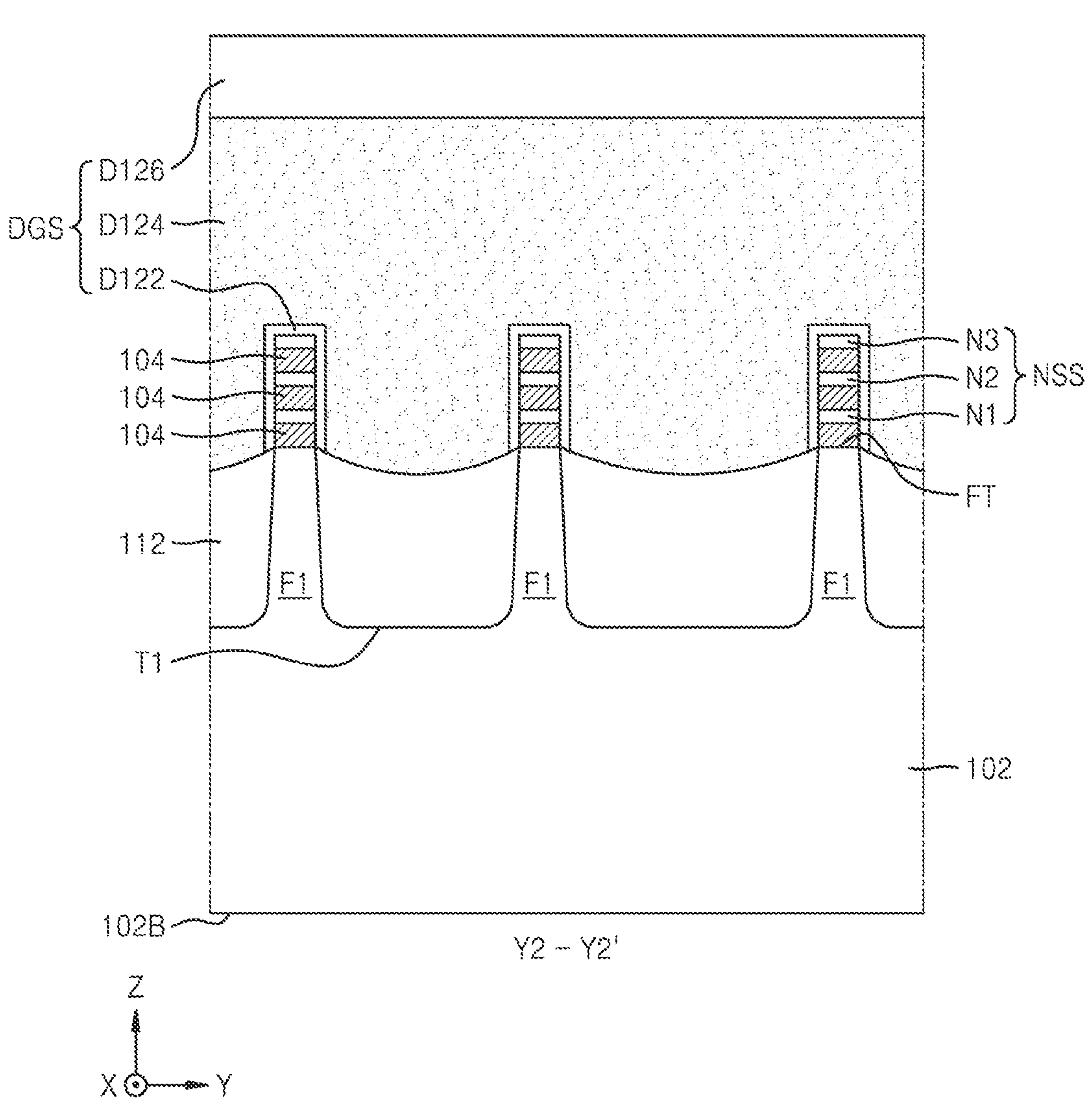
FIGS. 12C, 14C, 18C, 19C, and 20C are cross-sectional views of example cross-sectional structures of a portion corresponding to a cross-section taken along line Y2-Y2' of FIG. 2, according to a process sequence of a method of manufacturing an IC device according to embodiments of the present disclosure.

Referring to FIGS. 12A, 12B, and 12C, the resultant structure of FIG. 11 may be planarized to expose a top surface of the mask pattern MP. Thereafter, the mask pattern MP, which is exposed, may be removed, and a recess process for removing a portion of the device isolation insulating film P112 may be performed. Thus, a device isolation film 112 including the device isolation insulating film P112 may be formed. As a result, the plurality of sacrificial semiconductor layers 104 and the plurality of nanosheet semiconductor layers (refer to NS in FIG. 11) may protrude over a top surface of the device isolation film 112.

The device isolation insulating film P112 may be recessed by using a dry etching process, a wet etching process, or a combination thereof. In this case, a wet etching process using $NH_4OH$, tetramethyl ammonium hydroxide (TMAH), or potassium hydroxide (KOH) as an etchant or a dry etching process, such as an inductively coupled plasma (ICP) process, a transformer coupled plasma (TCP) process, an electron cyclotron resonance (ECR) process, or a reactive ion etch (RIE) process, may be employed. When the device isolation insulating film P112 is recessed by using a dry etching process, a fluorine-containing gas (e.g., $CF_4$), a chlorine-containing gas ($Cl_2$), or hydrogen bromide (HBr) may be used as an etch gas.

Thereafter, a plurality of dummy gate structures DGS may be formed on the stack structures of the plurality of sacrificial semiconductor layers 104 and the plurality of nanosheet semiconductor layers NS. Each of the plurality of dummy gate structures DGS may be formed to extend long in the second lateral direction (Y direction). Each of the plurality of dummy gate structures DGS may have a structure in which an oxide film D122, a dummy gate layer D124, and a capping layer D126 are sequentially stacked. In embodiments, the oxide film D122 may be a film obtained by oxidizing the surface of each of the plurality of sacrificial semiconductor layers 104 and the plurality of nanosheet semiconductor layers (refer to NS in FIG. 16). The dummy gate layer D124 may include polysilicon, and the capping layer D126 may include a silicon nitride film.

A plurality of outer insulating spacers 118 may be formed to cover both sidewalls of each of the plurality of dummy gate structures DGS. Thereafter, a portion of each of the plurality of sacrificial semiconductor layers 104 and the plurality of nanosheet semiconductor layers NS and a portion of the fin-type active region F1 may be etched by using the plurality of dummy gate structures DGS and the plurality of outer insulating spacers 118 as etch masks. Thus, the plurality of nanosheet semiconductor layers NS may be divided into a plurality of nanosheet stacks NSS, each of which includes a first nanosheet N1, a second nanosheet N2, and a third nanosheet N3, and a plurality of recesses R1 may be formed in an upper portion of the fin-type active region F1. To form the plurality of recesses R1, an etching process may be performed by using a dry etching process, a wet etching process, or a combination thereof. After the plurality of recesses R1 are formed, a plurality of recess-side insulating spacers 119 may be formed adjacent to the plurality of recesses R1 on the device isolation film 112 on both sides of each of the fin-type active region F1.

Figure 13:
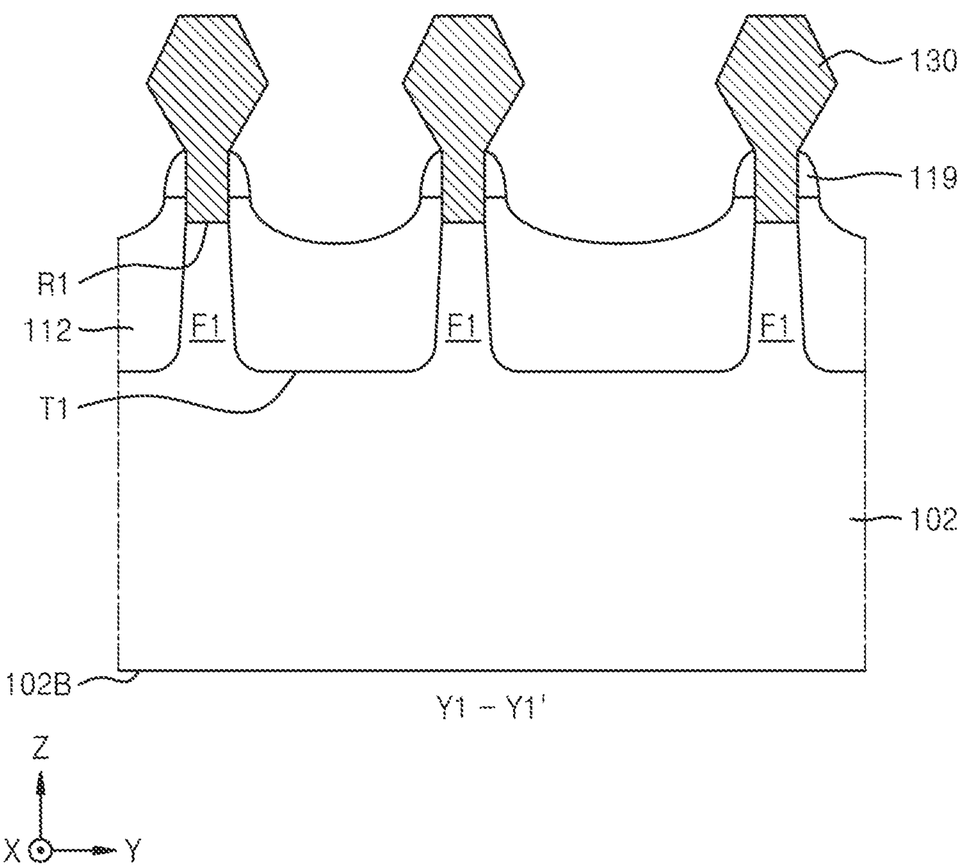

Referring to FIG. 13, in the resultant structure of FIGS. 12A, 12B, and 12C, a plurality of source/drain regions 130 may be formed to fill the plurality of recesses R1.

To form the plurality of source/drain regions 130, a semiconductor material may be epitaxially grown from a surface of the fin-type active region FA, which is exposed at a bottom surface of each of the plurality of recesses R1, and a sidewall of each of the first to third nanosheets N1, N2, and N3 included in the nanosheet stack NSS.

Figure 14A:
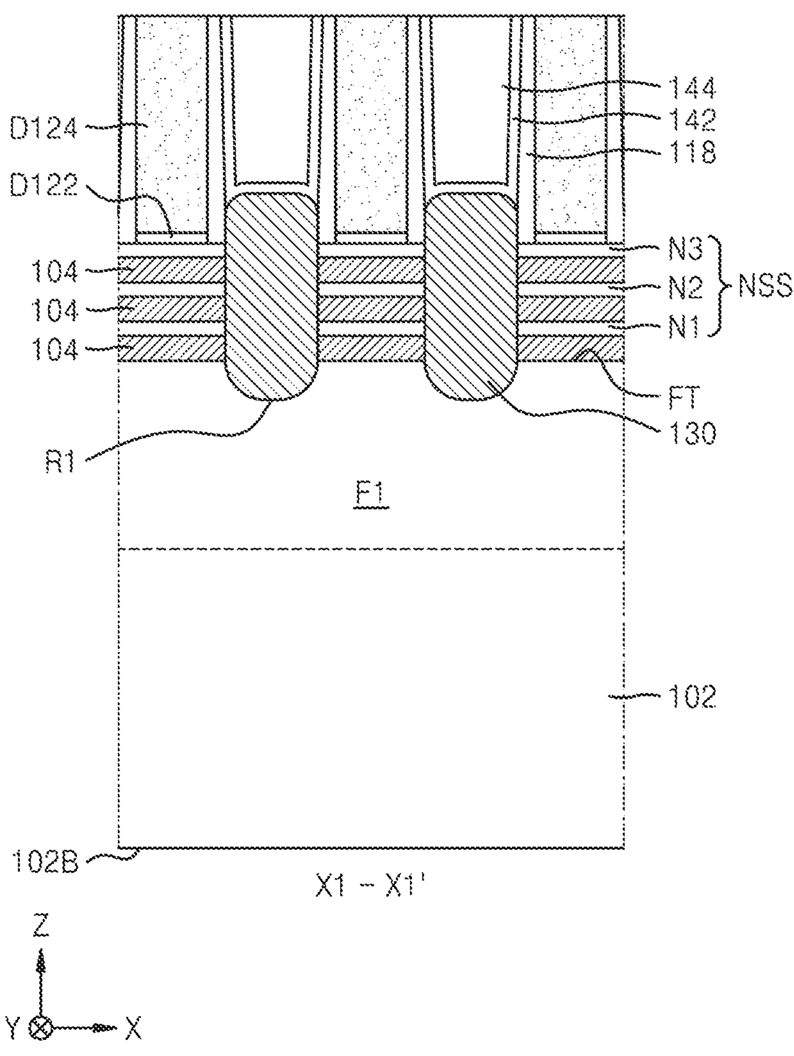
Figure 14B:
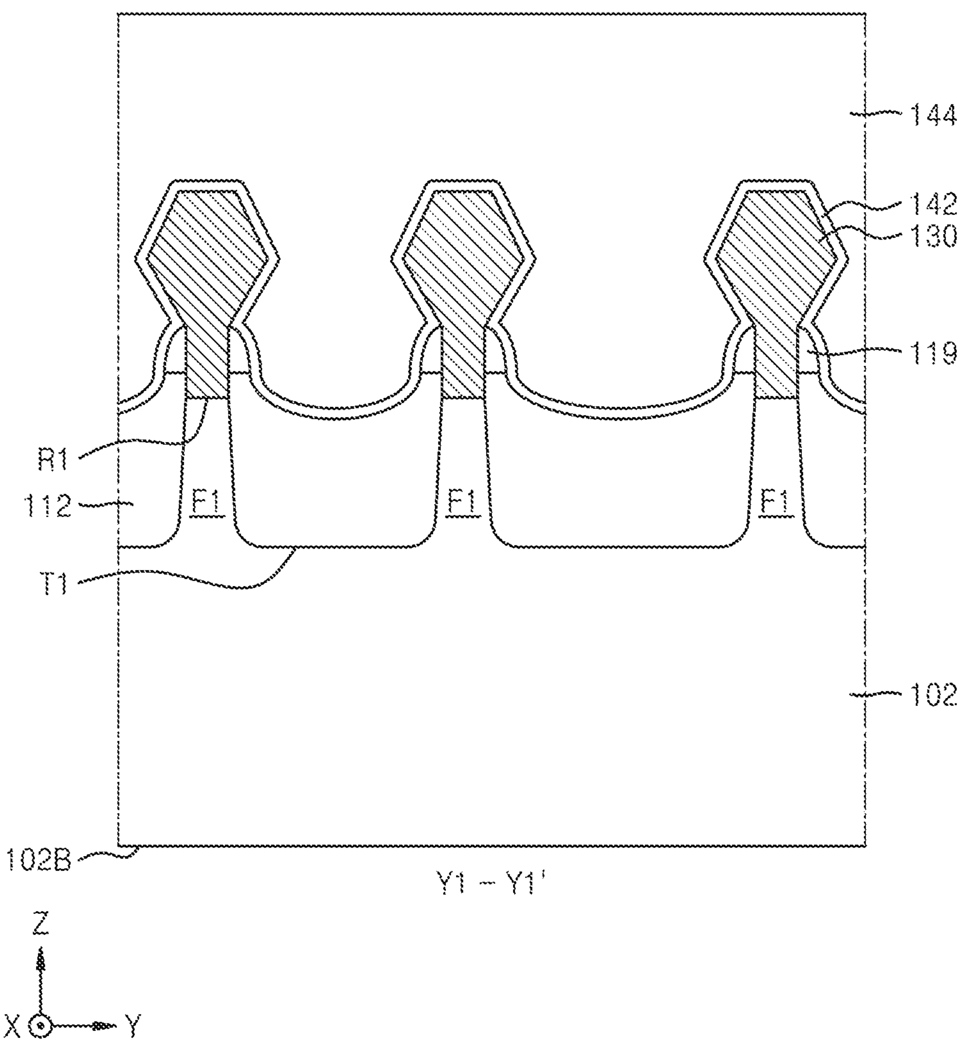
Figure 14C:
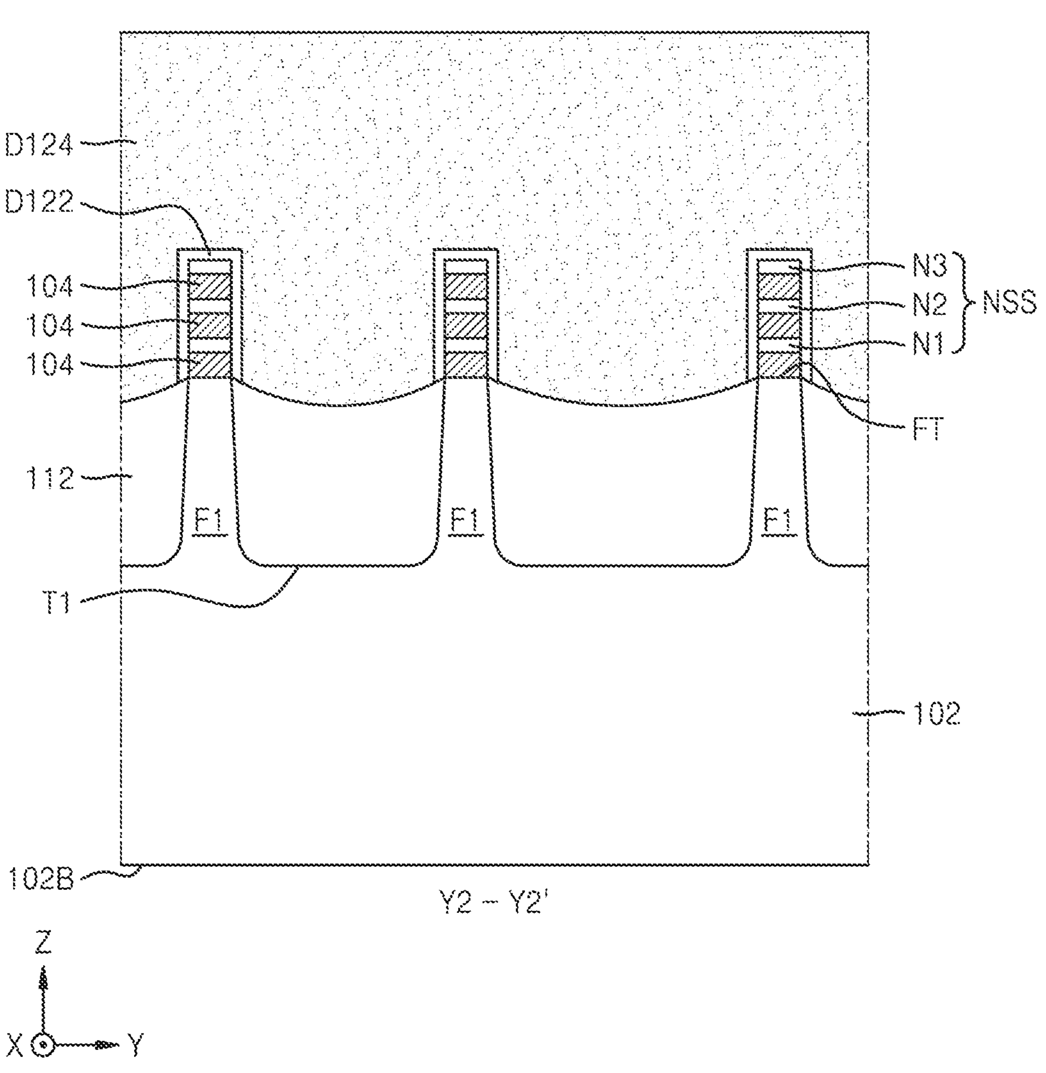

Referring to FIGS. 14A, 14B, and 14C, an insulating liner 142 may be formed to cover the resultant structure of FIG. 13, and an inter-gate dielectric film 144 may be formed on the insulating liner 142. Thereafter, a portion of each of the insulating liner 142 and the inter-gate dielectric film 144 may be etched to expose top surfaces of a plurality of capping layers D126. Thereafter, the dummy gate layer D124 may be exposed by removing the plurality of capping layers D126, and the insulating liner 142 and the inter-gate dielectric film 144 may be partially removed such that a top surface of the inter-gate dielectric film 144 and a top surface of the dummy gate layer D124 substantially are at the same level as each other.

Figure 15:
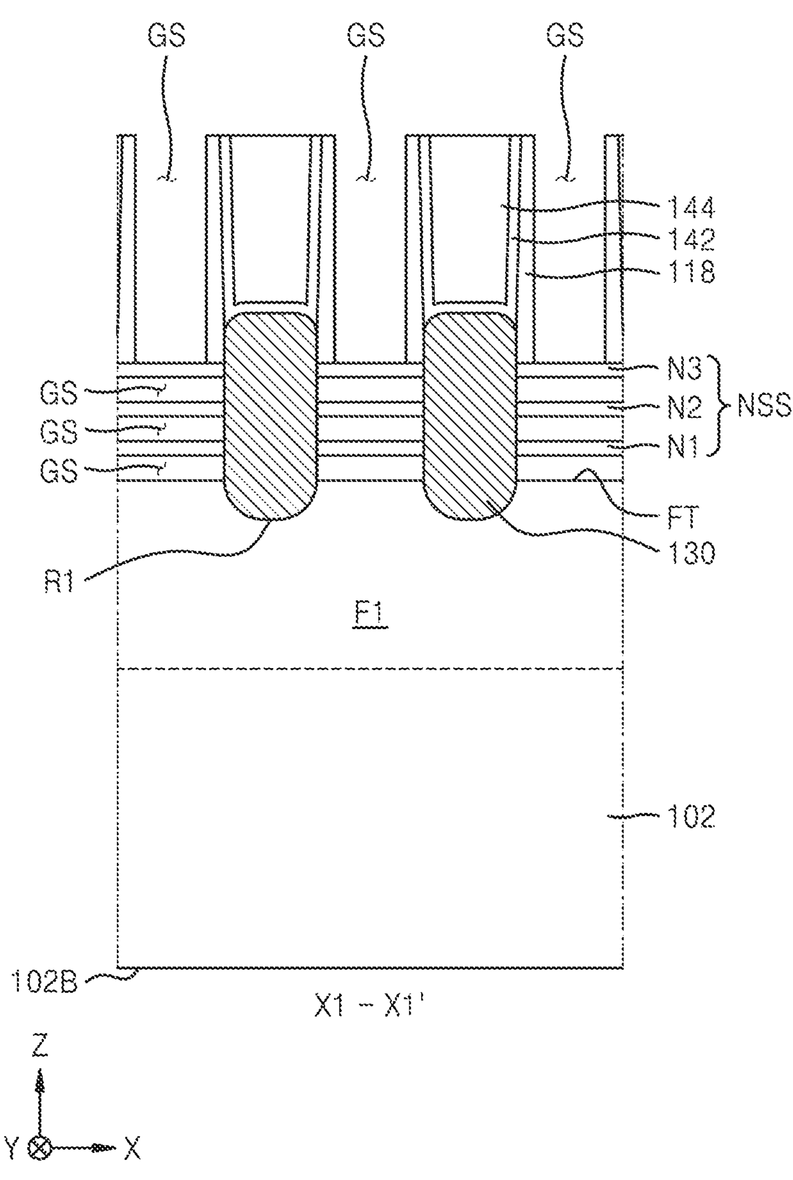

Referring to FIG. 15, a gate space GS may be prepared by removing the dummy gate layer D124 and the oxide film D122 located thereunder from the resultant structure of FIGS. 14A, 14B, and 14C, and the plurality of nanosheet stacks NSS may be exposed through the gate space GS. Afterwards, the plurality of sacrificial semiconductor layers 104 remaining on the fin-type active region FA may be removed through the gate space GS, and thus, the gate space GS may extend to respective spaces between the first to third nanosheets N1, N2, and N3 and a space between the first nanosheet N1 and the fin top surface FT of the fin-type active region FA. In embodiments, to selectively remove the plurality of sacrificial semiconductor layers 104, etch selectivities of the first to third nanosheets N1, N2, and N3 with respect to the plurality of sacrificial semiconductor layers 104 may be used.

A liquid or gaseous etchant may be used to selectively remove the plurality of sacrificial semiconductor layers 104. In embodiments, to selectively remove the plurality of sacrificial semiconductor layers 104, a $CH_3COOH$-based etchant, for example, an etchant including a mixture of $CH_3COOH$, $HNO_3$, and HF or an etchant including a mixture of $CH_3COOH$, $H_2O_2$, and HF may be used, without being limited thereto.

Figure 16:
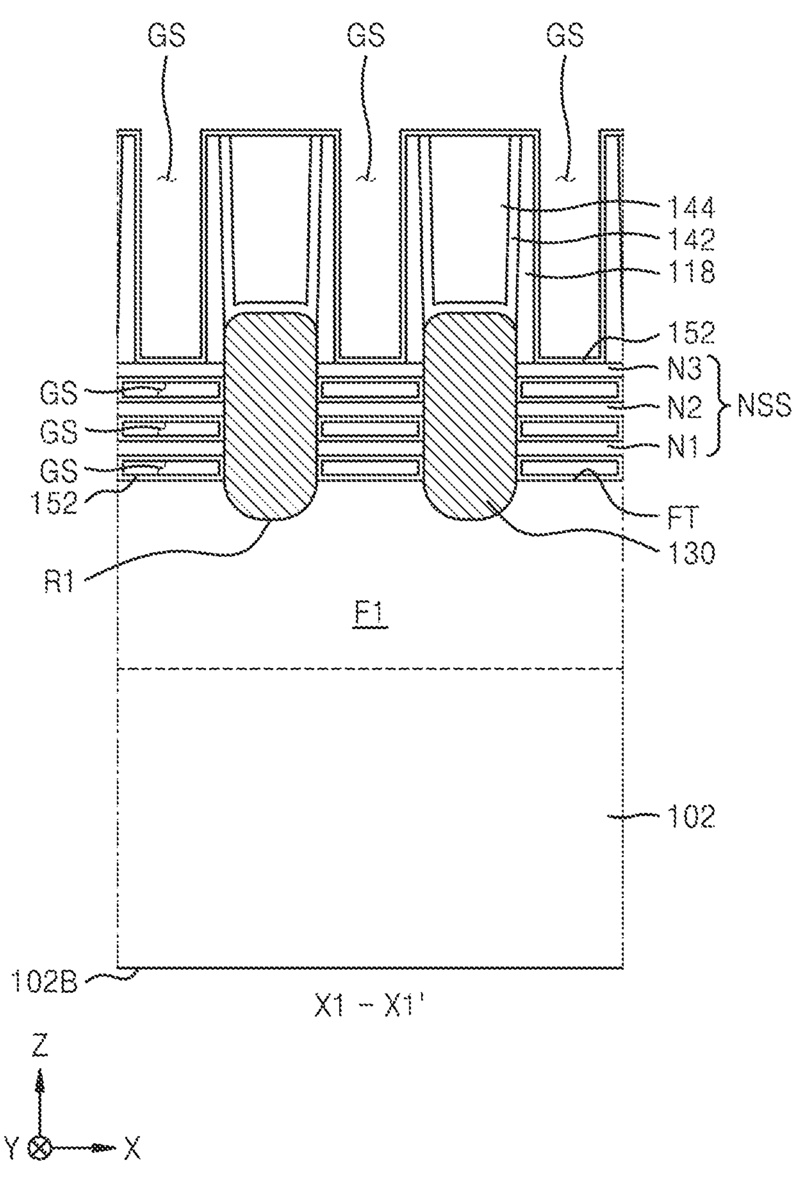

Referring to FIG. 16, in the resultant structure of FIG. 15, a gate dielectric film 152 may be formed to cover respective exposed surfaces of the first to third nanosheets N1, N2, and N3 and the fin-type active region FA. The gate dielectric film 152 may be formed by using an atomic layer deposition (ALD) process.

Figure 17:
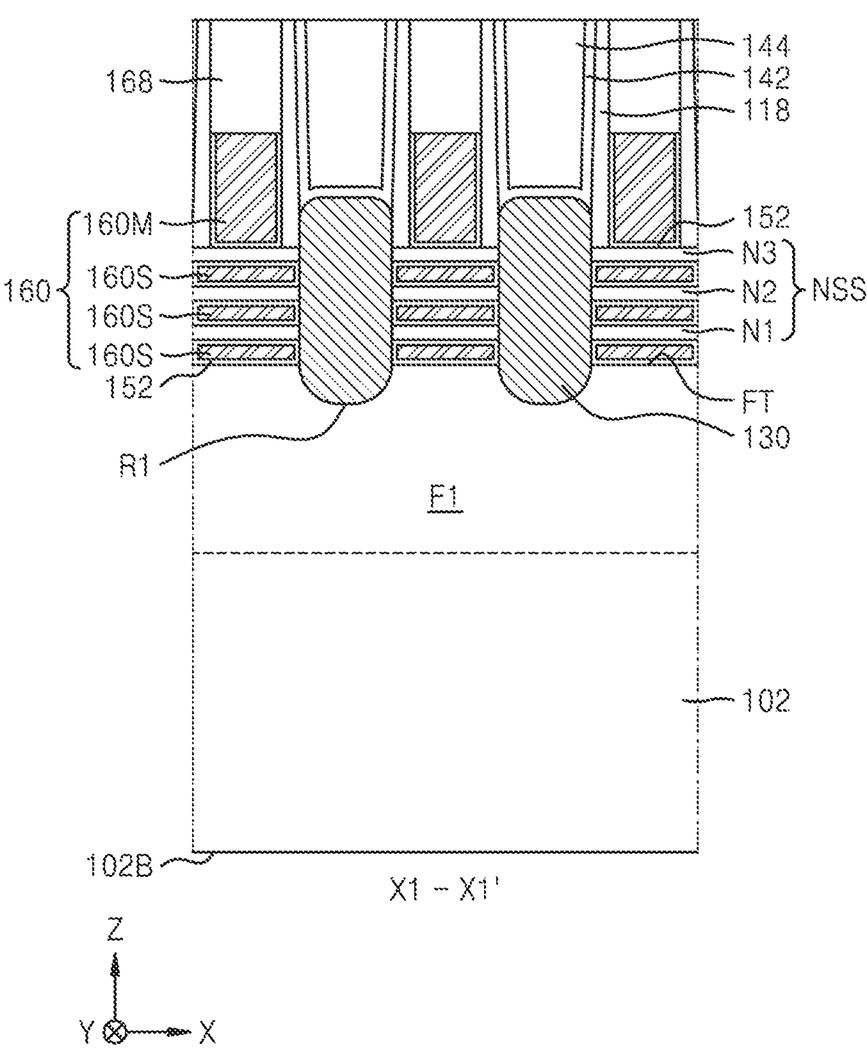

Referring to FIG. 17, a gate line 160 and a capping insulating pattern 168 may be formed. The gate line 160 may fill the gate space (refer to GS in FIG. 21) and cover the top surface of the inter-gate dielectric film 144 on the gate dielectric film 152. The capping insulating pattern 168 may cover a top surface of each of the gate line 160 and the gate dielectric film 152 in the gate space GS.

Figure 18A:
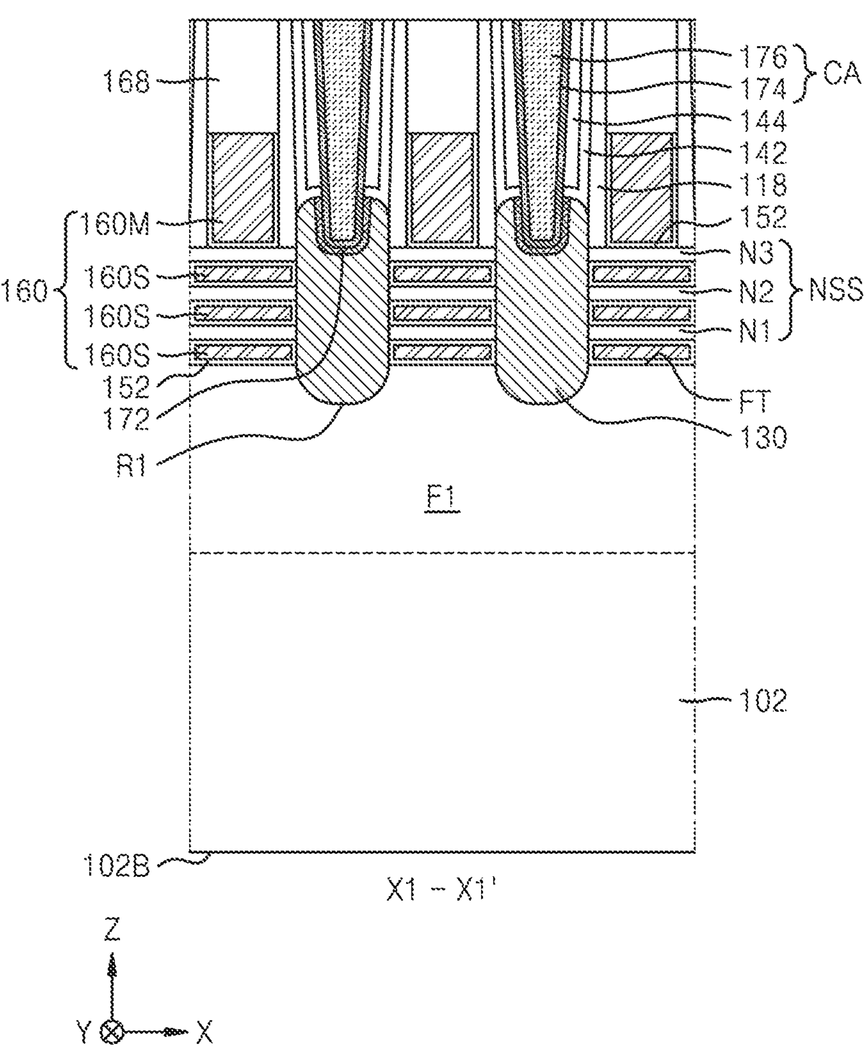
Figure 18B:
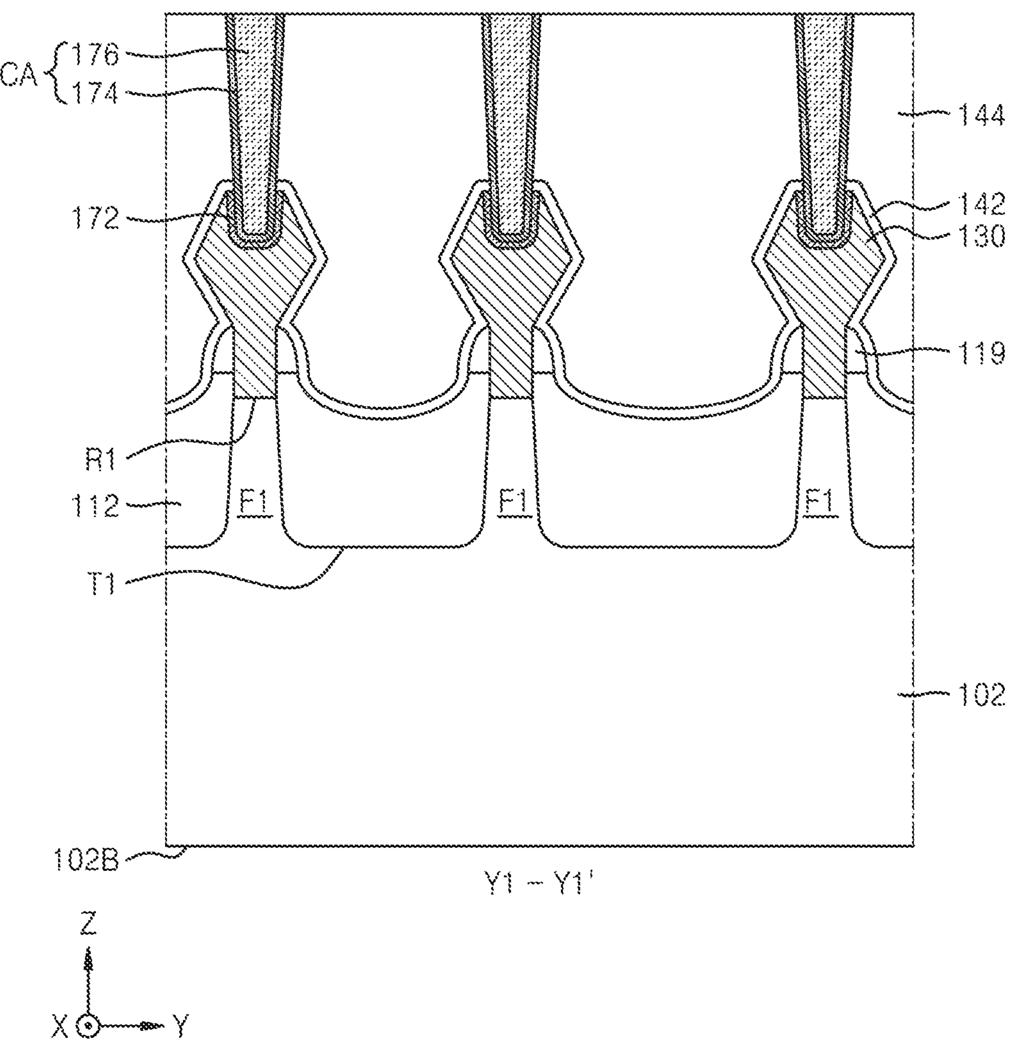
Figure 18C:
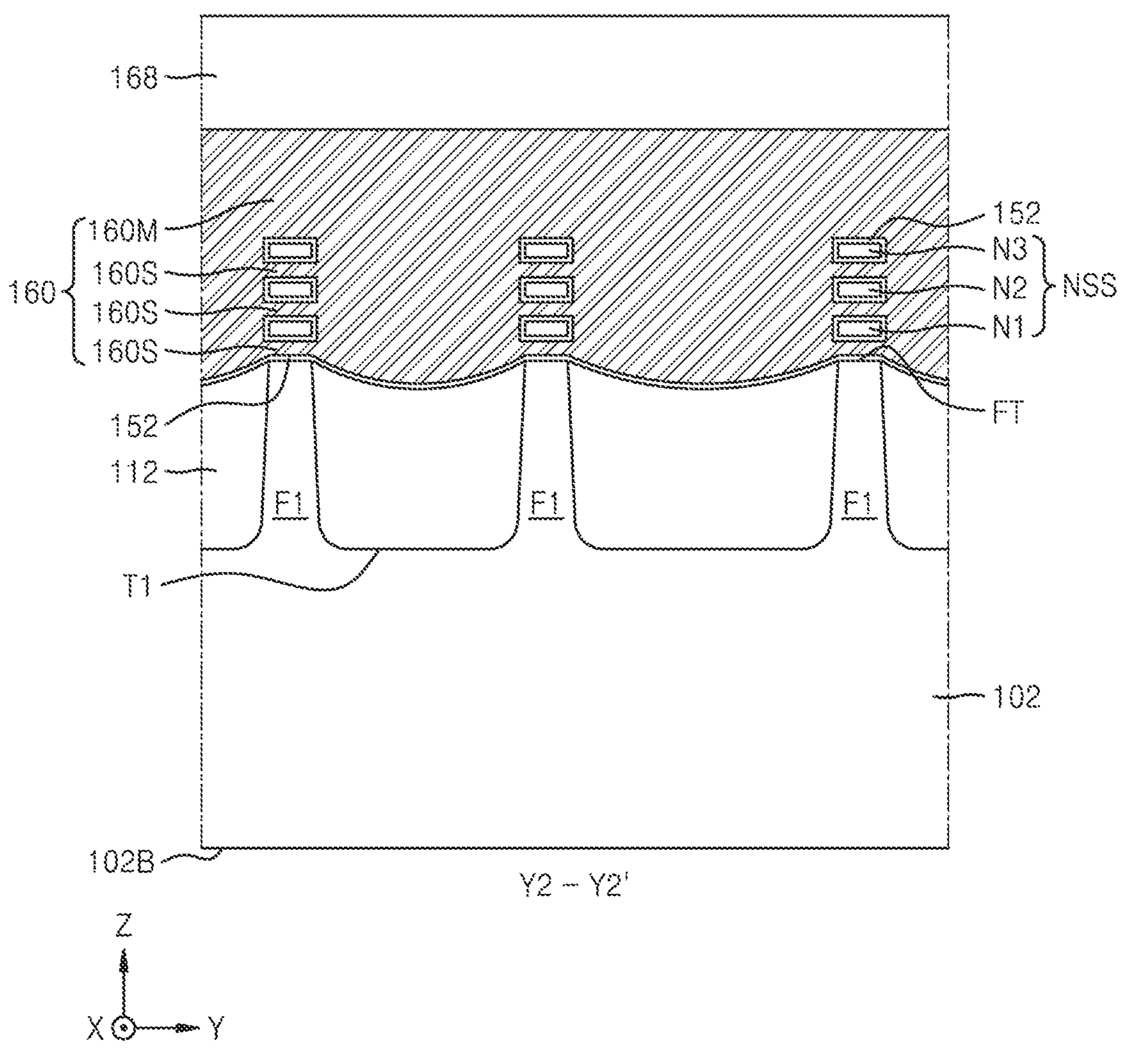

Referring to FIGS. 18A, 18B, and 18C, in the resultant structure of FIG. 17, a source/drain contact hole exposing the source/drain region 130 may be formed to extend through the insulating structure including the insulating liner 142 and the inter-gate dielectric film 144. Thereafter, a partial region of the source/drain region 130 may be removed by using an anisotropic etching process through the source/drain contact hole, and thus, the source/drain contact hole may extend in a longer manner toward the substrate 102. Afterwards, a metal silicide film 172 may be formed on the source/drain region 130 exposed at a bottom side of the source/drain contact hole. In embodiments, the formation of the metal silicide film 172 may include forming a metal liner (not shown) conformally covering the exposed surface of the source/drain region 130 and annealing the metal liner to induce a reaction of the source/drain region 130 with a metal included in the metal liner. After the metal silicide film 172 is formed, the remaining portion of the metal liner may be removed. A portion of the source/drain region 130 may be consumed during the formation of the metal silicide film 172. In embodiments, when the metal silicide film 172 includes a titanium silicide film, the metal liner may include a titanium (Ti) film. Thereafter, a source/drain contact CA including a conductive barrier pattern 174 and a contact plug 176 may be formed on the metal silicide film 172.

Figure 19A:
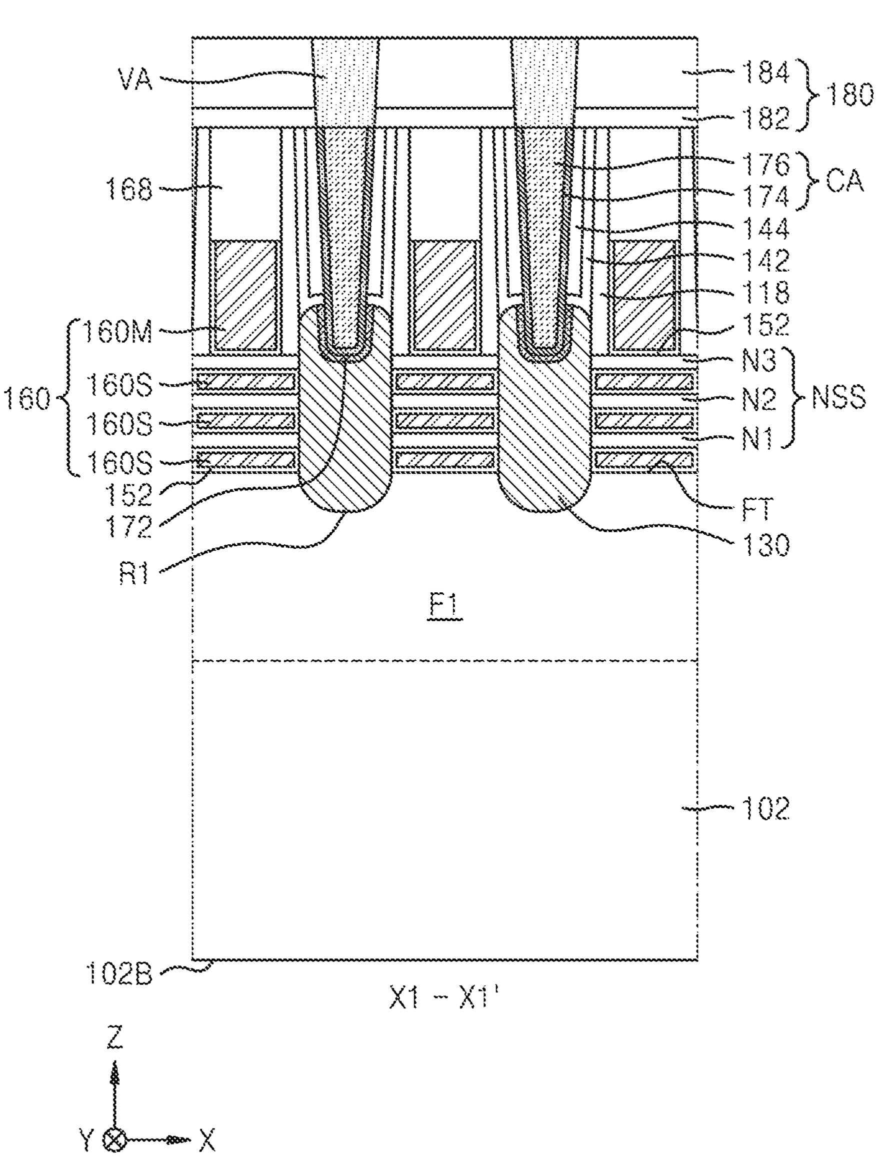
Figure 19B:
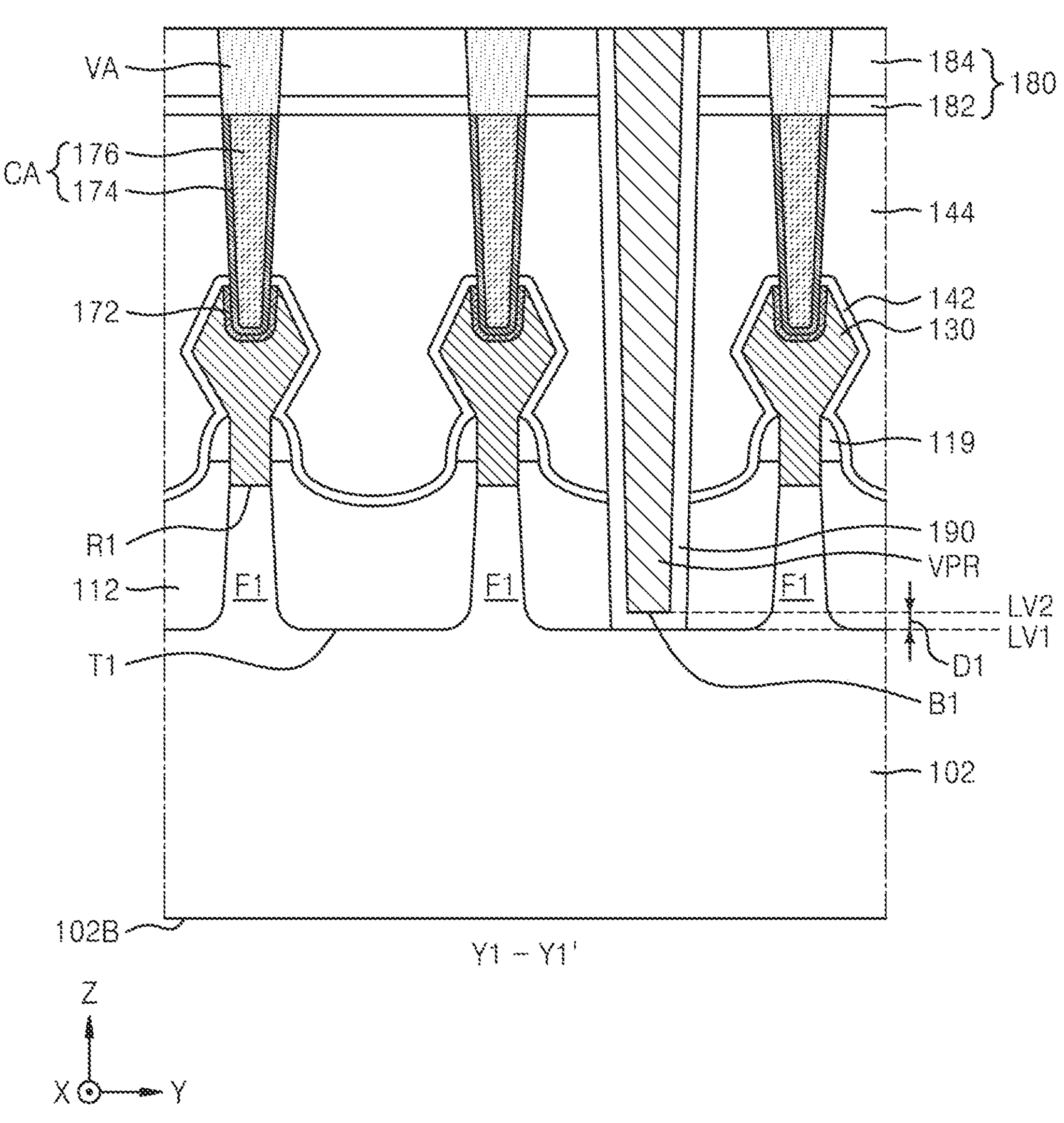
Figure 19C:
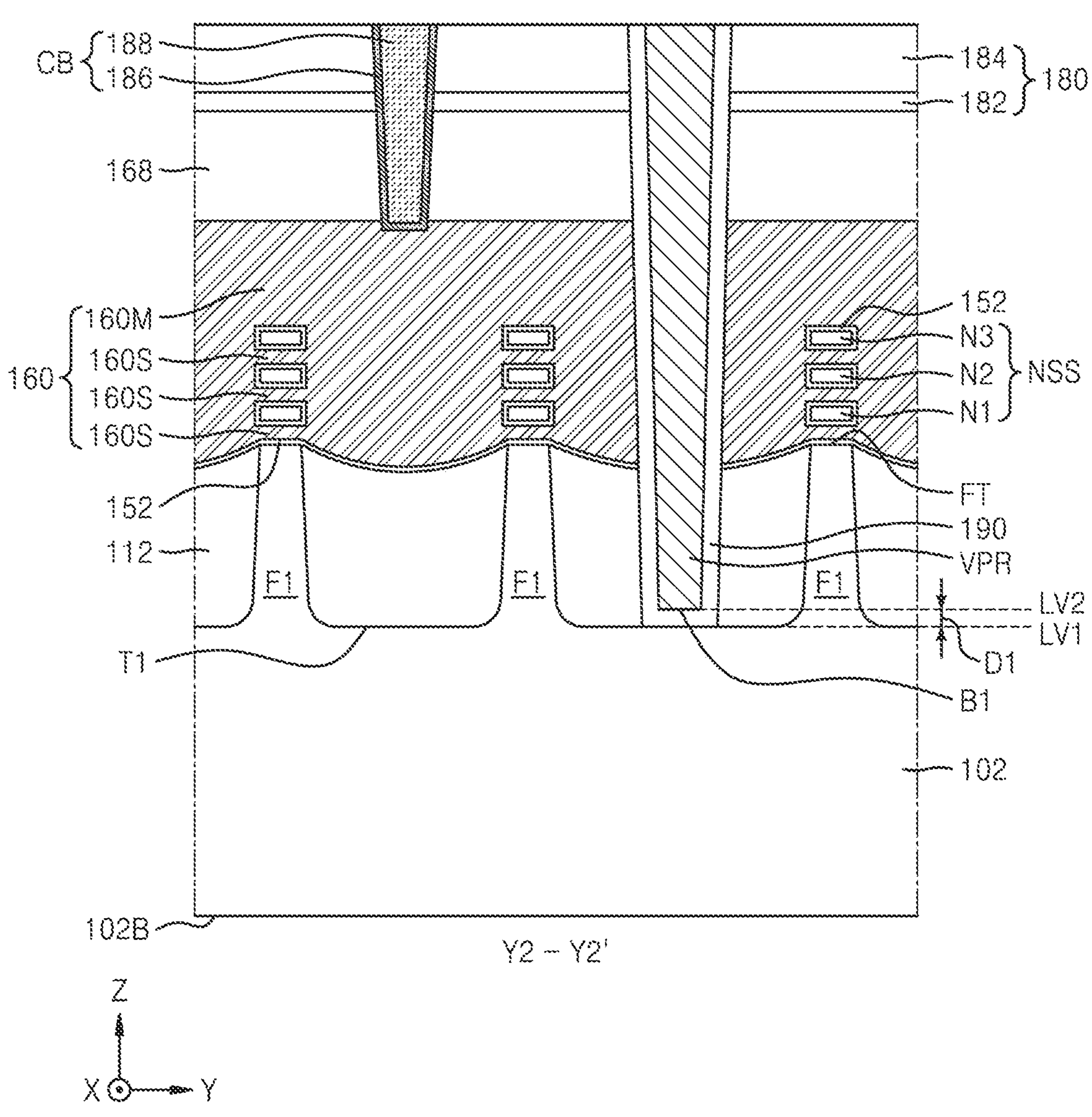

Referring to FIGS. 19A, 19B, and 19C, in the resultant structure of FIGS. 18A, 18B, and 18C, an etch stop film 182 and an interlayer insulating film 184 may be sequentially formed to cover the top surface of the inter-gate dielectric film 144 and a top surface of each of a plurality of source/drain contacts CA, and a top surface of each of a plurality of capping insulating patterns 168, thereby forming an upper insulating structure 180.

Thereafter, a plurality of source/drain via contacts VA, a gate contact CB, a via insulating film 190, and a via power rail VPR may be formed. The plurality of source/drain via contacts VA may extend through the upper insulating structure 180 in a vertical direction (Z direction) and be connected to the plurality of source/drain contacts CA. The gate contact CB may extend through the upper insulating structure 180 and the capping insulating pattern 168 in the vertical direction (Z direction) and be connected to the gate line 160. The via power rail VPR may have a bottom surface and sidewalls, which are covered by the via insulating film 190. The via insulating film 190 and the via power rail VPR may constitute a via power rail structure. The order of formation of the source/drain via contact VA, the gate contact CB, and the backside power rail structure is not specifically limited.

The formation of the backside power rail structure may include forming a through hole to extend through the upper insulating structure 180, the inter-gate dielectric film 144, the insulating liner 142, the gate line 160, the gate dielectric film 152, and the device isolation film 112 in the vertical direction (Z direction). In this case, the substrate 102 may be exposed at a bottom surface of the through hole. Thereafter, the via insulating film 190 and the via power rail VPR may be sequentially formed inside the through hole. The via power rail VPR may have a bottom surface B1 at a second vertical level LV2, which is farther from a backside surface 102B of the substrate 102 than a first vertical level LV1 of a bottom surface of the device isolation film 112. A distance D1 between the first vertical level LV1 and the second vertical level LV2 in the vertical direction (Z direction) may depend on a thickness of a portion of the via insulating film 190, which covers the bottom surface B1 of the via power rail VPR.

Figure 20A:
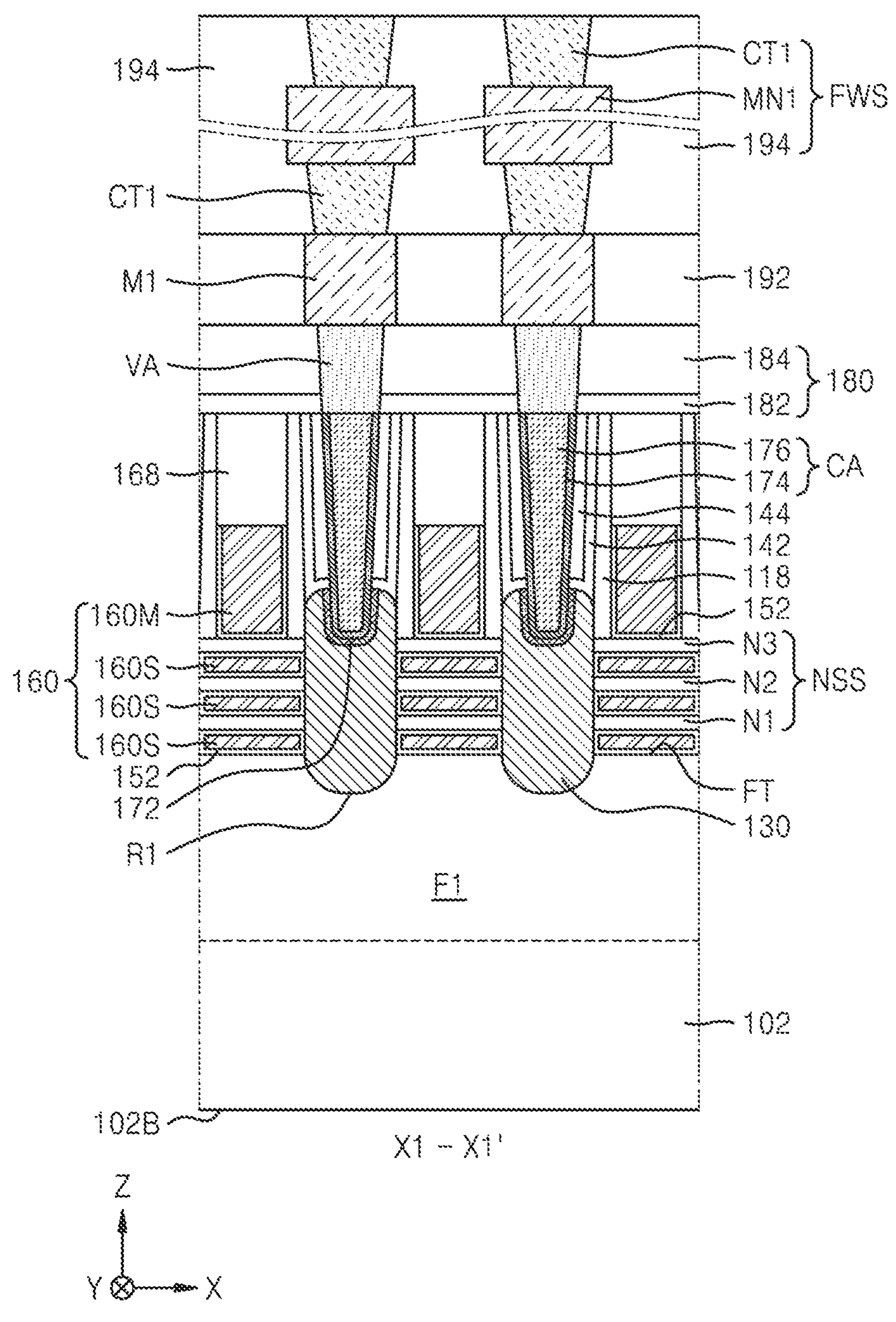
Figure 20B:
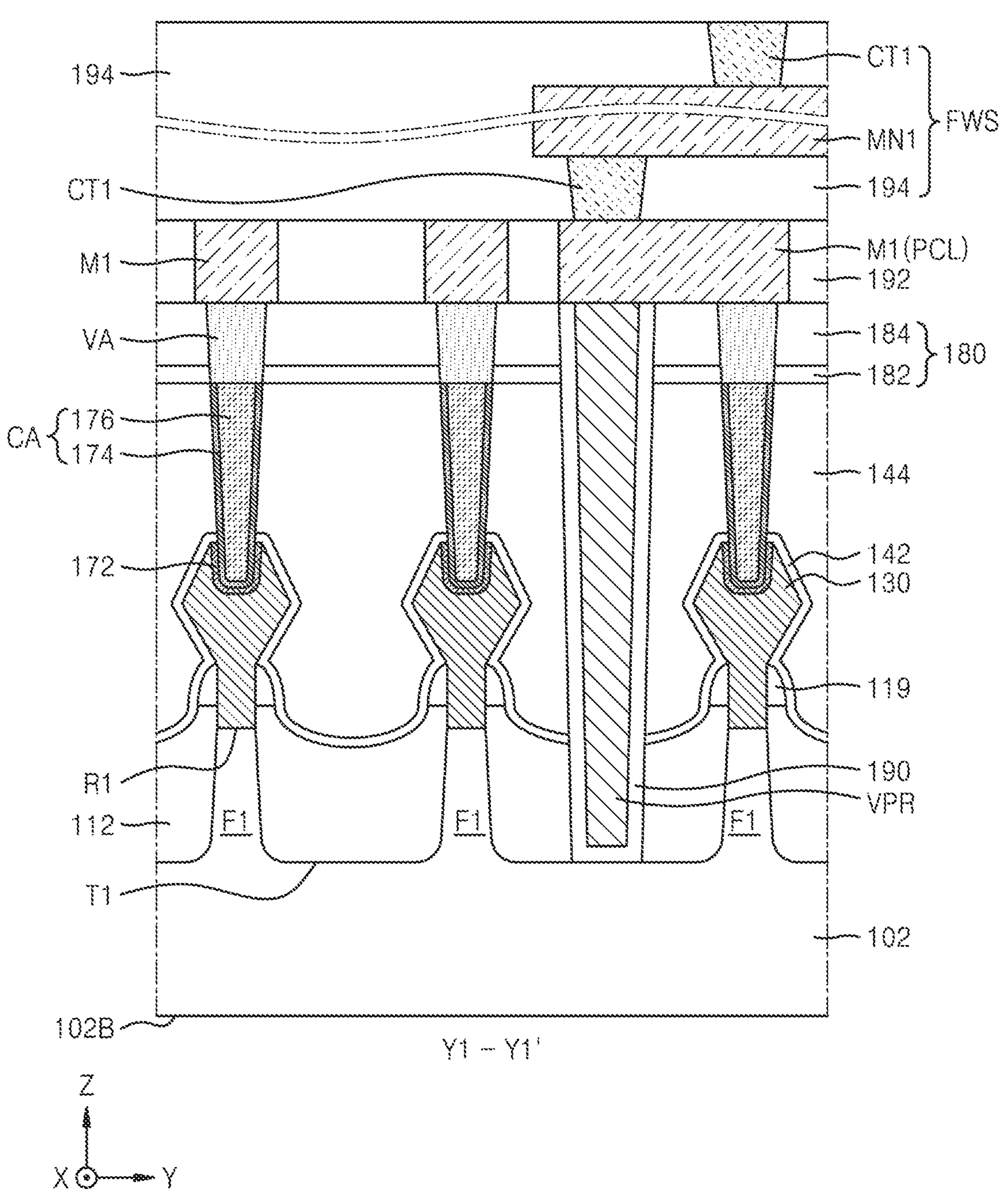
Figure 20C:
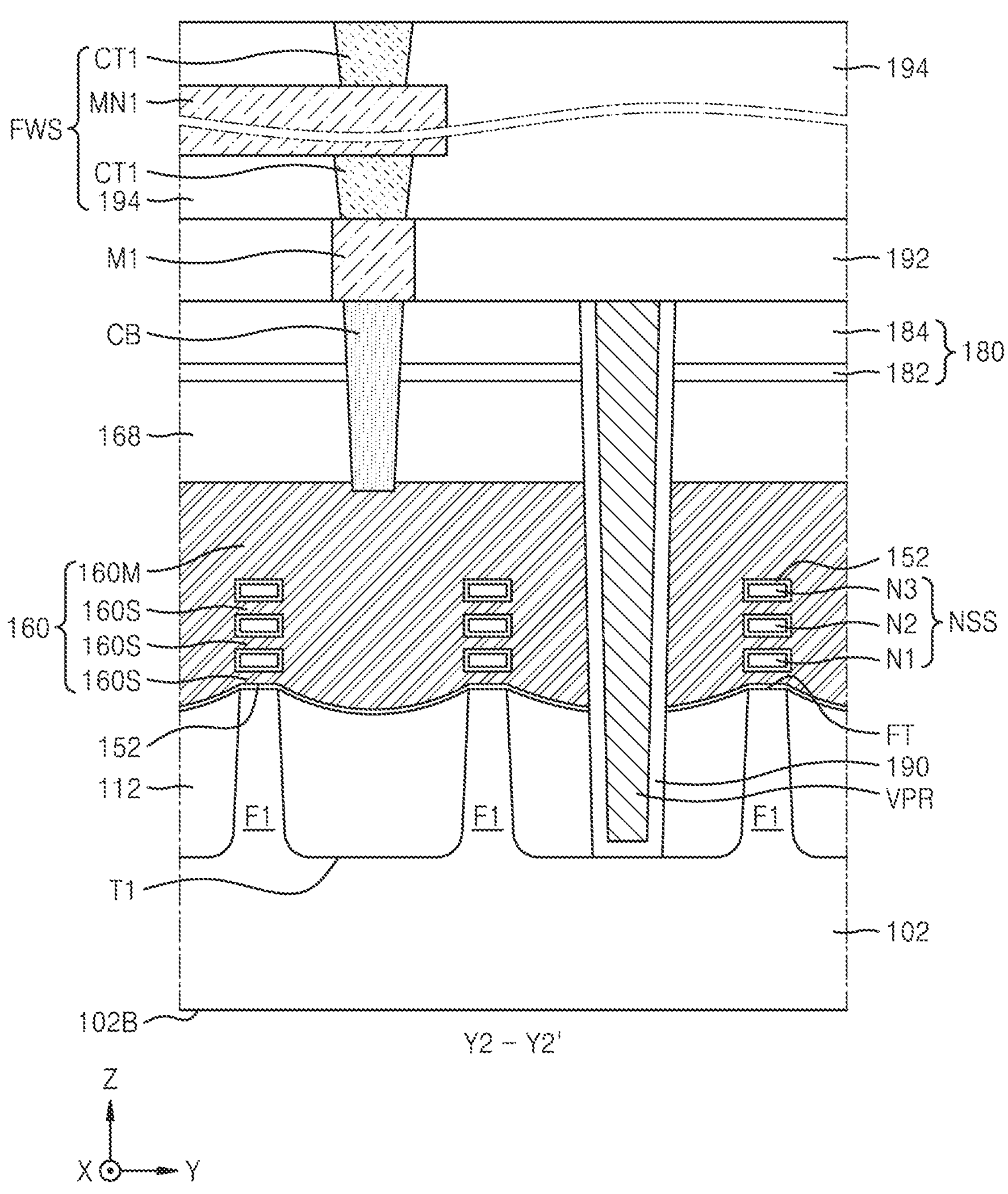

Referring to FIGS. 20A, 20B, and 20C, in the resultant structure of FIGS. 19A, 19B, and 19C, an upper insulating film 192 and a plurality of upper wiring layers M1 may be formed. The upper insulating film 192 may cover the upper insulating structure 180, and the plurality of upper wiring layers M1 may extend through the upper insulating film 192 and be connected to the source/drain via contact VA, the gate contact CB, and the via power rail VPR. The plurality of upper wiring layers M1 may include a power connection conductive layer PCL connected to the via power rail VPR on the via power rail VPR. Thereafter, a front-side wiring structure FWS may be formed on the upper insulating film 192 and the plurality of upper wiring layers M1.

Afterwards, a portion of the substrate 102 may be removed from the backside surface 102B of the substrate 102. As a result, the backside surface 102B of the substrate 102 may become closer to the fin-type active region F1 in the vertical direction (Z direction). A portion of the substrate 102 may be removed by using at least one one of a mechanical grinding process, a chemical mechanical polishing (CMP) process, a wet etching process, and a combination thereof.

Figure 21:
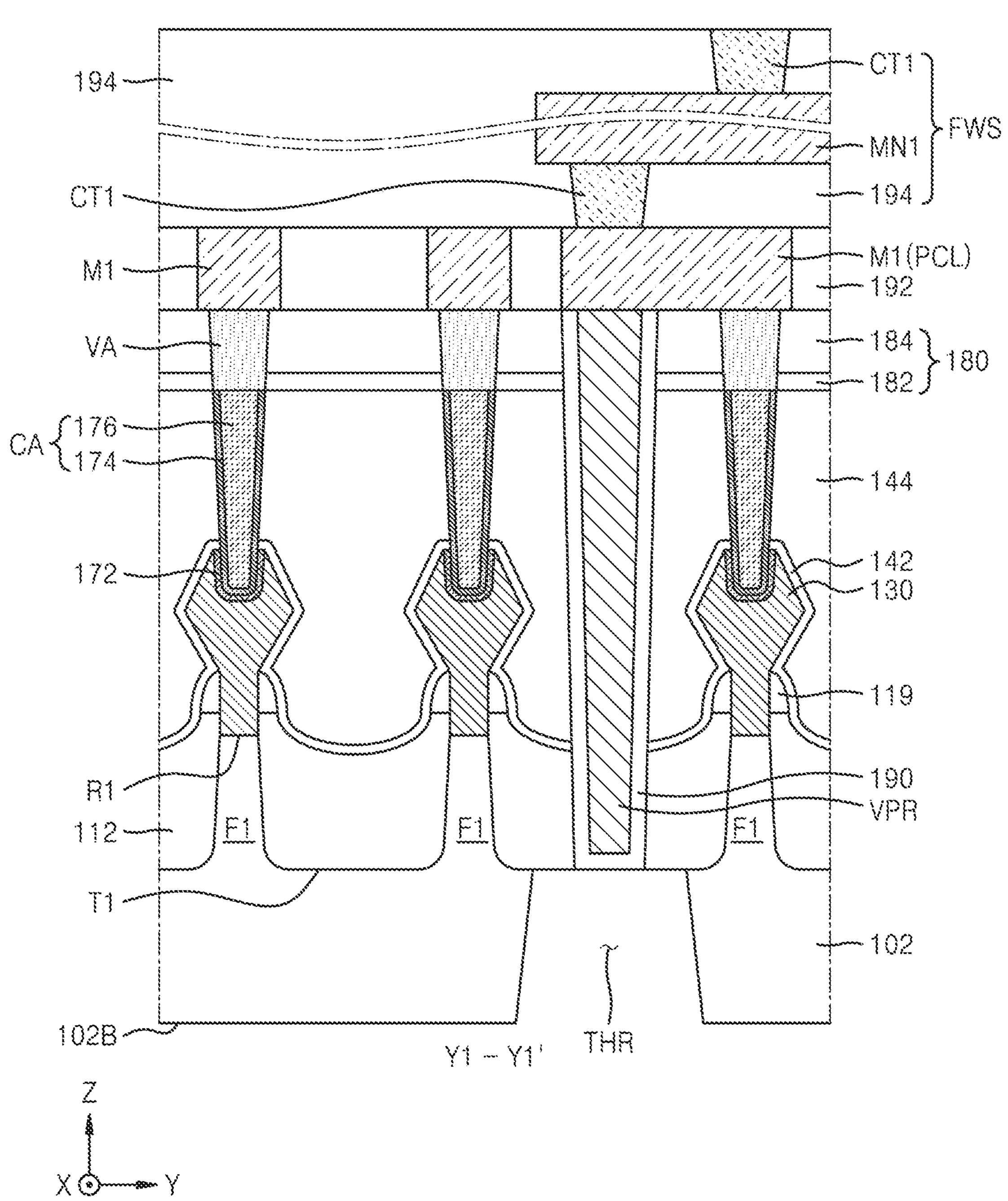

Referring to FIG. 21, in the resultant structure of FIGS. 20A, 20B, and 20C, a portion of the substrate 102 may be etched from the backside surface 102B of the substrate 102, thereby forming a through region THR extending through the substrate 102 in the vertical direction (Z direction).

In embodiments, to form the through region THR, a portion of the substrate 102 may be etched in a plasma atmosphere. After the through region THR is formed, the via insulating film 190 may be exposed through the through region THR, and the via power rail VPR may be covered by the via insulating film 190 without being exposed. Accordingly, while an etching process using plasma is being performed to form the through region THR, the via power rail VPR may be protected by the via insulating film 190 from adverse effects, such as collision of high-energy ions or plasma damage derived from the plasma atmosphere. Therefore, damage to the via power rail VPR by the plasma atmosphere to form the through region THR is inhibited.

Figure 22:
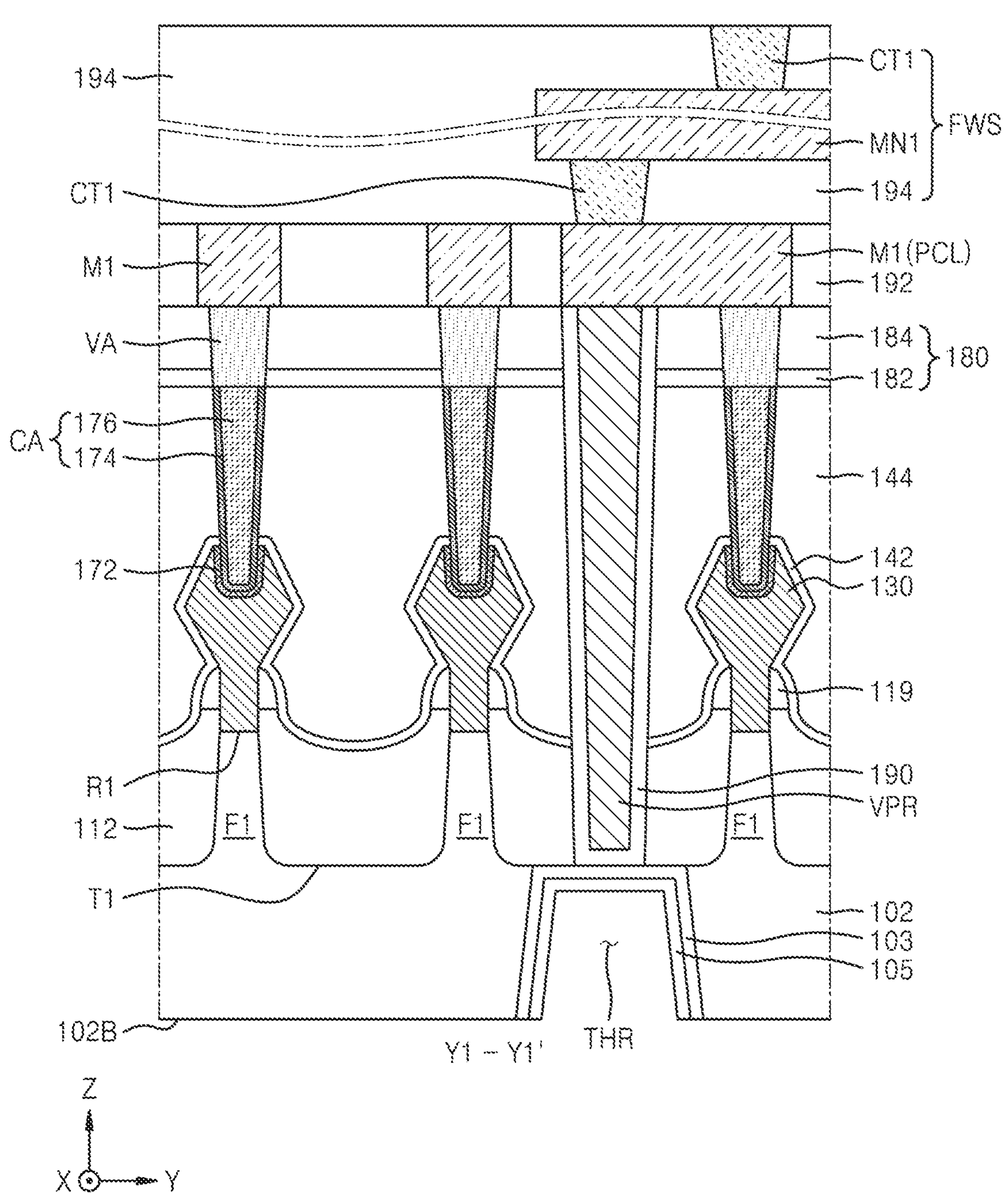

Referring to FIG. 22, in the resultant structure of FIG. 21, a first insulating layer 103 and a second insulating layer 105 may be sequentially formed in the through region THR. Each of the first insulating layer 103 and the second insulating layer 105 may be formed to conformally cover surfaces exposed at the through region THR.

In embodiments, the first insulating layer 103 and the second insulating layer 105 may be formed by using an ALD process. Constituent materials of the first insulating layer 103 and the second insulating layer 105 may be the same as those of the first insulating liner 103P and the second insulating liner 105P, which have been described with reference to FIGS. 3B to 3D.

Figure 23:
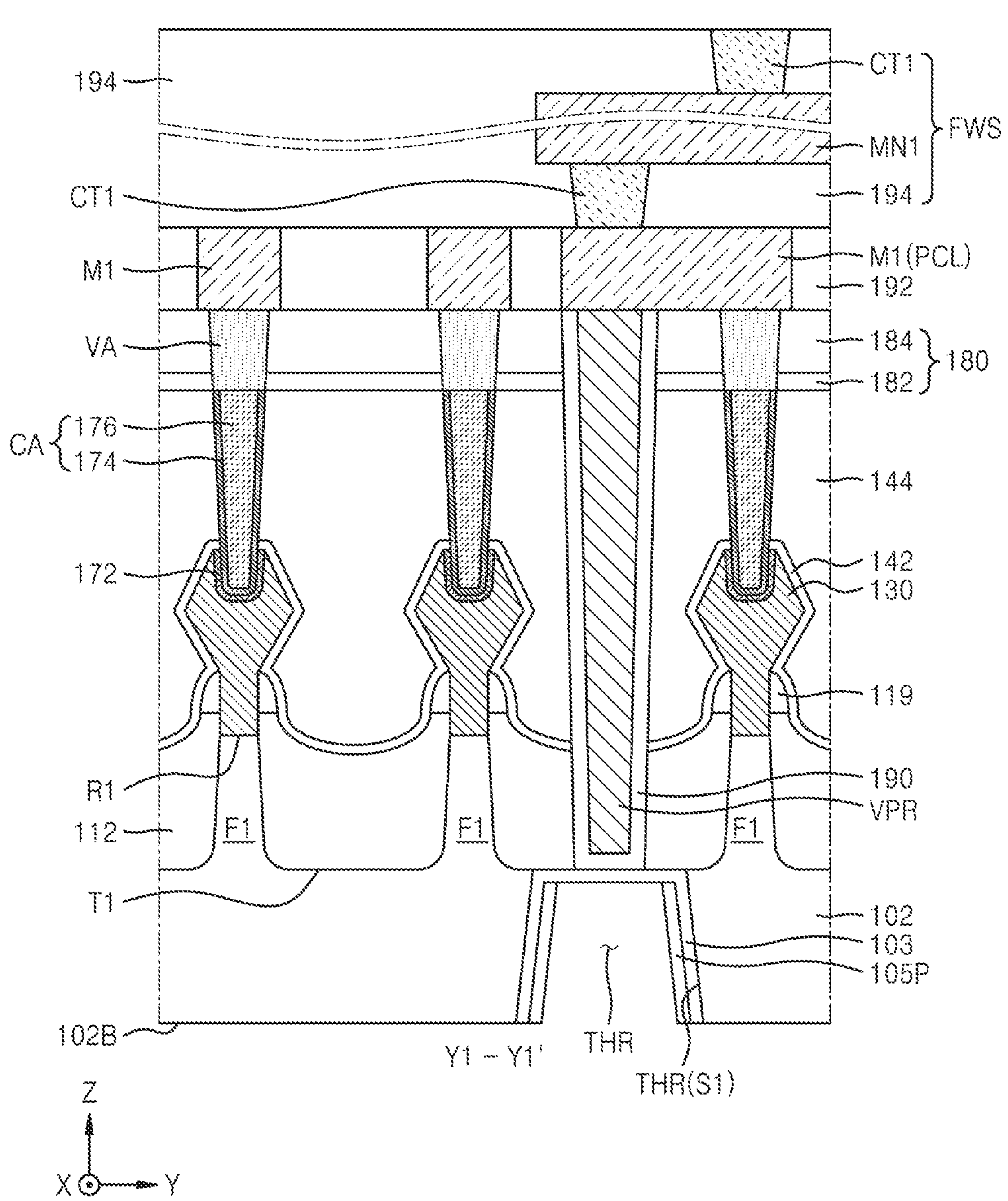

Referring to FIG. 23, in the resultant structure of FIG. 22, a portion of the second insulating layer 105, which overlaps the via power rail VPR in the vertical direction (Z direction), may be removed by anisotropically etching the second insulating layer 105. Thus, a second insulating liner 105P covering an inner sidewall S1 of the through region THR may be formed. After the second insulating liner 105P is formed, a portion of the first insulating layer 103, which covers the via power rail VPR, may be exposed in the through region THR.

In embodiments, an etching process using a plasma atmosphere may be performed to anisotropically etch the second insulating layer 105. For example, when the second insulating layer 105 includes a silicon oxide film and the second insulating layer 105 includes a silicon nitride film, the second insulating layer 105 may be selectively anisotropically etched by using the insulating layer 103 as an etch stop layer in a plasma atmosphere. To this end, an etch gas including a gas (e.g., $C_3F_8$ gas or $C_4F_8$ gas) including a fluorocarbon compound may be used. The etch gas may further include oxygen ($O_2$) gas and argon (Ar) gas. However, the etch gas is not limited to the examples described above and may be variously modified.

While the second insulating layer 105 is being anisotropically etched in a plasma atmosphere to form the second insulating liner 105P, the via power rail VPR may be covered by the via insulating film 190 and the first insulating layer 103 without being exposed. Accordingly, while the second insulating layer 105 is being anisotropically etched in the plasma atmosphere, the via power rail VPR may be protected by the via insulating film 190 and the second insulating layer 105 from adverse effects, such as collision of high-energy ions or plasma damage derived from the plasma atmosphere. Therefore, damage to the via power rail VPR by the plasma atmosphere during the formation of the second insulating liner 105P is inhibited.

Figure 24:
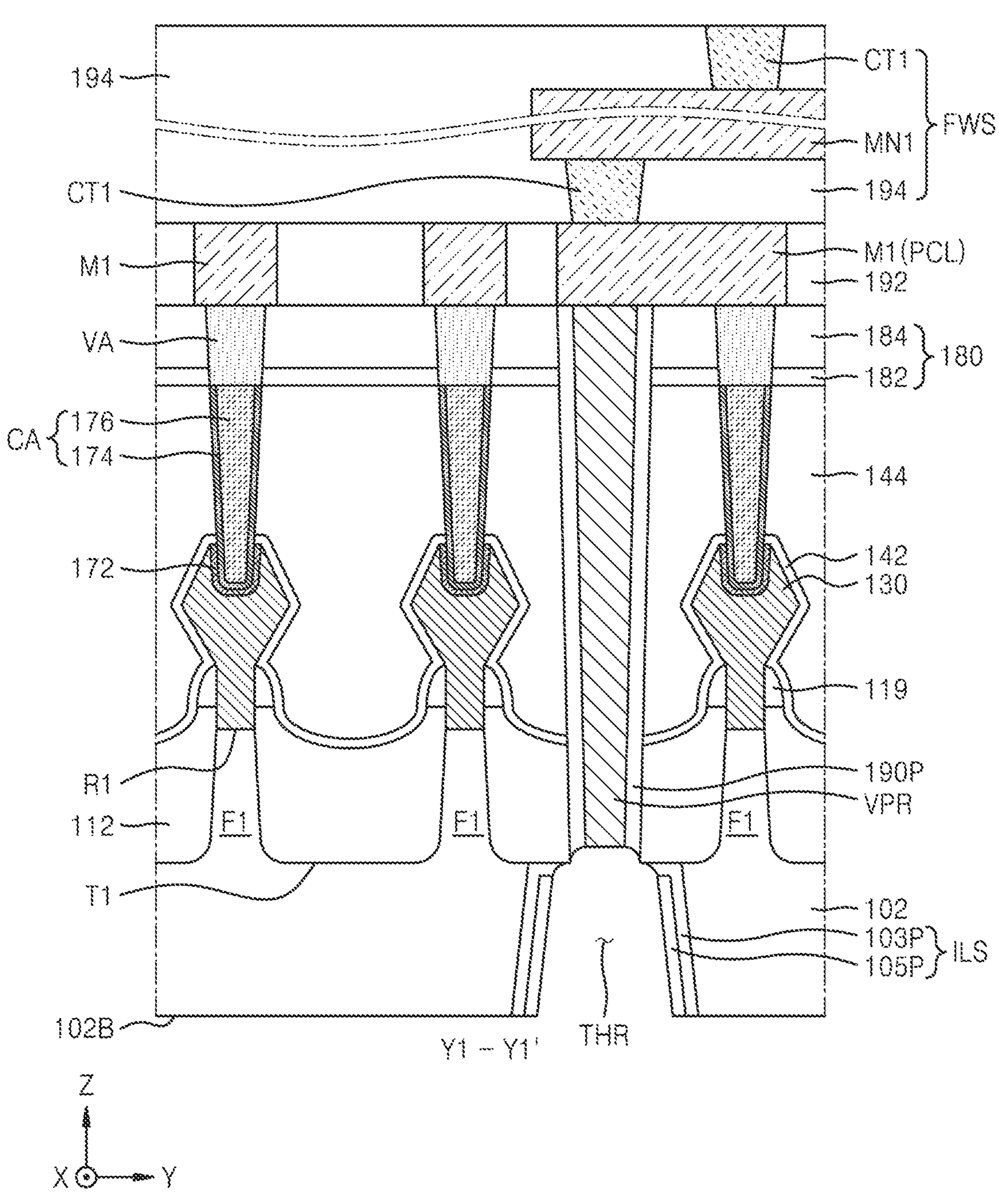

Referring to FIG. 24, in the resultant structure of FIG. 23, a portion of the first insulating layer 103, which is exposed in the through region THR, may be removed by using a wet etching process to expose the via insulating film 190. A portion of the via insulating film 190 may be wet etched from the exposed portion of the via insulating film 190, and thus, the via power rail VPR may be exposed in the through region THR. As a result, a portion of the first insulating layer 103, which remains in the through region THR, may remain as a first insulating liner 103P, and a portion of the via insulating film 190, which remains on the substrate 102, may remain as a via insulating spacer 190P.

In embodiments, when each of the first insulating layer 103 and the via insulating film 190 includes a silicon nitride film, and an etchant including phosphoric acid may be used to wet etch the first insulating layer 103 and the via insulating film 190.

Figure 25:
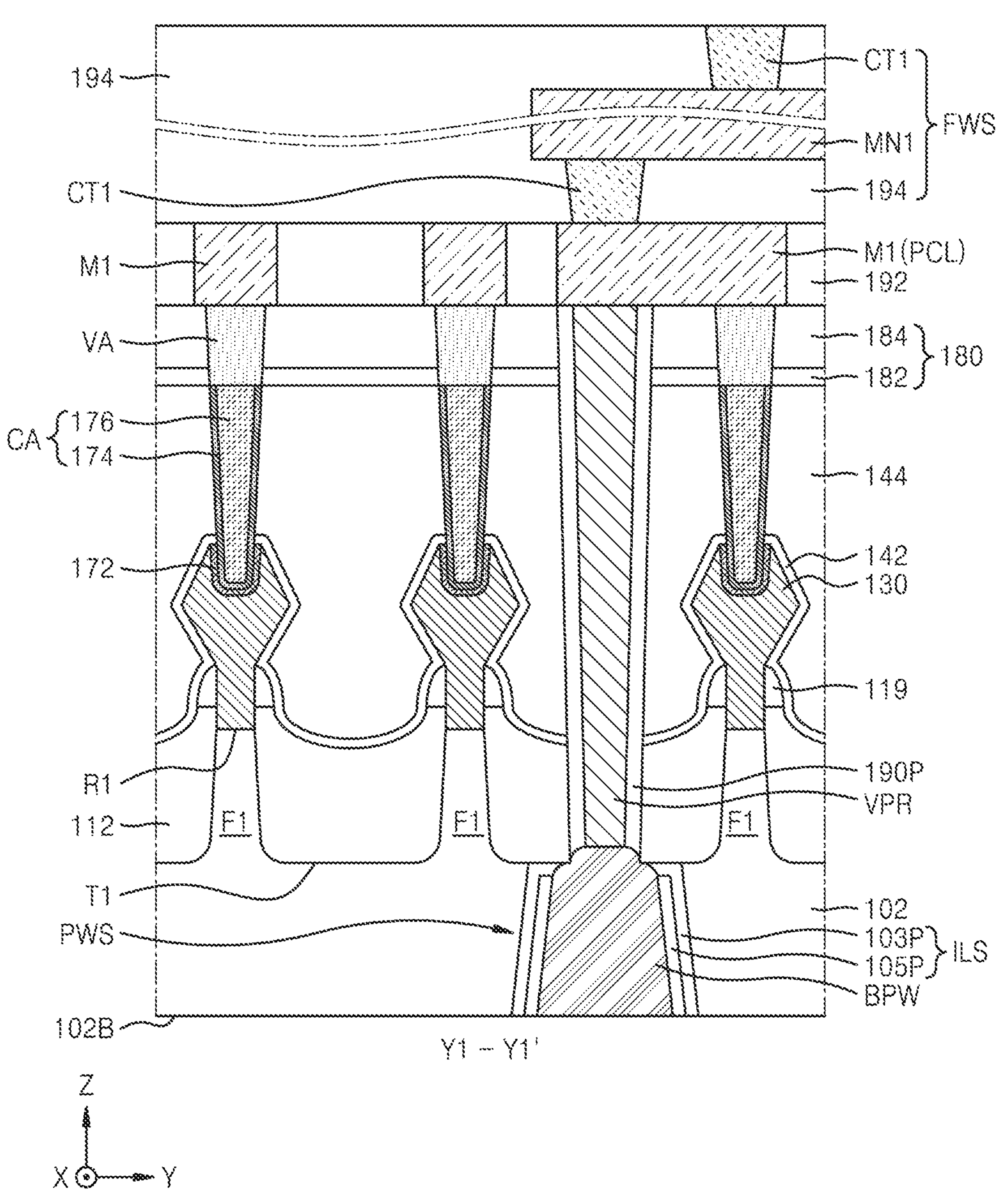

Referring to FIG. 25, in the resultant structure of FIG. 24, a backside power rail BPW may be formed to fill the through region THR, and a backside wiring structure (not shown) may be formed on the backside power rail BPW and the backside surface 120B of the substrate 102 as desired. Thus, the IC device 100 described with reference to FIGS. 2 and 3A to 3D may be manufactured.

Figure 26:
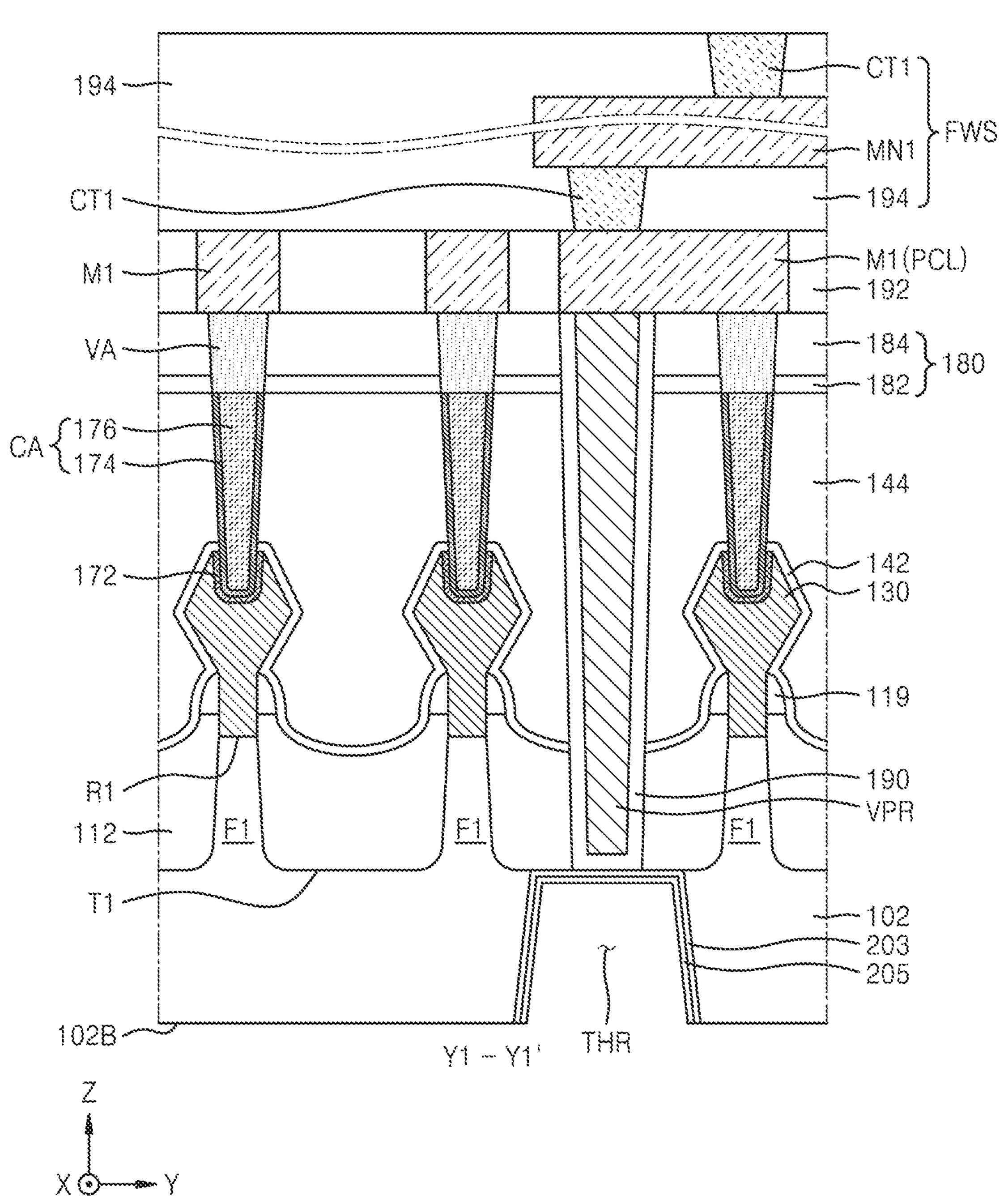
FIGS. 26 and 27 are cross-sectional views of a process sequence of a method of manufacturing an IC device according to embodiments of the present disclosure.
Figure 27:
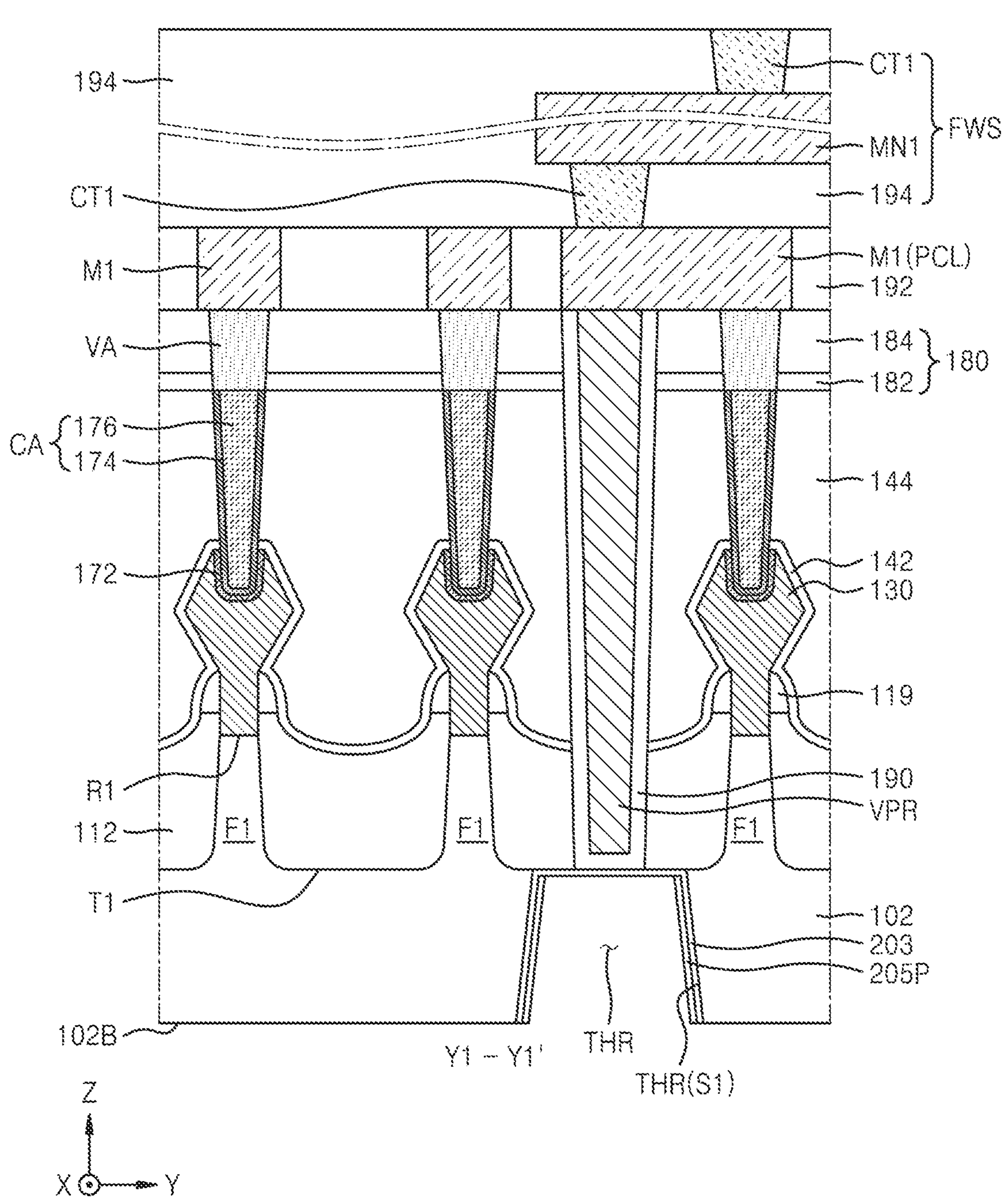

FIGS. 26 and 27 are cross-sectional views of a process sequence of a method of manufacturing an IC device, according to embodiments. FIGS. 26 and 27 illustrate example cross-sectional structures of a portion corresponding to a cross-section taken along line Y1-Y1' of FIG. 2, according to a process sequence. An example method of manufacturing the IC device 200 shown in FIG. 4 is described with reference to FIGS. 26 and 27. In FIGS. 26 and 27, the same reference numerals are used to denote the same elements as in FIGS. 2 to 4, and repeated descriptions thereof are omitted here.

Referring to FIG. 26, processes similar to those described with reference to FIGS. 9 to 22 may be performed. However, in the process described with reference to FIG. 22, a first insulating layer 203 and a second insulating layer 205 may be formed instead of the first insulating layer 103 and the second insulating layer 105. A thickness of each of the first insulating layer 203 and the second insulating layer 205 may be half or less of a thickness of the via insulating film 190. Constituent materials of the first insulating layer 203 and the second insulating layer 205 may respectively be the same as those of the first insulating liner 203P and the second insulating liner 205P, which have been described with reference to FIG. 4.

Referring to FIG. 27, in a method similar to that described with reference to FIG. 23, a portion of the second insulating layer 205, which overlaps the via power rail VPR in a vertical direction (Z direction), may be removed by anisotropically etching the second insulating layer 205 in the resultant structure of FIG. 26. Thus, a second insulating liner 205P covering an inner sidewall S1 of the through region THR may be formed. After the second insulating liner 205P is formed, a portion of the first insulating layer 203, which covers the via power rail VPR, may be exposed in the through region THR.

Thereafter, processes similar to those described with reference to FIGS. 24 and 25 may be performed on the resultant structure of FIG. 27, and thus, the IC device 200 shown in FIG. 4 may be manufactured.

Although the methods of manufacturing the IC devices 100 and 200 shown in FIGS. 2 to 4 have been described with reference to FIGS. 9 to 27, it will be understood that the IC devices 300, 400, 500, and 600 shown in FIGS. 5 to 8 and IC devices having variously changed structures may be manufactured by applying various modifications and changes to the processes described with reference to FIGS. 9 to 27 within the scope of the present disclosure.

While the present disclosure has been particularly shown and described with reference to embodiments thereof, it will be understood that various changes in form and details may be made therein without departing from the spirit and scope of the following claims.

What is claimed is:

1. An integrated circuit device comprising:

a substrate;

a fin-type active region that extends from the substrate to define a portion of a trench region on the substrate, wherein the fin-type active region extends in a first lateral direction;

a device isolation film on the trench region;

an insulating liner structure that extends through the substrate in a vertical direction, wherein the insulating liner structure contacts the device isolation film at a first vertical level;

a via power rail that extends through the device isolation film in the vertical direction, wherein the via power rail comprises a first bottom surface at a second vertical level, wherein a distance of the second vertical level from a surface of the substrate is greater than a distance of the first vertical level from the surface of the substrate;

a backside power rail comprising a main rail and a protrusion rail, wherein the main rail extends through the substrate and the insulating liner structure in the vertical direction, and wherein the protrusion rail is connected to the main rail, extends from the main rail toward the via power rail, and is between the device isolation film in a second lateral direction that intersects the first lateral direction; and a via insulating spacer that extends through the device isolation film in the vertical direction, wherein the via insulating spacer at least partially surrounds a sidewall of the via power rail and comprising a second bottom surface facing the backside power rail, wherein the protrusion rail contacts the first bottom surface of the via power rail.

2. The integrated circuit device of claim 1, wherein the protrusion rail contacts the second bottom surface of the via insulating spacer.

3. The integrated circuit device of claim 1, wherein the via insulating spacer at least partially surrounds a sidewall of the backside power rail, wherein the insulating liner structure comprises a first insulating liner and a second insulating liner, wherein the first insulating liner contacts the device isolation film at the first vertical level, wherein the first insulating liner is between the second insulating liner and the device isolation film, wherein the first insulating liner and the second insulating liner comprise different materials from each other, and wherein the via insulating spacer and the first insulating liner comprise a same material as each other.

4. The integrated circuit device of claim 1, wherein the protrusion rail of the backside power rail comprises a curved surface and contacts the second bottom surface of the via insulating spacer.

5. The integrated circuit device of claim 1, wherein the via insulating spacer comprises a third bottom surface at a third vertical level, wherein a distance of the third vertical level from the surface of the substrate is greater than the distance of the second vertical level from the surface of the substrate, and the backside power rail contacts the first bottom surface of the via power rail, the sidewall of the via power rail, and the third bottom surface of the via insulating spacer.

6. The integrated circuit device of claim 1, wherein the backside power rail further comprises a vertical extension that extends from the protrusion rail toward the via insulating spacer in the vertical direction, and wherein the vertical extension is between the sidewall of the via power rail and at least a portion of the device isolation film.

7. The integrated circuit device of claim 1, wherein the insulating liner structure comprises a first insulating liner and a second insulating liner, wherein the first insulating liner contacts the device isolation film at the first vertical level, wherein the first insulating liner is between the second insulating liner and the device isolation film, and the backside power rail further comprises a vertical extension and a horizontal extension, wherein the vertical extension extends from the protrusion rail toward the via insulating spacer in the vertical direction and is between the sidewall of the via power rail and a portion of the device isolation film, and wherein the horizontal extension extends from the main rail in the second lateral direction and is between the portion of the device isolation film and the second insulating liner.

8. The integrated circuit device of claim 1, further comprising:

a source/drain region on the fin-type active region;

a gate line that extends in the second lateral direction and on the fin-type active region; and a nanosheet stack between the fin-type active region and the gate line, wherein the nanosheet stack comprises at least one nanosheet, wherein the gate line at least partially surrounds the at least one nanosheet, and wherein the at least one nanosheet contacts the source/drain region, wherein the backside power rail is spaced apart from the source/drain region and the nanosheet stack in the second lateral direction and extends through the gate line in the vertical direction.

9. The integrated circuit device of claim 1, wherein the substrate comprises a through region that accommodates the insulating liner structure and the backside power rail, the through region comprises a pair of inner sidewalls that contact the insulating liner structure, and a distance between the pair of inner sidewalls in the second lateral direction gradually increases toward the surface of the substrate.

10. The integrated circuit device of claim 1, wherein the insulating liner structure comprises a first insulating liner and a second insulating liner, wherein the first insulating liner contacts the device isolation film at the first vertical level, and wherein the first insulating liner is between the second insulating liner being and the device isolation film, the via insulating spacer and the first insulating liner comprise a material selected from silicon nitride (SiN), silicon oxycarbide (SiOC), silicon oxynitride (SiON), and silicon oxycarbonitride (SiOCN), and the second insulating liner comprises a material selected from silicon oxide (SiO), silicon oxynitride (SiON), and silicon oxycarbonitride (SiOCN).

11. An integrated circuit device comprising:

a substrate;

a pair of fin-type active regions that extend from the substrate in a first lateral direction to define a plurality of trench regions on the substrate;

a pair of source/drain regions arranged one-by-one on the pair of fin-type active regions, respectively;

a device isolation film on the trench region;

an insulating liner structure that extends through the substrate in a vertical direction, wherein the insulating liner structure contacts the device isolation film at a first vertical level;

a via power rail between the pair of fin-type active regions and between the pair of source/drain regions, wherein the via power rail extends through the device isolation film in the vertical direction, wherein the via power rail comprises a first bottom surface at a second vertical level, wherein a distance of the second vertical level from a surface of the substrate is greater than a distance of the first vertical level from the surface of the substrate;

a backside power rail; and a via insulating spacer that extends through the device isolation film in the vertical direction, wherein the via insulating spacer at least partially surrounds a sidewall of the via power rail, wherein the backside power rail comprises a main rail and a protrusion rail, wherein the main rail extends through the substrate and the insulating liner structure in the vertical direction, and wherein the protrusion rail is connected to the main rail, extends from the main rail toward the via power rail and the via insulating spacer, and is between the device isolation film in a second lateral direction that intersects the first lateral direction, and wherein the protrusion rail contacts the first bottom surface of the via power rail.

12. The integrated circuit device of claim 11, wherein a length of the via insulating spacer in the vertical direction is greater than a length of the via power rail in the vertical direction.

13. The integrated circuit device of claim 11, wherein a length of the via insulating spacer in the vertical direction is less than a length of the via power rail in the vertical direction.

14. The integrated circuit device of claim 11, wherein the via insulating spacer has a second bottom surface at a third vertical level, wherein a distance of the third vertical level from the surface of the substrate is greater than a distance of the second vertical level from the surface of the substrate.

15. The integrated circuit device of claim 11, wherein the via insulating spacer has a second bottom surface, and the protrusion rail contacts the second bottom surface of the via insulating spacer.

16. The integrated circuit device of claim 11, wherein the insulating liner structure comprises a first insulating liner and a second insulating liner, wherein the first insulating liner contacts the device isolation film at the first vertical level, wherein the first insulating liner is between the second insulating liner and the device isolation film, the first insulating liner and the second insulating liner comprise different materials from each other, and the via insulating spacer and the first insulating liner comprise a same material as each other.

17. The integrated circuit device of claim 11, wherein the backside power rail further comprises a vertical extension that extends from the protrusion rail toward the via insulating spacer in the vertical direction, wherein the vertical extension is between the sidewall of the via power rail and a portion of the device isolation film.

18. The integrated circuit device of claim 11, wherein the insulating liner structure comprises a first insulating liner and a second insulating liner, wherein the first insulating liner contacts the device isolation film at the first vertical level, wherein the first insulating liner is between the second insulating liner and the device isolation film, and the backside power rail further comprises a horizontal extension that extends from the main rail in the second lateral direction, wherein the horizontal extension is between a portion of the device isolation film and the second insulating liner.

19. An integrated circuit device comprising:

a substrate;

a fin-type active region that extends from the substrate to define a trench region on the substrate;

at least one nanosheet on the fin-type active region, wherein the at least one nanosheet is spaced apart from a fin top surface of the fin-type active region;

a gate line that at least partially surrounds the at least one nanosheet on the fin-type active region, wherein the gate line extends in a lateral direction;

a source/drain region adjacent to the gate line, wherein the source/drain region contacts the at least one nanosheet;

a device isolation film on a sidewall of the fin-type active region and on the trench region;

an insulating liner structure that extends through the substrate in a vertical direction, wherein the insulating liner structure comprises a first insulating liner and a second insulating liner, wherein the first insulating liner contacts the device isolation film at a first vertical level, and wherein the first insulating liner is between the second insulating liner and the device isolation film;

a via power rail spaced apart from each of the fin-type active region, the source/drain region, and the gate line in the lateral direction, wherein the via power rail extends through the device isolation film in the vertical direction and comprises a first bottom surface at a second vertical level, wherein a distance of the second vertical level from a surface of the substrate is greater than a distance of the first vertical level from the surface of the substrate;

a backside power rail; and a via insulating spacer that extends through the device isolation film in the vertical direction, wherein the via insulating spacer at least partially surrounds a sidewall of the via power rail, wherein the backside power rail comprises a main rail and a protrusion rail, wherein the main rail extends through the substrate and the insulating liner structure in the vertical direction, wherein the protrusion rail is connected to the main rail, extends from the main rail toward the via power rail and the via insulating spacer, and is between the device isolation film in the lateral direction, and wherein the protrusion rail contacts the first bottom surface of the via power rail.

20. The integrated circuit device of claim 19, wherein the backside power rail comprises a first surface that contacts the via power rail, a second surface that contacts the insulating liner structure, a third surface that contacts the via insulating spacer, and a fourth surface that contacts the device isolation film, the via insulating spacer and the first insulating liner comprise a material selected from silicon nitride (SiN), silicon oxycarbide (SiOC), silicon oxynitride (SiON), and silicon oxycarbonitride (SiOCN), and the second insulating liner is selected from silicon oxide (SiO), silicon oxynitride (SiON), and silicon oxycarbonitride (SiOCN).

* * * * *